(12) United States Patent
Chen et al.

(10) Patent No.: US 11,562,983 B2
(45) Date of Patent: Jan. 24, 2023

(54) PACKAGE HAVING MULTIPLE CHIPS INTEGRATED THEREIN AND MANUFACTURING METHOD THEREOF

(71) Applicant: Taiwan Semiconductor Manufacturing Co., Ltd., Hsinchu (TW)

(72) Inventors: Ming-Fa Chen, Taichung (TW); Sung-Feng Yeh, Taipei (TW); Tzuan-Horng Liu, Taoyuan (TW); Chao-Wen Shih, Hsinchu County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/737,929

(22) Filed: Jan. 9, 2020

(65) Prior Publication Data
US 2020/0411473 A1 Dec. 31, 2020

Related U.S. Application Data

(60) Provisional application No. 62/867,871, filed on Jun. 28, 2019.

(51) Int. Cl.
| | |
|---|---|
| *H01L 21/78* | (2006.01) |
| *H01L 25/065* | (2006.01) |
| *H01L 23/31* | (2006.01) |
| *H01L 25/00* | (2006.01) |
| *H01L 21/56* | (2006.01) |

(Continued)

(52) U.S. Cl.
CPC ........ *H01L 25/0652* (2013.01); *H01L 21/563* (2013.01); *H01L 21/78* (2013.01); *H01L 23/3121* (2013.01); *H01L 23/481* (2013.01); *H01L 24/97* (2013.01); *H01L 25/50* (2013.01); *H01L 2225/06541* (2013.01)

(58) Field of Classification Search
CPC ............. H01L 25/0652; H01L 25/0657; H01L 21/563; H01L 23/5389; H01L 23/481; H01L 2225/06541; H01L 21/486; H01L 23/49816; H01L 23/3738; H01L 23/373; H01L 23/36; H01L 24/97; H01L 21/78; H01L 25/0655; H01L 2224/80894–80896; H01L 2224/82895–82897; H01L 2224/83894–83896
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |

(Continued)

OTHER PUBLICATIONS

Fengyuan Xu et al., "Designing a Practical Access Point Association Protocol," 2010 Proceedings IEEE INFOCOM, Mar. 2010, pp. 1-9.

*Primary Examiner* — Nicholas J Tobergte
*Assistant Examiner* — William Henry Anderson
(74) *Attorney, Agent, or Firm* — JCIPRNET

(57) ABSTRACT

A package includes an integrated circuit. The integrated circuit includes a first chip, a second chip, a third chip, and a fourth chip. The second chip and the third chip are disposed side by side on the first chip. The second chip and the third chip are hybrid bonded to the first chip. The fourth chip is fusion bonded to at least one of the second chip and the third chip.

20 Claims, 64 Drawing Sheets

(51) Int. Cl.
*H01L 23/48* (2006.01)
*H01L 23/00* (2006.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,630,296 B2 * | 4/2020 | Lee .................. H03K 19/1776 |
| 2015/0318246 A1 * | 11/2015 | Yu ........................ H01L 25/065 257/774 |
| 2015/0364386 A1 * | 12/2015 | Yu ........................ H01L 22/20 257/48 |
| 2016/0155723 A1 * | 6/2016 | Lou ...................... H01L 25/105 257/774 |
| 2017/0062383 A1 * | 3/2017 | Yee .................. H01L 23/49838 |
| 2017/0133310 A1 * | 5/2017 | Kelly ................ H01L 23/49822 |
| 2017/0194291 A1 * | 7/2017 | Yu ...................... H01L 23/3185 |
| 2017/0365587 A1 * | 12/2017 | Hung ................... H01L 21/565 |
| 2018/0006006 A1 * | 1/2018 | Kim ........................ H01L 24/33 |
| 2018/0294212 A1 * | 10/2018 | Chen ................ H01L 23/49811 |
| 2018/0294241 A1 * | 10/2018 | Chen ................... H01L 25/105 |
| 2019/0131277 A1 * | 5/2019 | Yang .................. H01L 23/3135 |

* cited by examiner

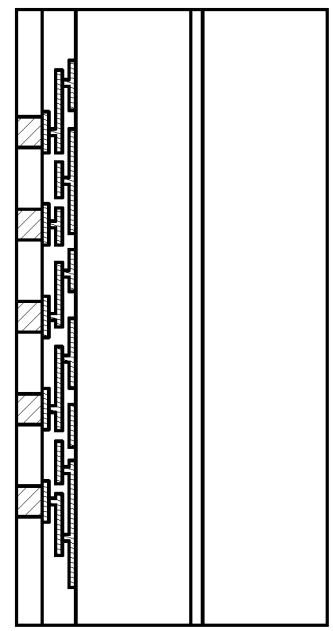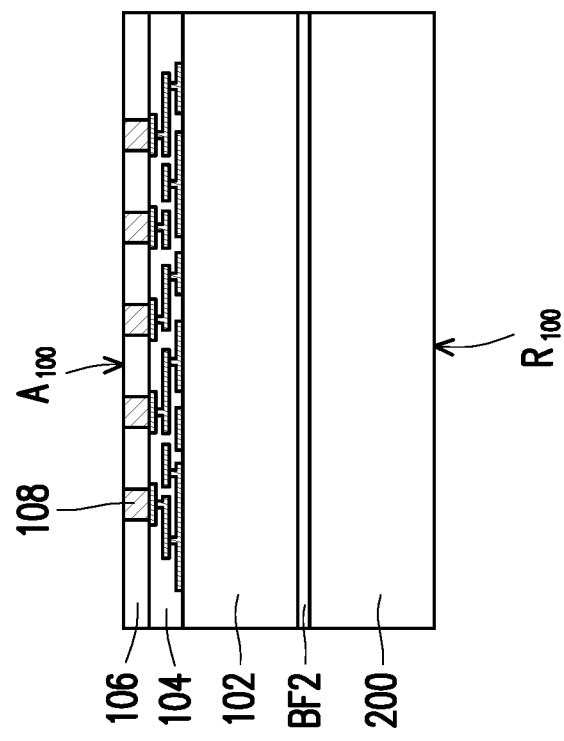
FIG. 1E

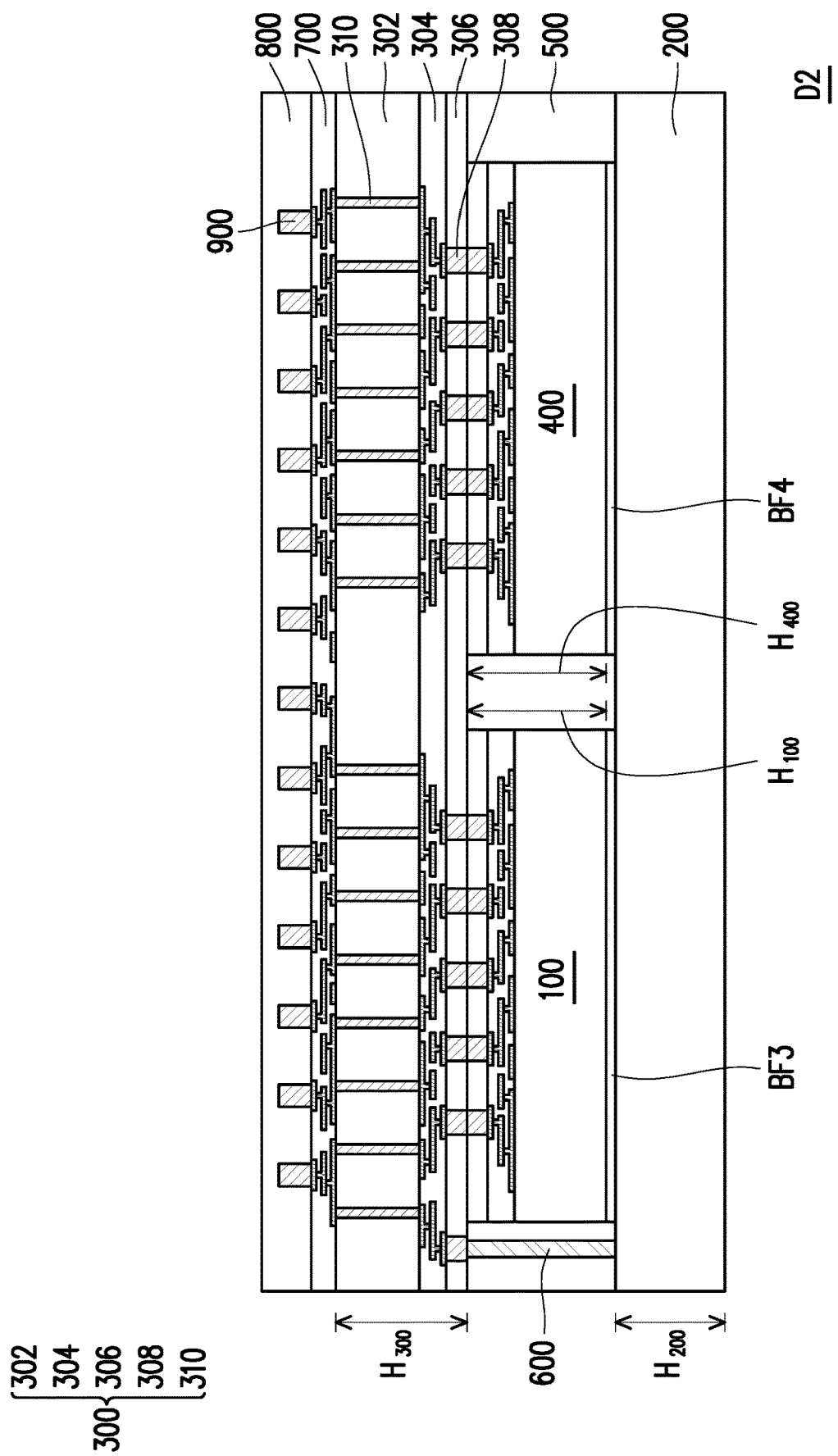

PACKAGE HAVING MULTIPLE CHIPS INTEGRATED THEREIN AND MANUFACTURING METHOD THEREOF

CROSS-REFERENCE TO RELATED APPLICATION

This application claims the priority benefit of U.S. provisional application Ser. No. 62/867,871, filed on Jun. 28, 2019. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for the wafer level packaging. Integration of multiple semiconductor devices have become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2L are schematic cross-sectional views illustrating a manufacturing process of a package in accordance with some alternative embodiments of the disclosure.

DETAILED DESCRIPTION

Figure 1A:
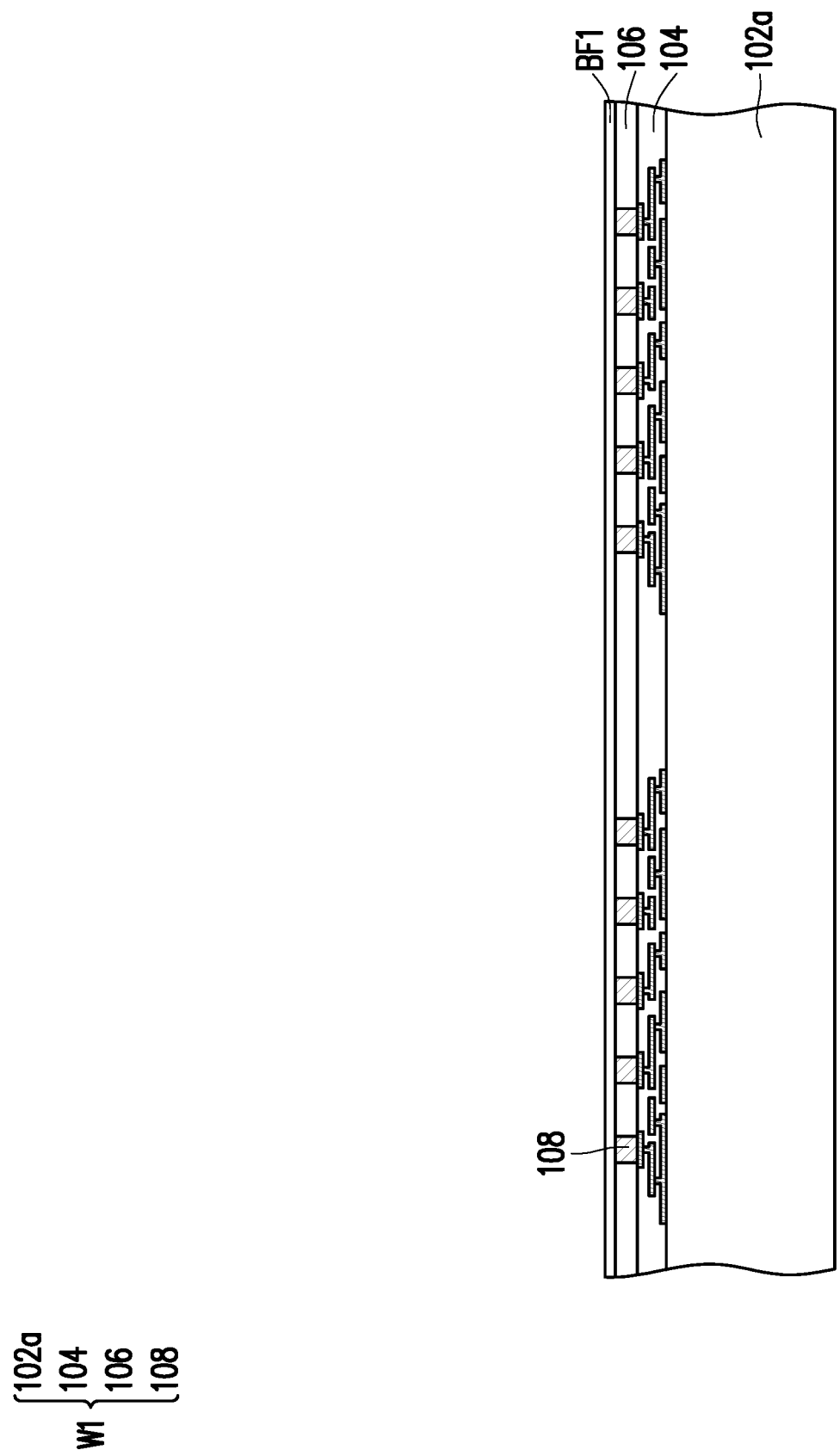
FIG. 1A to FIG. 1P are schematic cross-sectional views illustrating a manufacturing process of a package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
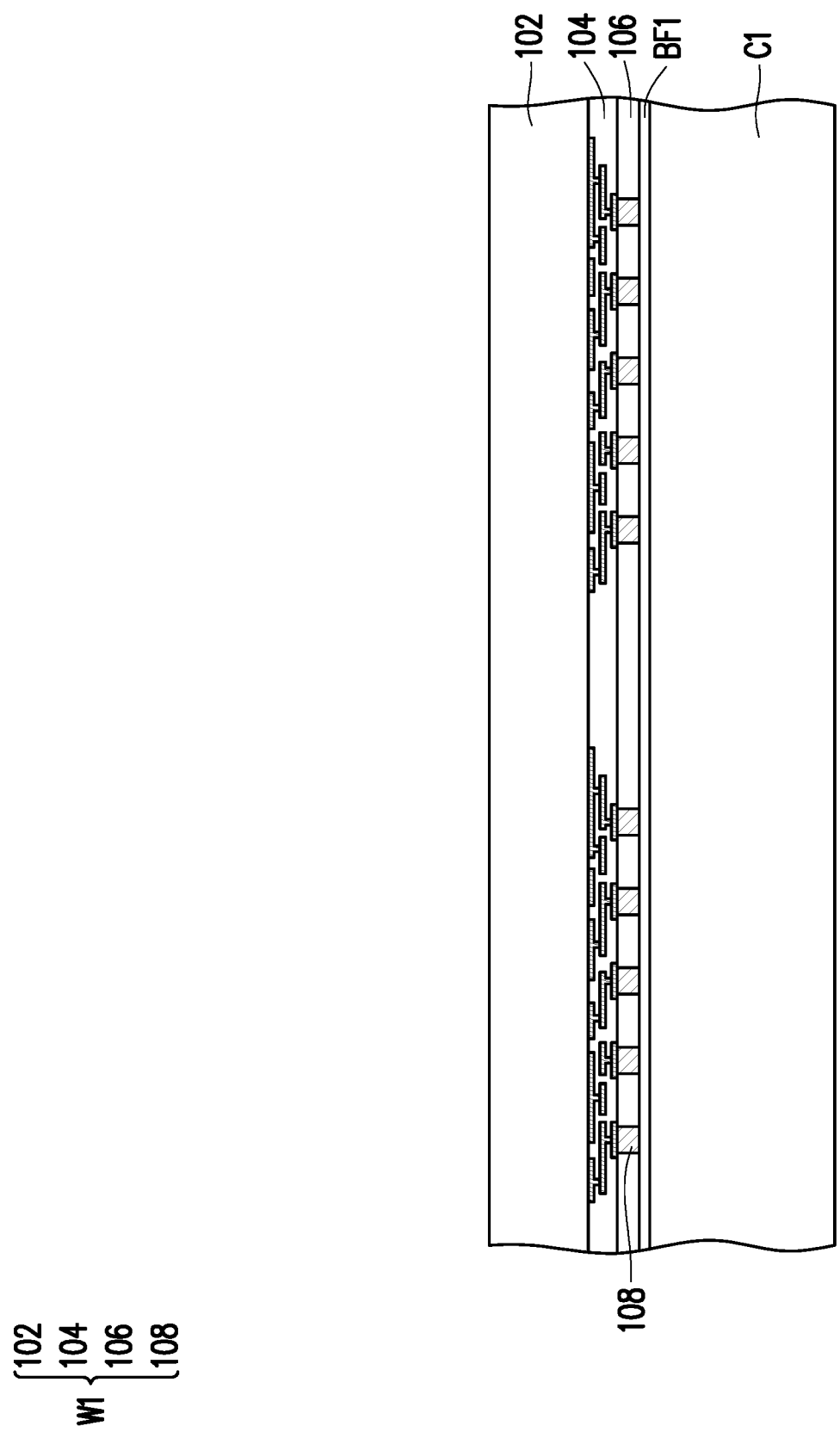
Figure 1C:
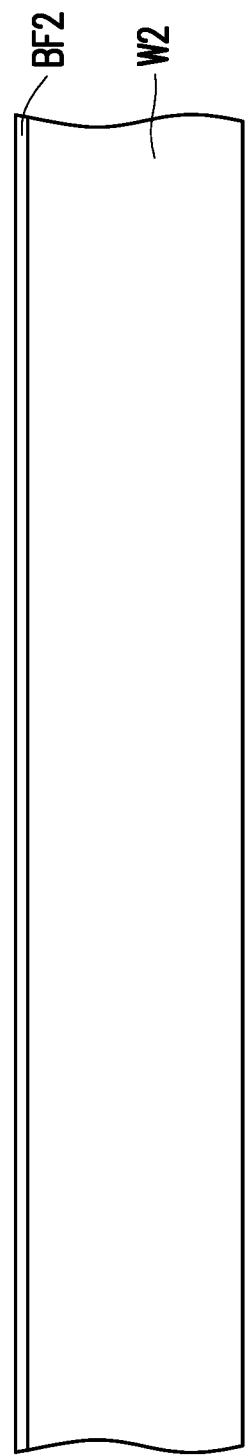
Figure 1D:
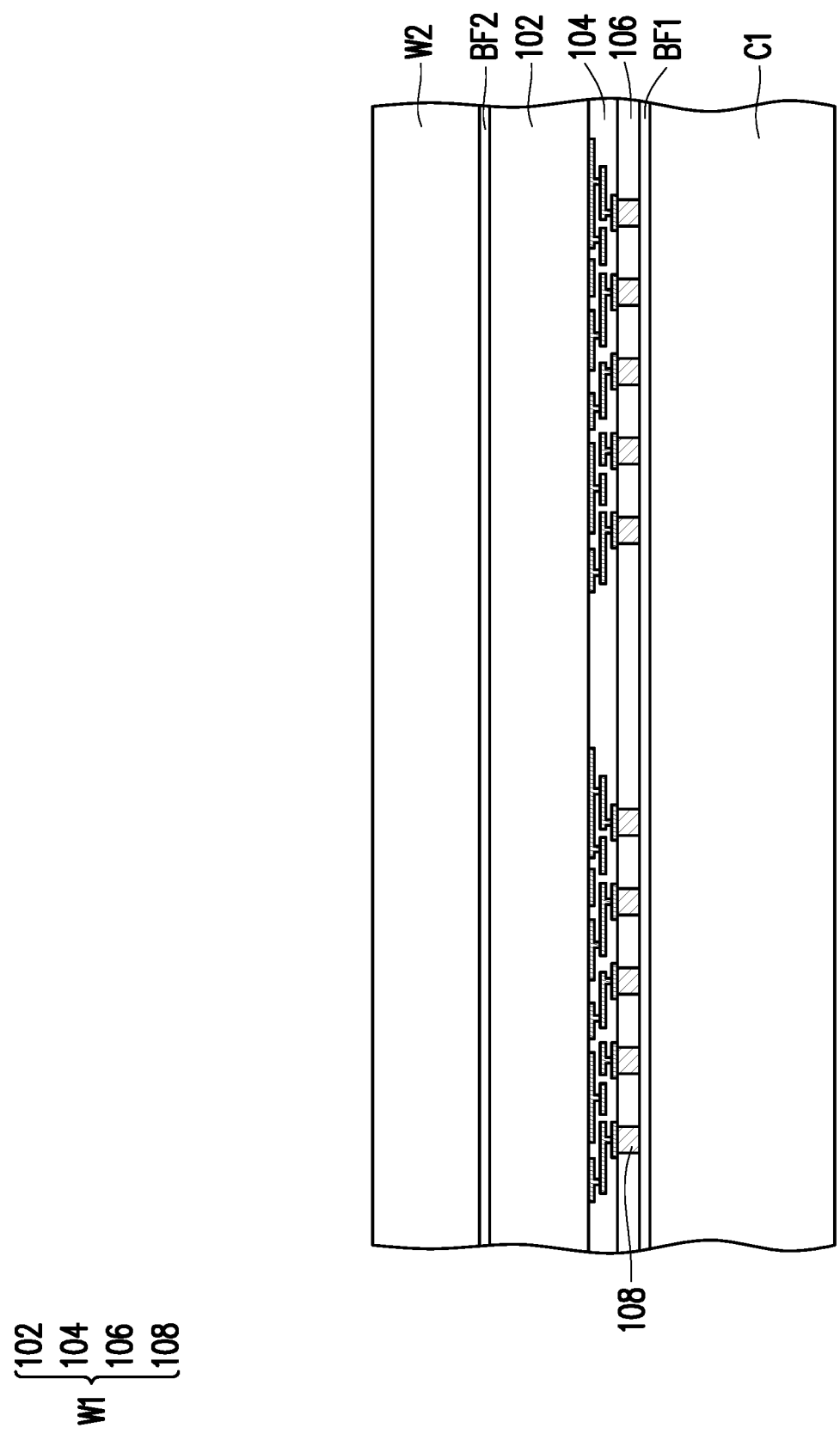
Figure 1F:
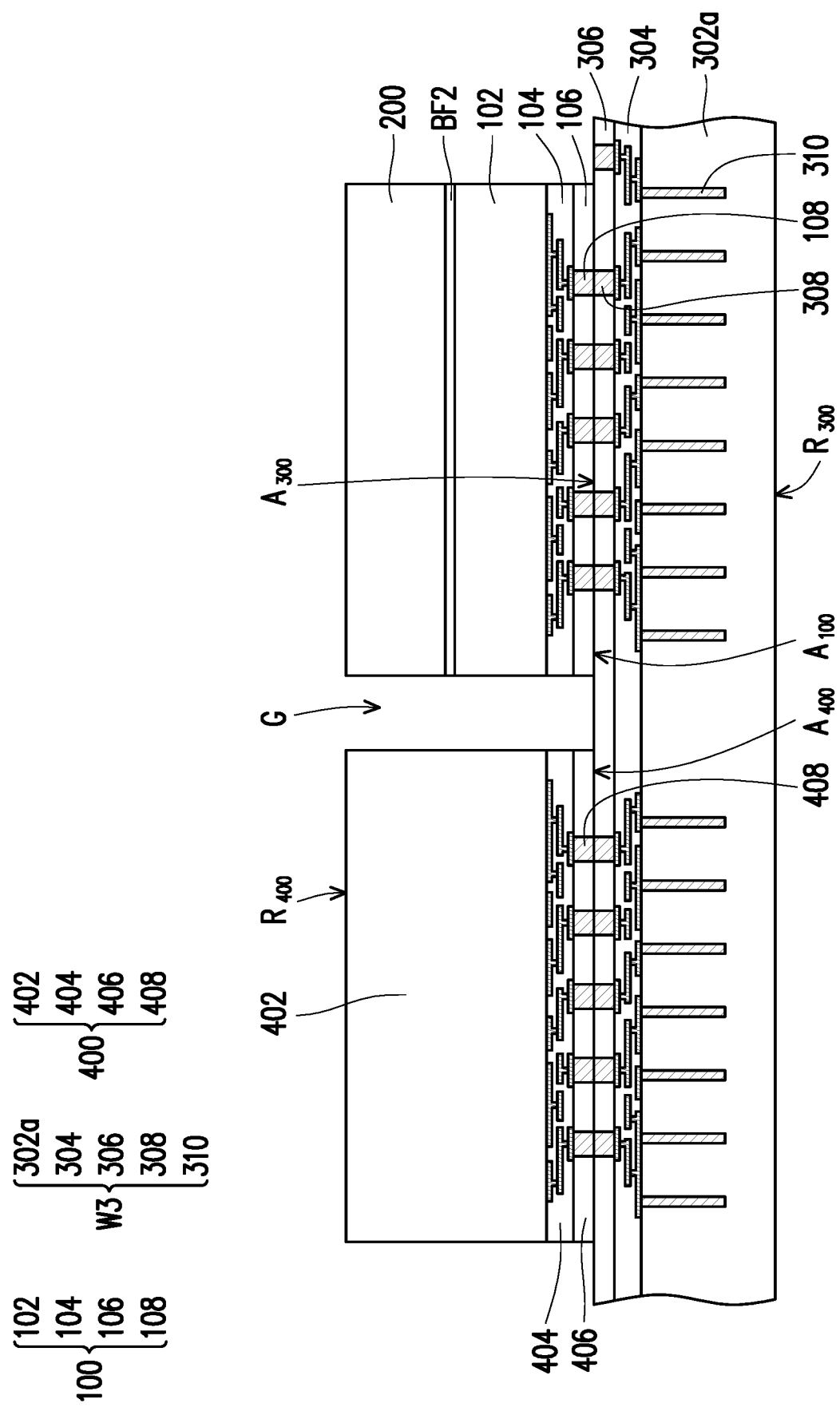
Figure 1G:
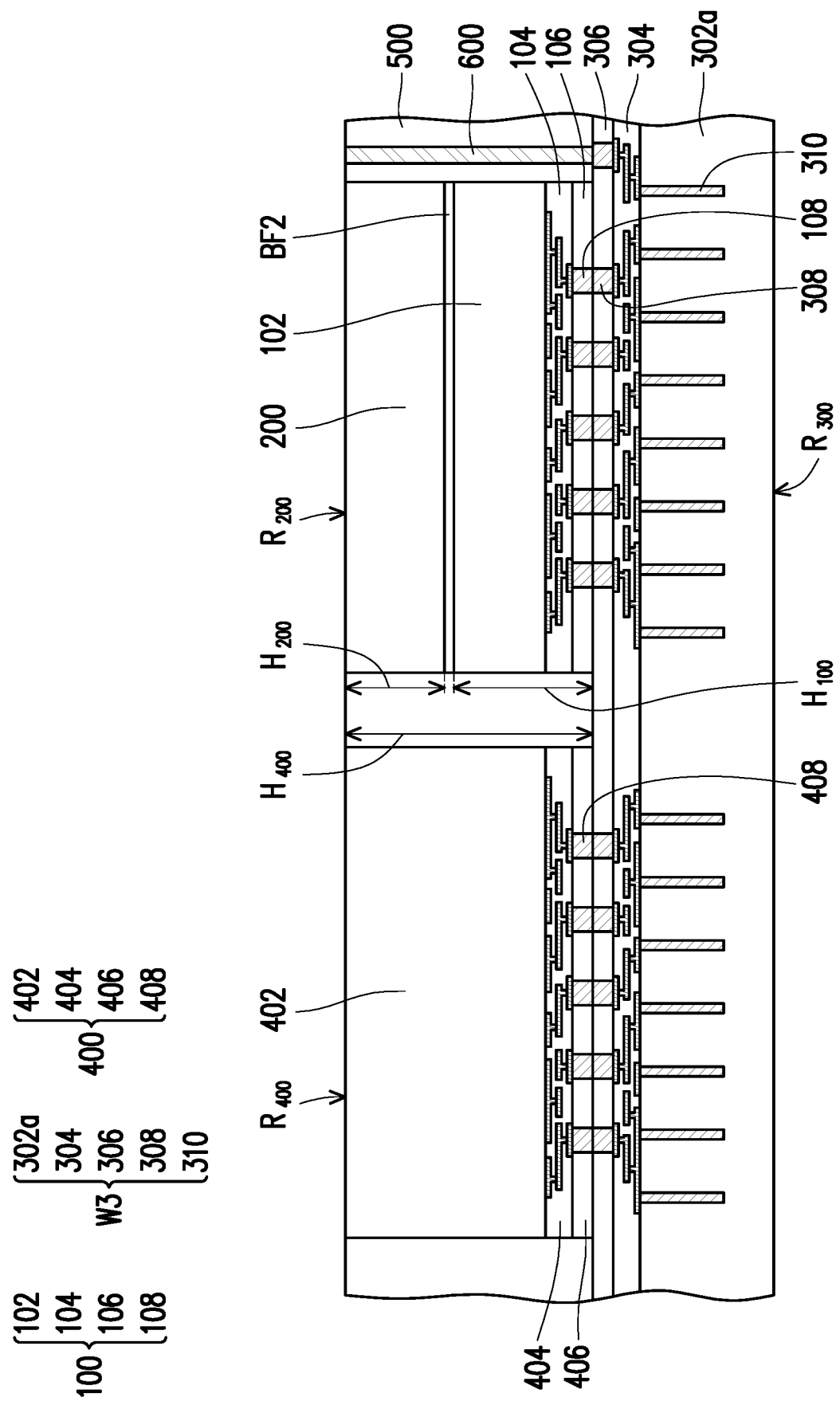
Figure 1H:
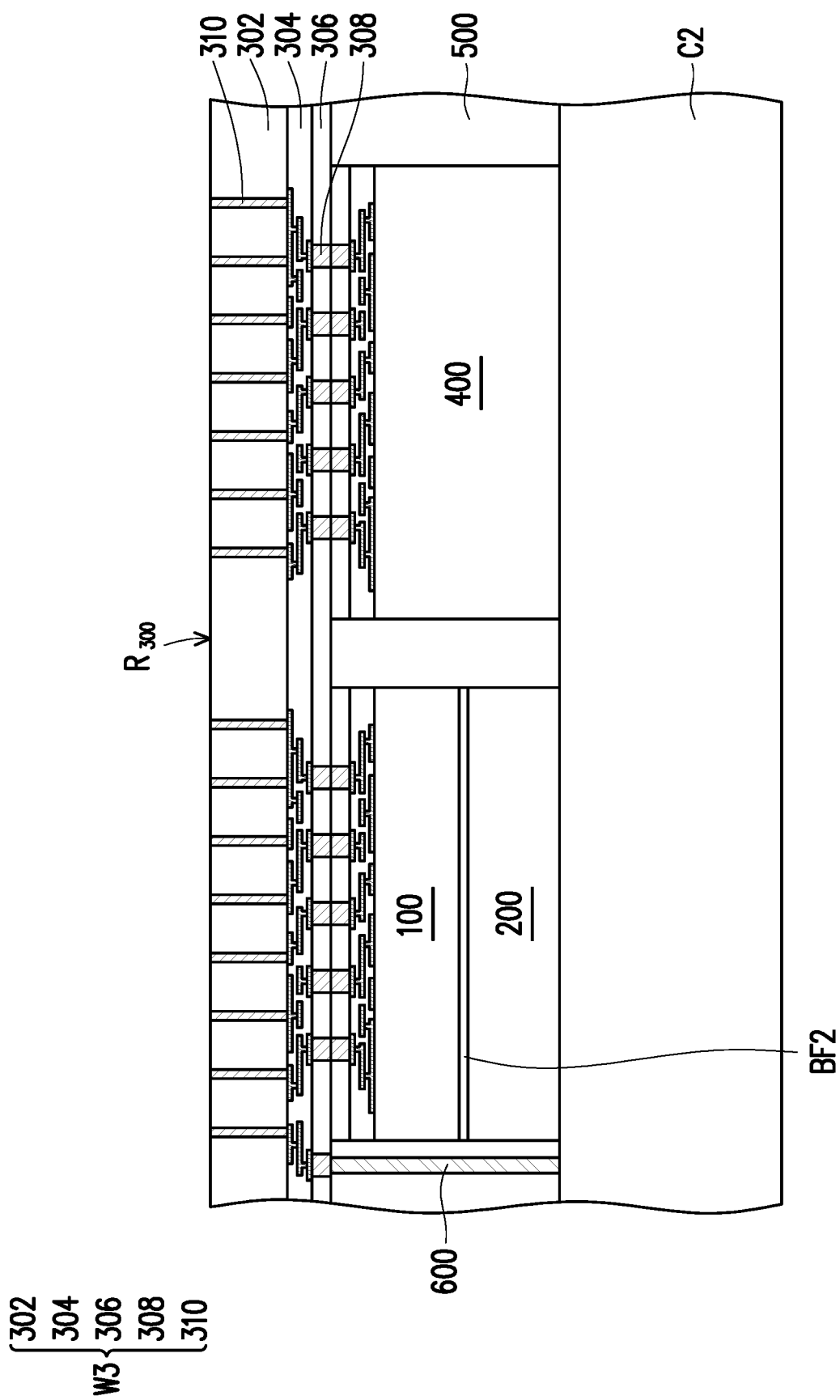
Figure 1I:
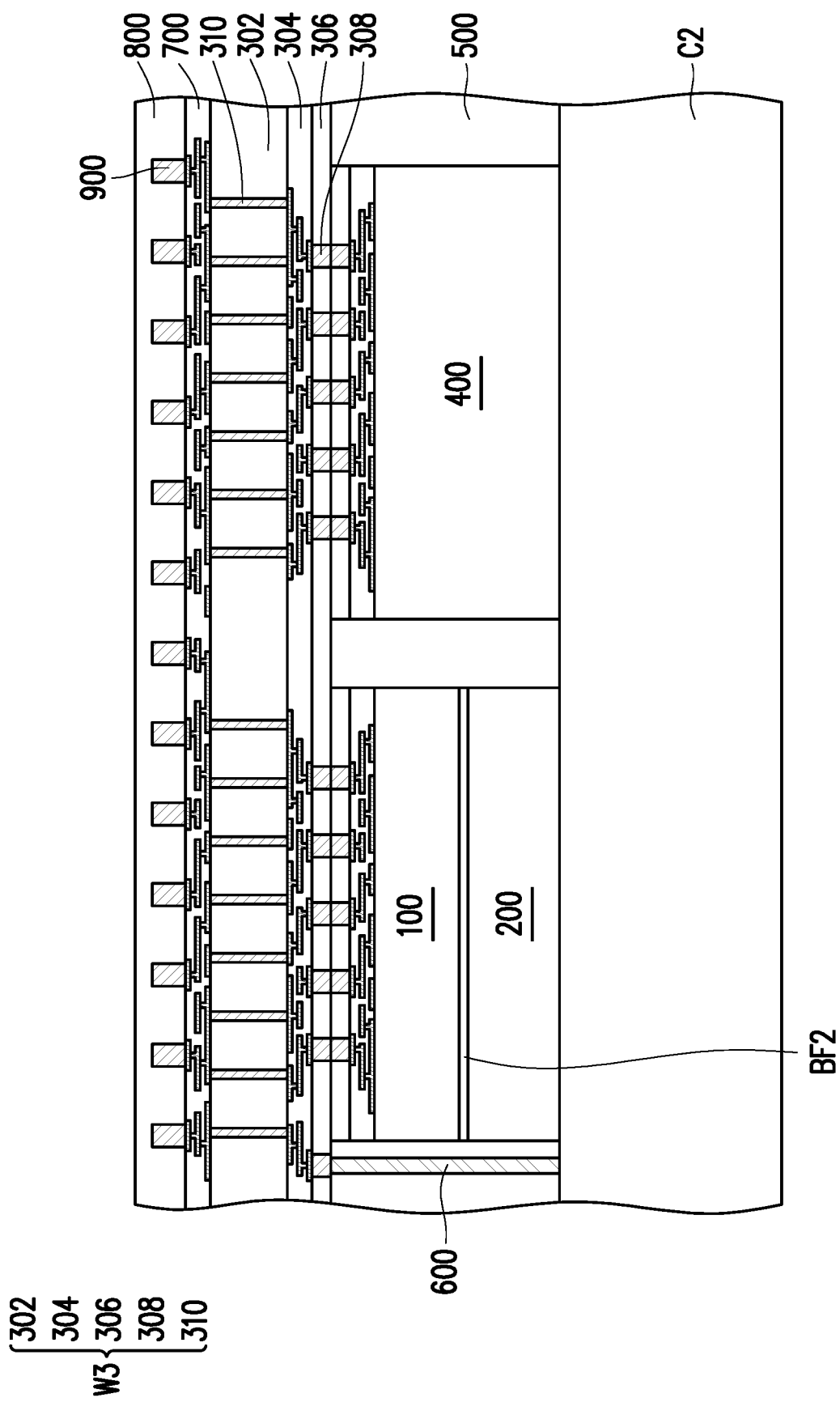
Figure 1J:
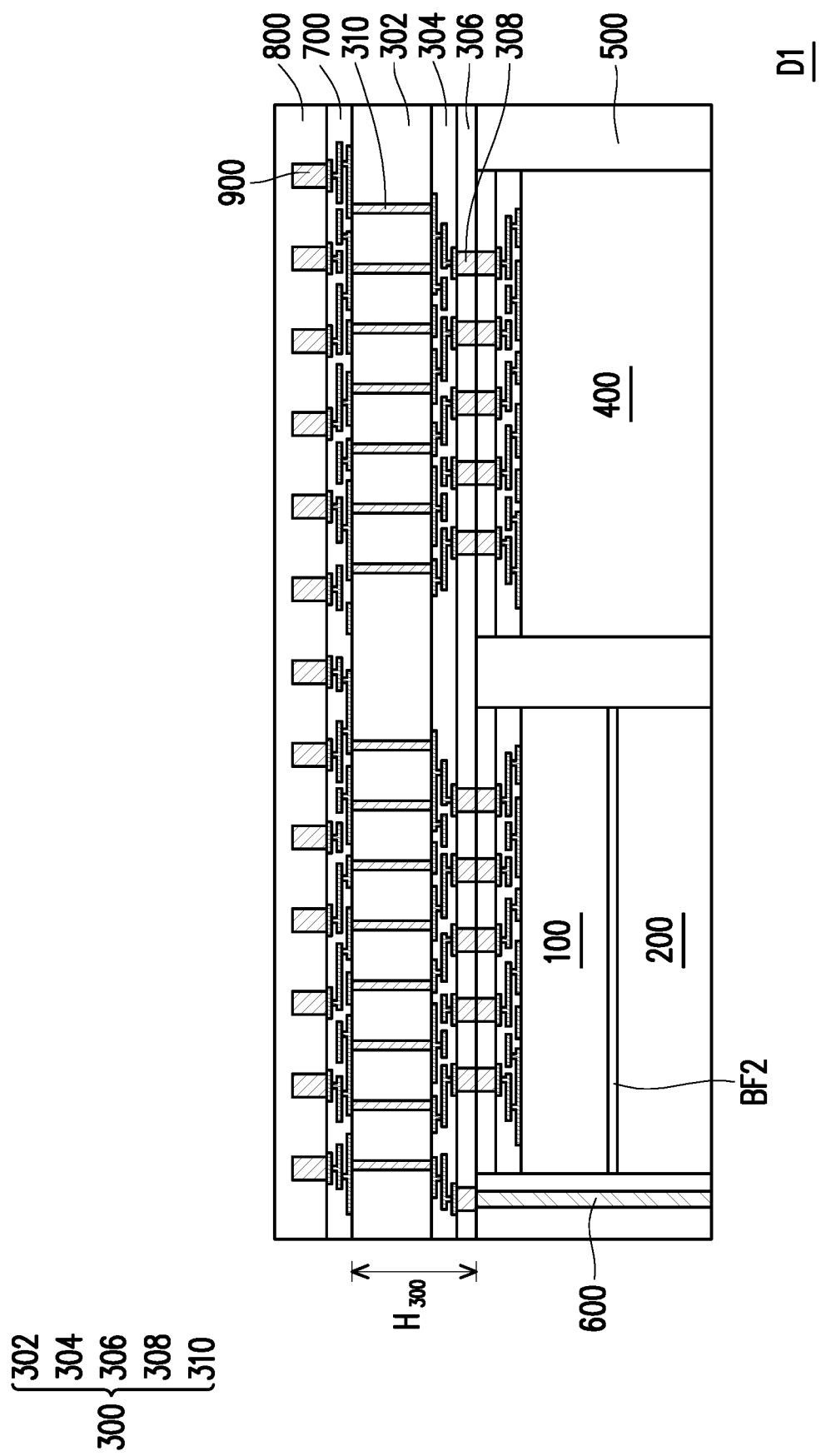
Figure 1K:
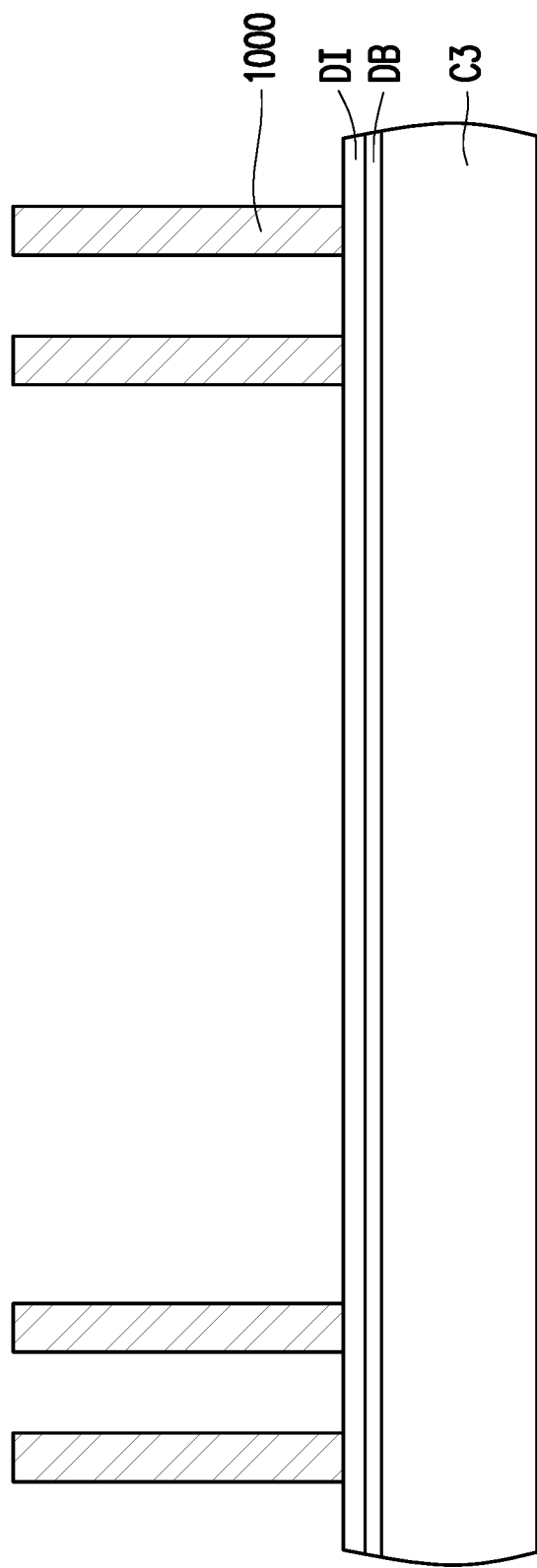
Figure 1L:
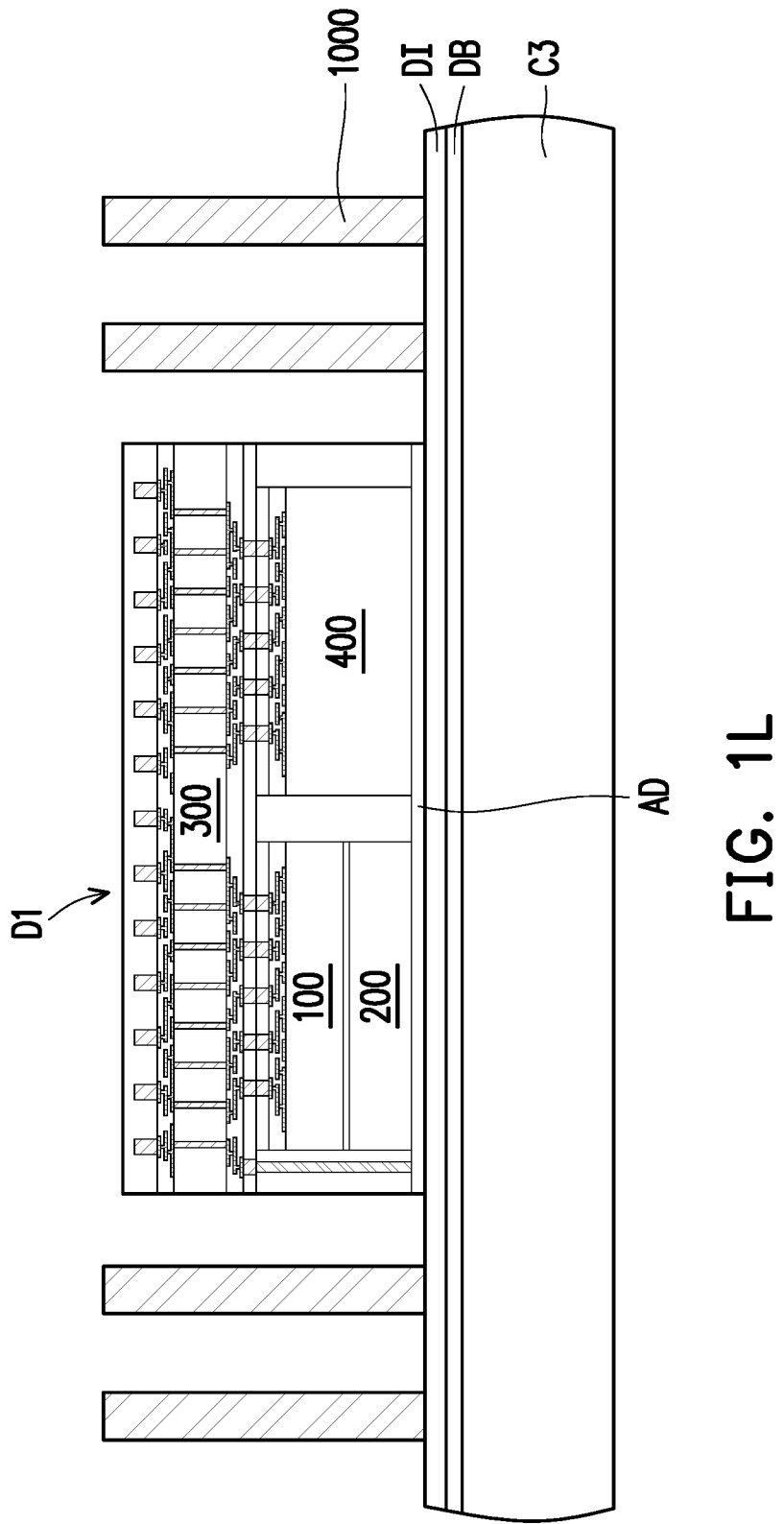
Figure 1M:
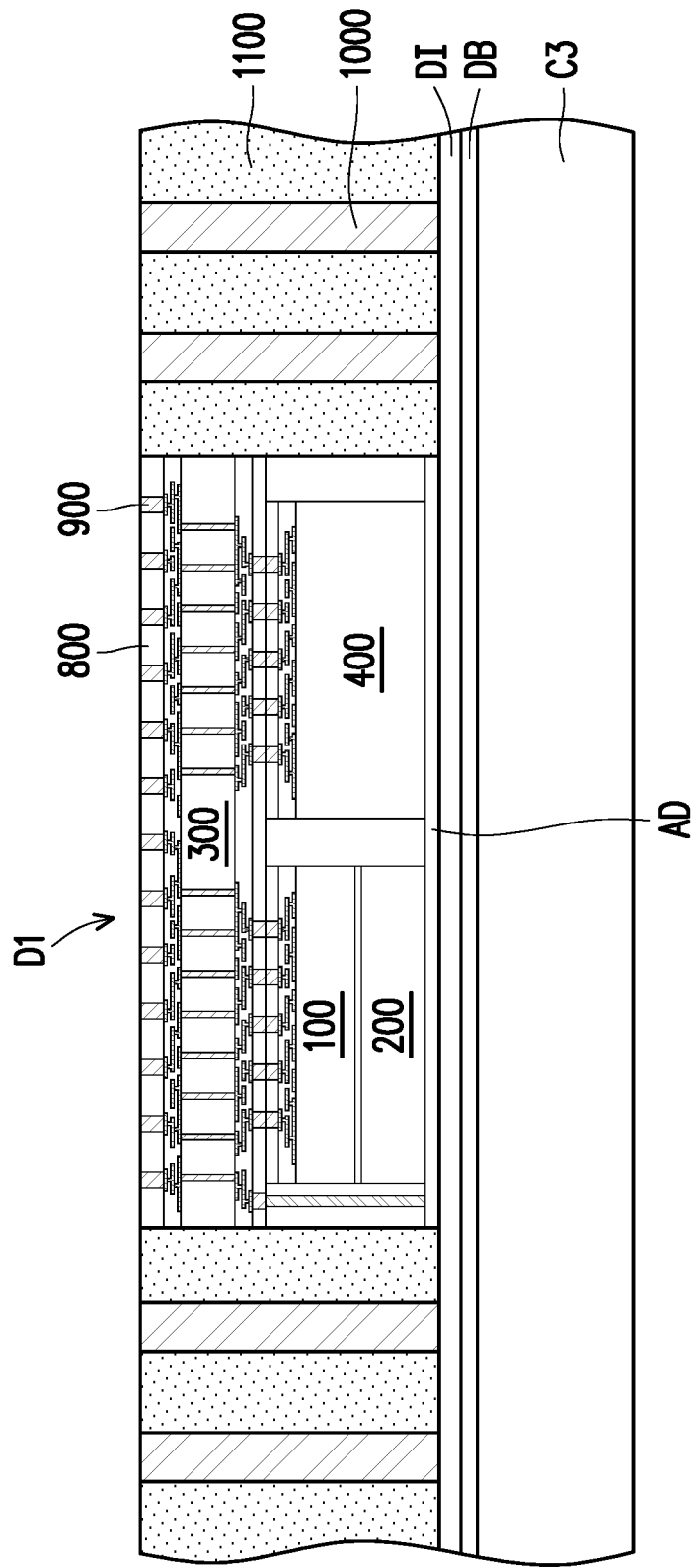
Figure 1N:
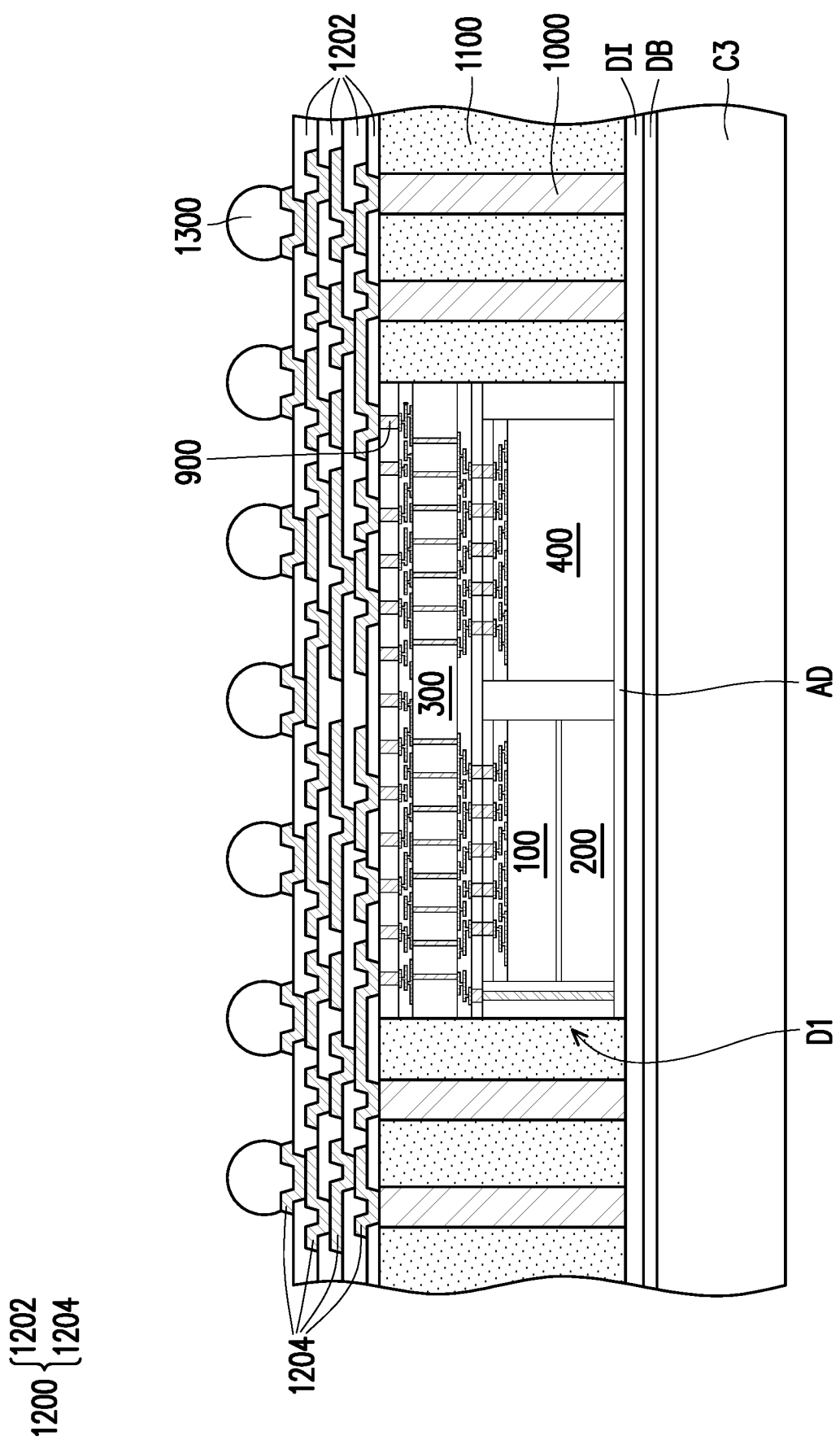
Figure 10:
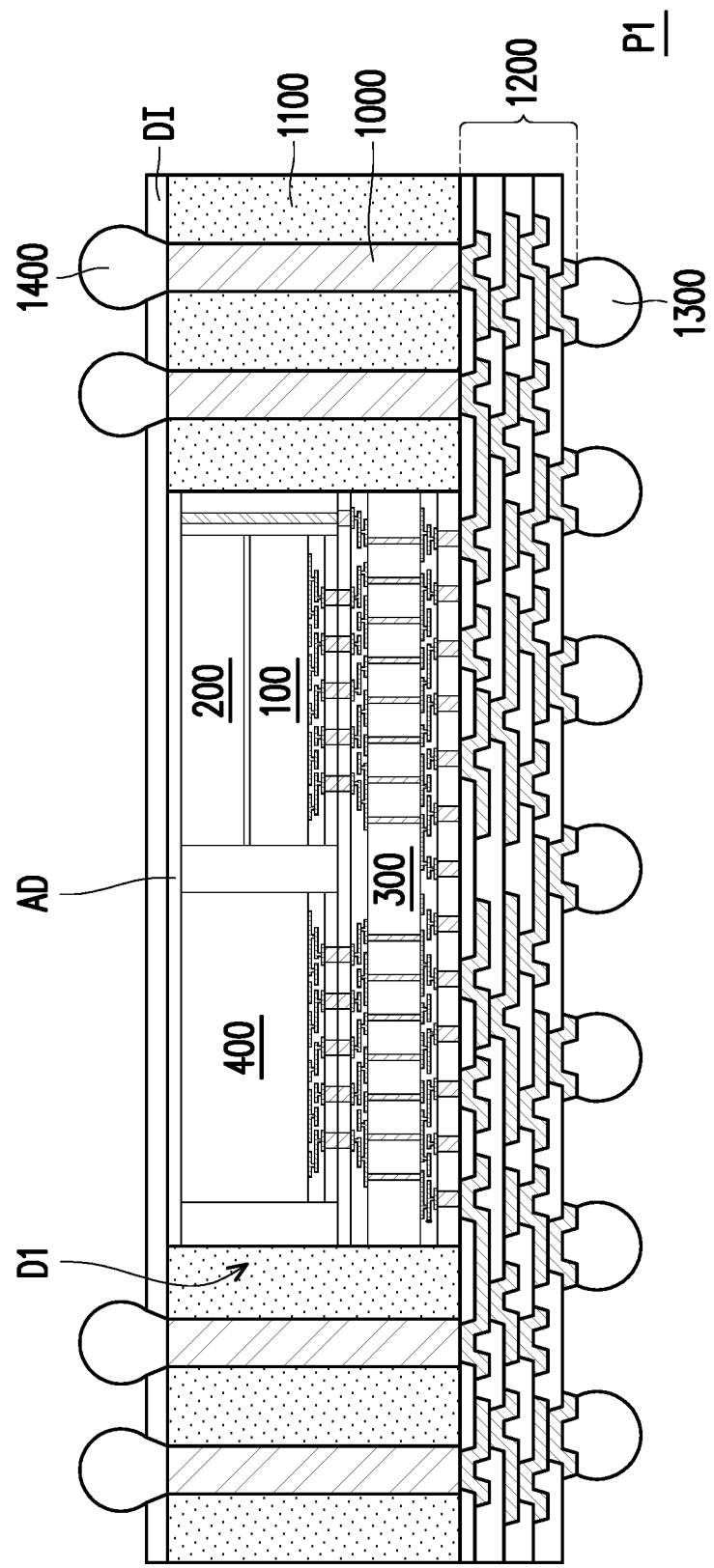
Figure 1P:
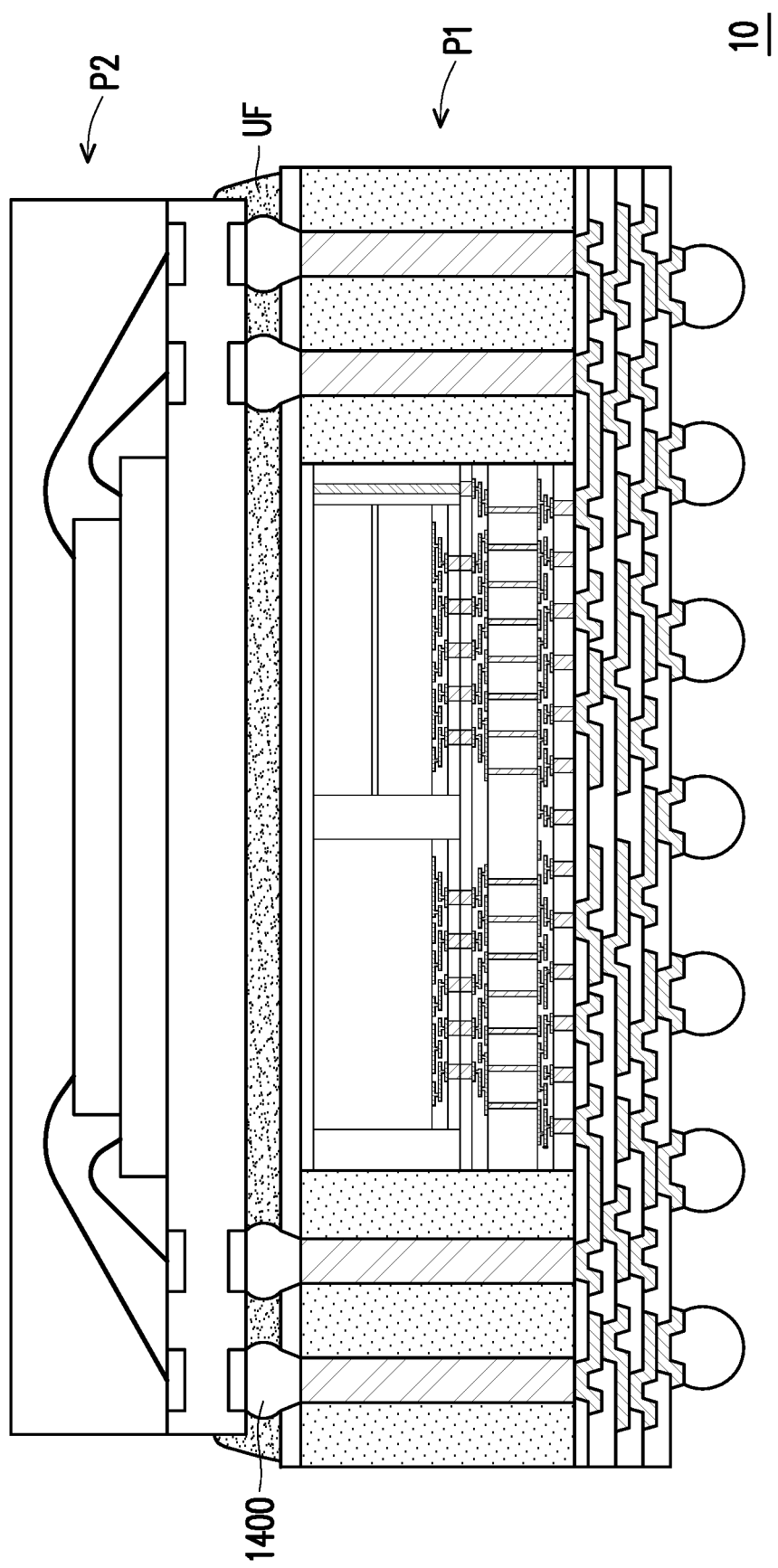

FIG. 1A to FIG. 1P are schematic cross-sectional views illustrating a manufacturing process of a package 10 in accordance with some embodiments of the disclosure. Referring to FIG. 1A, a semiconductor wafer W1 is provided. The semiconductor wafer W1 includes a semiconductor substrate 102a, an interconnection structure 104, a dielectric layer 106, and a plurality of conductors 108. In some embodiments, the semiconductor substrate 102a may be a silicon substrate. In some embodiments, the semiconductor substrate 102a may include active components (e.g., transistors or the like) and/or passive components (e.g., resistors, capacitors, inductors, or the like) formed therein. As illustrated in FIG. 1A, the interconnection structure 104 is disposed on the semiconductor substrate 102a and the dielectric layer 106 covers the interconnection structure 104. In some embodiments, the interconnection structure 104 may include a plurality of conductive patterns embedded in a dielectric material. In some embodiments, the conductors 108 are embedded in the dielectric layer 106. For example, the conductors 108 are laterally encapsulated by the dielectric layer 106. The conductors 108 are electrically connected to the semiconductor substrate 102a through the interconnection structure 104. For example, the conductors 108 may be electrically connected to the active components and/or the passive components in the semiconductor substrate 102a through the interconnection structure 104. In some embodiments, the material of the conductors 108 may be copper or other suitable metallic material while the material of the dielectric layer 106 may be silicon oxide, silicon nitride, silicon oxynitride, or other suitable dielectric materials.

In some embodiments, the dielectric layer 106 may be formed by depositing a dielectric material layer on the interconnection structure 104 and patterning the dielectric material layer to form a plurality of openings in the dielectric material layer. The openings formed in the dielectric layer 106 expose portions of the conductive patterns of the interconnection structure 104. After the dielectric layer 106 is patterned, a conductive material layer may be deposited on the dielectric layer 106 and the portions of the conductive patterns of the interconnection structure 104 exposed by the openings of the dielectric layer 106. Then, a polishing process (e.g., a chemical mechanical polishing process) is performed to partially remove the conductive material layer until the top surface of the dielectric layer 106 is exposed. After performing the polishing process, the conductors 108 are formed in the openings of the dielectric layer 106.

As illustrated in FIG. 1A, a bonding film BF1 is formed over the semiconductor wafer W1. For example, the bonding film BF1 is formed to cover the dielectric layer 106 and the conductors 108. In some embodiments, the bonding film BF1 may include a die attach film (DAF) or other materials having adhesion property.

Referring to FIG. 1B, the semiconductor wafer W1 is flipped upside down and is placed on a carrier C1. In some embodiments, the carrier C1 may be a semiconductor carrier, such as a silicon carrier. However, the disclosure is not limited thereto. In some alternative embodiments, the carrier C1 may be a glass carrier. In some embodiments, the semiconductor wafer W1 is attached to the carrier C1 through the bonding film BF1. After the semiconductor wafer W1 is bonded to the carrier C1, the semiconductor wafer W1 is thinned. For example, a portion of the semiconductor substrate 102a may be removed to from a semiconductor substrate 102, so as to reduce the overall thickness of the semiconductor wafer W1.

Referring to FIG. 1C, a semiconductor wafer W2 is provided. In some embodiments, the semiconductor wafer W2 may be a bulk semiconductor wafer free of active component and passive component. For example, the semiconductor wafer W2 may be an intrinsic silicon wafer without any active or passive component formed therein. However, the disclosure is not limited thereto. In some alternative embodiments, the semiconductor wafer W2 may include active component and/or passive component formed therein. As illustrated in FIG. 1C, a bonding film BF2 is formed over the semiconductor wafer W2. In some embodiments, the bonding film BF2 may include a die attach film (DAF) or other materials having adhesion property. In some embodiments, a thickness of the bonding film BF2 may range between about 0.01 μm and about 2 μm. In some embodiments, a plurality of through semiconductors vias (TSV; not shown) may be optionally formed in the semiconductor wafer W2.

Referring to FIG. 1D, the semiconductor wafer W2 and the bonding film BF2 illustrated in FIG. 1C is flipped upside down and is attached to the structure shown in FIG. 1B. That is, the semiconductor wafer W2 is attached to the semiconductor wafer W1. In some embodiments, the semiconductor wafer W2 is adhere to the semiconductor substrate 102 of the semiconductor wafer W1 through the bonding film BF2. In some embodiments, the bonding between the semiconductor wafer W2 and the semiconductor wafer W1 may be realized through fusion bonding. The fusion bonding process may include a hydrophilic fusion bonding process, where a workable temperature is approximately greater than or substantially equal to about 100 Celsius degree and a workable pressure is approximately greater than or substantially equal to about 1 kg/cm². In some embodiments, the fusion bonding process does not involve metal to metal bonding. In some embodiments, the fusion bonded interface between the bonding film BF2 and the semiconductor substrate 102 is substantially flat. For example, the fusion bonded interface has a roughness of 1 Å to 50 Å. In some embodiments, since the semiconductor wafer W2 and the semiconductor wafer W1 are both in wafer form, the bonding of the semiconductor wafer W2 to the semiconductor wafer W1 is referred to as "wafer-to-wafer bonding."

Referring to FIG. 1D and FIG. 1E, the carrier C1 and the bonding film BF1 are removed from the semiconductor wafer W1. Thereafter, the semiconductor wafer W1, the semiconductor wafer W2, and the bonding film BF2 are singulated to form a plurality of chips 100 and a plurality of chips 200. In some embodiments, the singulation process typically involves dicing with a rotating blade or a laser beam. In other words, the singulation process is, for example, a laser cutting process, a mechanical cutting process, or other suitable processes. In some embodiments, each chip 100 may be Dynamic Random Access Memory (DRAM), Resistive Random Access Memory (RRAM), Static Random Access Memory (SRAM). Examples of the DRAM include High Bandwidth Memory (HBM), Wide I/O (WIO) Memory, Low-Power Double Date Rate (LPDDR) DRAM, or the like. In some embodiments, each chip 100 includes the semiconductor substrate 102, the interconnection structure 104, the dielectric layer 106, and the conductors 108. In some embodiments, top surfaces of the conductors 108 and a top surface of the dielectric layer 106 may be collectively referred to as an active surface $A_{100}$ of the chip 100. On the other hand, the surface of the chip 100 opposite to the active surface $A_{100}$ may be referred to as a rear surface $R_{100}$ of the chip 100. As illustrated in FIG. 1E, the top surfaces of the conductors 108 and the top surface of the dielectric layer 106 are substantially located at the same level height to provide an appropriate active surface $A_{100}$ for hybrid bonding. Meanwhile, the chips 200 are attached to the rear surfaces $R_{100}$ of the chips 200 through the bonding film BF2. In other words, the chips 100 are fusion bonded to the chips 200. In some embodiments, sidewalls of the chip 100 are aligned with sidewalls of the chip 200. In some embodiments, the chips 200 are dummy chips free of active component and passive component. That is, the chips 200 are disabled/not contributive during operation of the subsequently formed electronic device. However, the disclosure is not limited thereto. In some alternative embodiments, the chips 200 may include active component and/or passive component formed therein. That is, depending on the design requirements, the chips 200 may contribute to the operation of the subsequently formed electronic device. In some embodiments, the chip 200 may be referred to as "Mechanical-Electrical-Thermal (MET) chip."

Referring to FIG. 1F, a semiconductor wafer W3 is provided. The semiconductor wafer W3 includes a semiconductor substrate 302a, an interconnection structure 304, a dielectric layer 306, a plurality of conductors 308, and a plurality of through semiconductor vias (TSV) 310. In some embodiments, the semiconductor substrate 302a, the interconnection structure 304, the dielectric layer 306, and the conductors 308 are respectively similar to the semiconductor substrate 102a, the interconnection structure 104, the dielectric layer 106, and the conductors 108 of the semiconductor wafer W1 in FIG. 1A, so the detailed description thereof is omitted herein. In some embodiments, the TSVs 310 are embedded in the semiconductor substrate 302a and are not revealed. The TSVs 310 are electrically connected to the interconnection structure 304. In some embodiments, top surfaces of the conductors 308 and a top surface of the dielectric layer 306 may be collectively referred to as an active surface $A_{300}$ of the semiconductor wafer W3. On the other hand, the surface of the semiconductor wafer W3 opposite to the active surface $A_{300}$ may be referred to as a rear surface $R_{300}$ of the semiconductor wafer W3. As illustrated in FIG. 1F, the top surfaces of the conductors 108 and the top surface of the dielectric layer 106 are substantially located at the same level height to provide an appropriate active surface $A_{300}$ for hybrid bonding.

In some embodiments, the chip 100 having the chip 200 attached thereto shown in FIG. 1E is picked-and-placed onto the active surface $A_{300}$ of the semiconductor wafer W3 such that the chip 100 is electrically connected to the semiconductor wafer W3. In some embodiments, the chip 100 and the semiconductor wafer W3 are hybrid bonded. For example, the chip 100 is placed such that the active surface $A_{100}$ of the chip 100 is in contact with the active surfaces $A_{300}$ of the semiconductor wafer W3, and the conductors 308 of the semiconductor wafer W3 are substantially aligned and in direct contact with the conductors 108 of the chip 100.

In some embodiments, to facilitate the hybrid bonding between the chip 100 and the semiconductor wafer W3, surface preparation for bonding surfaces (i.e. the active surface $A_{100}$ and the active surface $A_{300}$) of the chip 100 and the semiconductor wafer W3 may be performed. The surface preparation may include surface cleaning and activation, for example. Surface cleaning may be performed on the active surfaces $A_{100}$, $A_{300}$ to remove particles on top surfaces of the conductors 108, 308 and the dielectric layers 106, 306. In some embodiments, the active surfaces $A_{100}$, $A_{300}$ may be cleaned by wet cleaning, for example. Not only particles are removed, but also native oxide formed on the top surfaces of the conductors 108, 308 may be removed. The native oxide formed on the top surfaces of the conductors 108, 308 may be removed by chemicals used in wet cleaning processes, for example.

After cleaning the active surface $A_{100}$ of the chip 100 and the active surface $A_{300}$ of the semiconductor wafer W3, activation of the top surfaces of the dielectric layers 106, 306 may be performed for development of high bonding strength. In some embodiments, plasma activation may be performed to treat the top surfaces of the dielectric layers 106, 306. When the activated top surface of the dielectric layer 106 is in contact with the activated top surface of the dielectric layer 306, the dielectric layer 106 of the chip 100 and the dielectric layer 306 of the semiconductor wafer W3 are pre-bonded.

After pre-bonding the chip 100 onto the semiconductor wafer W3, hybrid bonding of the chip 100 and the semiconductor wafer W3 is performed. The hybrid bonding of the chip 100 and the semiconductor wafer W3 may include a thermal treatment for dielectric bonding and a thermal annealing for conductor bonding. In some embodiments, the thermal treatment for dielectric bonding is performed to strengthen the bonding between the dielectric layers 106, 306. For example, the thermal treatment for dielectric bonding may be performed at temperature ranging from about 100 Celsius degree to about 150 Celsius degree. After performing the thermal treatment for dielectric bonding, the thermal annealing for conductor bonding is performed to facilitate the bonding between the conductors 108, 308. For example, the thermal annealing for conductor bonding may be performed at temperature ranging from about 300 Celsius degree to about 400 Celsius degree. The process temperature of the thermal annealing for conductor bonding is higher than that of the thermal treatment for dielectric bonding. After performing the thermal annealing for conductor bonding, the dielectric layer 106 is bonded to the dielectric layer 306 and the conductors 108 are bonded to the conductors 308. In some embodiments, the conductors 108 of the chip 100 and the conductors 308 of the semiconductor wafer W3 may respectively be conductive vias (e.g., copper vias), conductive pads (e.g., copper pads), or combinations thereof. For example, the conductor bonding between the conductors 108, 308 may be via-to-via bonding, pad-to-pad bonding, or via-to-pad bonding. In some embodiments, sidewalls of the conductors 108 are aligned with sidewalls of the conductors 308.

As illustrated in FIG. 1F, other than the chip 100, a chip 400 is also picked-and-placed onto the active surface $A_{300}$ of the semiconductor wafer W3 such that the chip 400 is electrically connected to the semiconductor wafer W3. In some embodiments, the chip 400 and the chip 100 are disposed on the semiconductor wafer W3 side by side with a gap G between the two. In some embodiments, from a top view, the sidewalls of the chip 400 are not aligned with the sidewalls of the chip 100 and sidewalls of the chip 200. In some embodiments, the chip 400 includes a semiconductor substrate 402, an interconnection structure 404, a dielectric layer 406, and a plurality of conductors 408. The semiconductor substrate 402, the interconnection structure 404, the dielectric layer 406, and the conductors 408 are respectively similar to the semiconductor substrate 102, the interconnection structure 104, the dielectric layer 106, and the conductors 108 of the chip 100, so the detailed descriptions thereof are omitted herein. In some embodiments, the chip 400 may be capable of performing logic functions. For example, the chip 400 may be Central Process Unit (CPU) chip, Graphic Process Unit (GPU) chip, Field-Programmable Gate Array (FPGA), or the like. In some embodiments, top surfaces of the conductors 408 and a top surface of the dielectric layer 406 may be collectively referred to as an active surface $A_{400}$ of the chip 400. On the other hand, the surface of the chip 400 opposite to the active surface $A_{400}$ may be referred to as a rear surface $R_{400}$ of the chip 400. As illustrated in FIG. 1F, the top surfaces of the conductors 408 and the top surface of the dielectric layer 406 are substantially located at the same level height to provide an appropriate active surface $A_{400}$ for hybrid bonding. In some embodiments, the chip 400 is hybrid bonded to the semiconductor wafer W3. For example, the chip 400 may be bonded to the semiconductor wafer W3 through similar manner as that of the chip 100 and the semiconductor wafer W3, so the detailed description thereof is omitted herein. As illustrated in FIG. 1F, the dielectric layer 406 is hybrid bonded to the dielectric layer 306 and the conductors 408 are hybrid bonded to the conductors 308. In some embodiments, sidewalls of the conductors 308 are aligned with sidewalls of the conductors 408.

Referring to FIG. 1F and FIG. 1G, an insulating encapsulant 500 is formed to fill the gap G. For example, the insulating encapsulant 500 is formed to laterally encapsulate the chips 100, 200, and 400. In some embodiments, the insulating encapsulant 500 includes a molding compound, a molding underfill, a resin (such as epoxy), or the like. In some alternative embodiments, the insulating encapsulant 500 may include silicon oxide and/or silicon nitride. In some embodiments, the insulating encapsulant 500 may be formed through chemical vapor deposition (CVD), plasma-enhanced chemical vapor deposition (PECVD), atomic layer deposition (ALD), or the like. In some embodiments, the insulating encapsulant 500 may be free of filler. In some embodiments, the insulating encapsulant 500 may be referred to as "gap fill oxide." In some embodiments, a planarization process may be performed on the rear surface $R_{200}$ of the chip 200, the rear surface $R_{400}$ of the chip 400, and the insulating encapsulant 500 to further reduce the overall thickness of the subsequently formed package. In some embodiments, the planarization process includes a mechanical grinding process and/or a chemical mechanical polishing (CMP) process.

In some embodiments, one or more through insulating vias (TIV) 600 may be optionally formed in the insulating encapsulant 500. In some embodiments, the TIV 600 penetrate through the insulating encapsulant 500 and is electrically connected to the semiconductor wafer W3. For example, the TIV 600 is directly in contact with the conductor 308 such that the active components and/or the passive components in the semiconductor substrate 302a may be electrically connected to the TIV 600 sequentially through the interconnection structure 304 and the conductor 308. In some embodiments, the TIV 600 may be made of conductive materials. For example, the material of the TIV 600 may include a metal material such as copper, copper alloys, or the like. In some embodiments, the TIV 600 may be formed prior to the formation of the insulating encapsulant 500. However, the disclosure is not limited thereto. In some alternative embodiments, the TIV 600 may be formed after the formation of the insulating encapsulant 500. For example, the TIV 600 may be formed by forming a plurality of openings in the insulating encapsulant 500 and filling a conductive material into the openings of the insulating encapsulant 500.

In some embodiments, a thickness $H_{400}$ of the chip 400 is substantially equal to a sum of a thickness of $H_{100}$ of the chip 100 and a thickness $H_{200}$ of the chip 200. It should be noted the bonding film BF2 between the chip 100 and the chip 200 is relative thin as compared to the chips 100, 200, so the thickness of the bonding film BF2 may be negligible. In some embodiments, the thickness $H_{400}$ of the chip 400 is about 10 µm to about 120 µm. In other words, the sum of the thicknesses $H_{100}$, $H_{200}$ of the chips 100, 200 also ranges between about 10 µm and about 120 µm. In some embodiments, even when the chip 400 requires a certain thickness, the thickness $H_{100}$ of the chip 100 may still be flexibly adjusted with the adoption of chip 200. That is, the deficiency in the thickness $H_{100}$ of the chip 100 may be compensated by the thickness $H_{200}$ of the chip 200.

Referring to FIG. 1G and FIG. 1H, the structure illustrated in FIG. 1G is flipped upside down and is attached to a carrier C2. The carrier C2 in FIG. 1H may be similar to the carrier C1 in FIG. 1B, so the detailed description thereof is omitted herein. Thereafter, a planarization process is performed on the rear surface $R_{300}$ of the semiconductor wafer W3. In some embodiments, the planarization process includes a mechanical grinding process and/or a CMP process. In some embodiments, the semiconductor substrate 302a of the semiconductor wafer W3 is grinded until the TSVs 310 are revealed, so as to form a semiconductor substrate 302. For example, after the planarization process, the TSVs 310 penetrate through the semiconductor substrate 302. The TSVs 310 allow electrical communication between the front side and the back side of the semiconductor wafer W3. In some embodiments, after the TSVs 310 are revealed, the semiconductor wafer W3 may be further grinded to reduce the overall thickness of the semiconductor wafer W3.

Referring to FIG. 1I, an interconnection structure 700, a passivation layer 800, and a plurality of conductive vias 900 are formed on the rear surface $R_{300}$ of the semiconductor wafer W3. The interconnection structure 700 includes a plurality of conductive patterns embedded in a dielectric material. In some embodiments, the interconnection structure 700 is electrically connected to the TSVs 310 of the semiconductor wafer W3. For example, the conductive patterns of the interconnection structure 700 may be in direct contact with the TSVs 310 of the semiconductor wafer W3.

The passivation layer 800 and the conductive vias 900 are formed over the interconnection structure 700. In some embodiments, the conductive vias 900 are formed on and directly in contact with the conductive patterns of the interconnection structure 700. That is, the conductive vias 900 are electrically connected with the chips 100 and 400 sequentially through the interconnection structure 700, the TSVs 310, the interconnection structure 304, and the conductors 308. In some embodiments, the conductive vias 900 are made of conductive materials and are plated on the conductive patterns of the interconnection structure 700. For example, a material of the conductive vias 900 may include copper, copper alloy, or the like. In some embodiments, the passivation layer 800 is formed to cover the conductive vias 900. In some embodiments, a material of the passivation layer 800 includes polyimide, epoxy resin, acrylic resin, phenol resin, benzocyclobutene (BCB), polybenzoxazole (PBO), or any other suitable polymer-based dielectric material. The passivation layer 800, for example, may be formed by suitable fabrication techniques such as spin-on coating, CVD, PECVD, or the like. As illustrated in FIG. 1I, the conductive vias 900 are well-protected by the passivation layer 800. However, the disclosure is not limited thereto. In some alternative embodiments, the passivation layer 800 may expose the conductive vias 900.

Referring to FIG. 1I and FIG. 1J, the carrier C2 is removed and a singulation process is performed on the structure illustrated in FIG. 1I to obtain a plurality of integrated circuits D1. In some embodiments, the singulation process typically involves dicing with a rotating blade or a laser beam. In other words, the singulation process is, for example, a laser cutting process, a mechanical cutting process, or other suitable processes. In some embodiments, the singulation process divides the semiconductor wafer W3 into a plurality of chips 300. That is, each chip 300 includes the semiconductor substrate 302, the interconnection structure 304, the dielectric layer 306, the conductors 308, and the TSVs 310. In some embodiments, the chip 300 may be capable of performing logic functions. For example, the chip 300 may be Central Process Unit (CPU) chip, Graphic Process Unit (GPU) chip, Field-Programmable Gate Array (FPGA), or the like. In some embodiments, a thickness $H_{300}$ of the chip 300 ranges between about 10 µm and about 50 µm.

In some embodiments, since multiple chips (chips 100, 200, 300, and 400) are integrated into a single integrated circuit D1, the integrated circuit D1 may be referred to as a "system on integrated chips (SOIC)." As illustrated in FIG. 1J, the chip 100 and the chip 400 are disposed side by side on the chip 300. The chip 100 and the chip 400 are hybrid bonded to the chip 300. On the other hand, the chip 100 is fusion bonded to the chip 200 through the bonding film BF2. In some embodiments, the chip 200 may be made of the same material as the chips 100, 300, and 400. As such, mismatch of the Coefficient of Thermal Expansion (CTE) between different components of the integrated circuit D1 or the subsequently formed package may be reduced. As a result, the warpage derived from the manufacturing process of the integrated circuit D1 or the subsequently formed package may be minimized, thereby increasing the yield rate. Moreover, in some embodiments, the chip 200 may also serve as a heat dissipation mechanism to increase the heat dissipation rate during operation of the subsequently formed package. In some embodiments, the integrated circuit D1 further includes the insulating encapsulant 500, the TSV 600, the interconnection structure 700, the passivation layer 800, and the conductive vias 900. The insulating encapsulant 500 laterally encapsulates the chips 100, 200, and 400. The TSV 600 penetrates through the encapsulant 500 and is electrically connected to the chip 300. The interconnection structure 700, the passivation layer 800, and the conductive vias 900 are disposed on the chip 300 opposite to the chips 100, 200, and 400. In some embodiments, the integrated circuit D1 may be utilized in various applications. For example, the integrated circuit D1 may be used as a die in an integrated fan-out (InFO) package. The manufacturing process of the InFO package will be described below.

Referring to FIG. 1K, a carrier C3 having a de-bonding layer DB and a dielectric layer DI stacked thereon is provided. In some embodiments, the de-bonding layer DB is formed on the upper surface of the carrier C3, and the de-bonding layer DB is between the carrier C and the dielectric layer DI. For example, the carrier C3 may be a glass substrate and the de-bonding layer DB may be a light-to-heat conversion (LTHC) release layer formed on the glass substrate. However, the disclosure is not limited thereto, and other suitable materials may be adapted for the carrier C3 and the de-bonding layer DB. In some embodiments, a material of the dielectric layer DI includes polyimide, epoxy resin, acrylic resin, phenol resin, BCB, PBO, or any other suitable polymer-based dielectric material. The dielectric layer DI, for example, may be formed by suitable fabrication techniques such as spin-on coating, CVD, PECVD, or the like. In some embodiments, the dielectric layer DI may have adhesion property to adhere the subsequently formed elements.

As illustrated in FIG. 1K, a plurality of conductive structures 1000 is formed over the dielectric layer DI. In some embodiments, the method of forming the conductive structures 1000 includes the following steps. First, a seed material layer (not shown) is formed over the dielectric layer DI. In some embodiments, the seed material layer includes a titanium/copper composite layer formed by a sputtering process. Subsequently, a photoresist layer (not shown) with openings is formed on the seed material layer. The openings of the photoresist layer expose the intended locations for the subsequently formed conductive structures 1000. Thereafter, a plating process is performed to form a metal material layer (e.g., a copper layer) on the seed material layer exposed by the openings of the photoresist layer. The photoresist layer and the underlying seed material layer are then removed to form the conductive structures 1000. However, the disclosure is not limited thereto. In some alternative embodiments, the conductive structures 1000 may be formed by pick-and-place pre-fabricated conductive structures onto the dielectric layer DI.

Referring to FIG. 1L, the integrated circuit D1 illustrated in FIG. 1J is picked-and-placed onto the dielectric layer DI. The integrated circuit D1 is placed such that the conductive structures 1000 surround the integrated circuit D1. As illustrated in FIG. 1L, the integrated circuit D1 is attached (or adhered) to the dielectric layer DI through an adhesive layer AD. The adhesive layer AD may be a die attach film or the like. Although one integrated circuit D1 is illustrated in FIG. 1L, the disclosure is not limited thereto. In some alternative embodiments, more than one integrated circuit D1 may be picked-and-placed onto the dielectric layer DI.

Referring to FIG. 1M, an encapsulant 1100 is formed on the dielectric layer DI to laterally encapsulate the integrated circuit D1 and the conductive structures 1000. For example, the encapsulant 1100 is in direct contact with sidewalls of the chip 300 to laterally encapsulate the chip 300. In some embodiments, the encapsulant 1100 may be formed by the following steps. First, an encapsulation material (not shown) is formed over the dielectric layer DI to cover the integrated circuit D1 and the conductive structures 1000. The encapsulation material is a molding compound, a molding underfill, a resin (such as epoxy), or the like. In some embodiments, the encapsulation material may further include fillers. The encapsulation material may be formed by a molding process, such as a compression molding process. After the encapsulation material is formed, the encapsulation material and the passivation layer 800 of the integrated circuit D1 are grinded until top surfaces of the conductive structures 1000 and top surfaces of the conductive vias 900 are exposed. In some embodiments, the encapsulation material is grinded by a mechanical grinding process and/or a CMP process. In some embodiments, during the grinding process of the encapsulation material and the passivation layer 800, portions of the conductive vias 900 and portions of the conductive structures 1000 are slightly grinded as well. As illustrated in FIG. 1M, the top surfaces of the conductive structures 1000, a top surface of the passivation layer 800, and the top surfaces of the conductive vias 900 are substantially coplanar with a top surface of the encapsulant 1100. In some embodiments, the top surface of the passivation layer 800 and the top surfaces of the conductive vias 900 may be referred to as the active surface of the integrated circuit D1.

Referring to FIG. 1N, a redistribution structure 1200 and a plurality of conductive terminals 1300 are formed over the integrated circuit D1, the conductive structures 1000, and the encapsulant 1100. In some embodiments, the redistribution structure 1200 is electrically connected to the conductive vias 900 of the integrated circuit D1 and the conductive structures 1000. The redistribution structure 1200 includes a plurality of inter-dielectric layers 1202 and a plurality of redistribution conductive patterns 1204 stacked alternately. The redistribution conductive patterns 1204 are electrically connected to the conductive vias 900 of the integrated circuit D1 and the conductive structures 1000 embedded in the encapsulant 1100. In some embodiments, the bottommost inter-dielectric layer 1202 has a plurality of contact openings exposing the top surfaces of the conductive vias 900 and the top surfaces of the conductive structures 1000. The bottommost redistribution conductive patterns 1204 extend into the contact openings of the bottommost inter-dielectric layer 1202 to be in physical contact with the top surfaces of the conductive vias 900 and the top surfaces of the conductive structures 1000.

As illustrated in FIG. 1N, the topmost redistribution conductive patterns 1202 include a plurality of pads. In some embodiments, the aforementioned pads may include a plurality of under-ball metallurgy (UBM) patterns for ball mount. In some embodiments, a material of the redistribution conductive patterns 1204 includes aluminum, titanium, copper, nickel, tungsten, and/or alloys thereof. The redistribution conductive patterns 1204 may be formed by, for example, electroplating, deposition, and/or photolithography and etching. In some embodiments, a material of the inter-dielectric layers 1202 includes polyimide, epoxy resin, acrylic resin, phenol resin, BCB, PBO, or other suitable polymer-based dielectric materials. The inter-dielectric layers 1202 may be formed by suitable fabrication techniques such as spin-on coating, CVD, PECVD, or the like.

In some embodiments, the conductive terminals 1300 are placed on the topmost redistribution conductive patterns 1204 (the UBM patterns) of the redistribution structure 1200. In some embodiments, the conductive terminals 1300 include solder balls. In some embodiments, the conductive terminals 1300 may be placed on the UBM patterns through a ball placement process or other suitable processes.

Referring to FIG. 1N and FIG. 1O, the dielectric layer DI formed on the bottom surface of the encapsulant 1100 is de-bonded from the de-bonding layer DB such that the dielectric layer DI is separated from the carrier C3. In some embodiments, the de-bonding layer DB (e.g., the LTHC release layer) may be irradiated by an UV laser such that the de-bonding layer DB and the carrier C3 may be peeled off from the dielectric layer DI.

Subsequently, the structure is flipped upside down and the dielectric layer DI is patterned to form a plurality of openings. In some embodiments, the openings expose the conductive structures 1000. Thereafter, a plurality of conductive terminals 1400 are formed in the opening to render electrical connection with the conductive structures 1000. Subsequently, a singulation process is performed to render a plurality of package structures P1. In some embodiments, the singulation process typically involves dicing with a rotating blade or a laser beam. In other words, the singulation process is, for example, a laser cutting process, a mechanical cutting process, or other suitable processes. As mentioned above, the package structure P1 may be referred to as an "InFO package." In some embodiments, by introducing the chip 200 in the integrated circuit D1 and by utilizing the integrated circuit D1 in the package structure P1, the warpage and the redistribution layer (RDL) stress in the package structure P1 may be effectively reduced. Meanwhile, the electrical performance and the heat dissipation of the package structure P1 may be sufficiently enhanced.

In some embodiments, the package structure Pt may be further assembled with other package structures to form a package. For example, referring to FIG. 1P, a package structure P2 is stacked on the package structure Pt to form a package 10. In some embodiments, the package structure P2 is electrically connected to the package structure P1 through the conductive terminals 1400. In some embodiments, the package 10 may further include an underfill UF located between the package structure P1 and the package structure P2. In some embodiments, the underfill UF is able to protect the conductive terminals 1400 electrically connecting the package structures P1 and P2. In some embodiments, the package 10 may be referred to as a "package-on-package (PoP)."

Figure 2A:
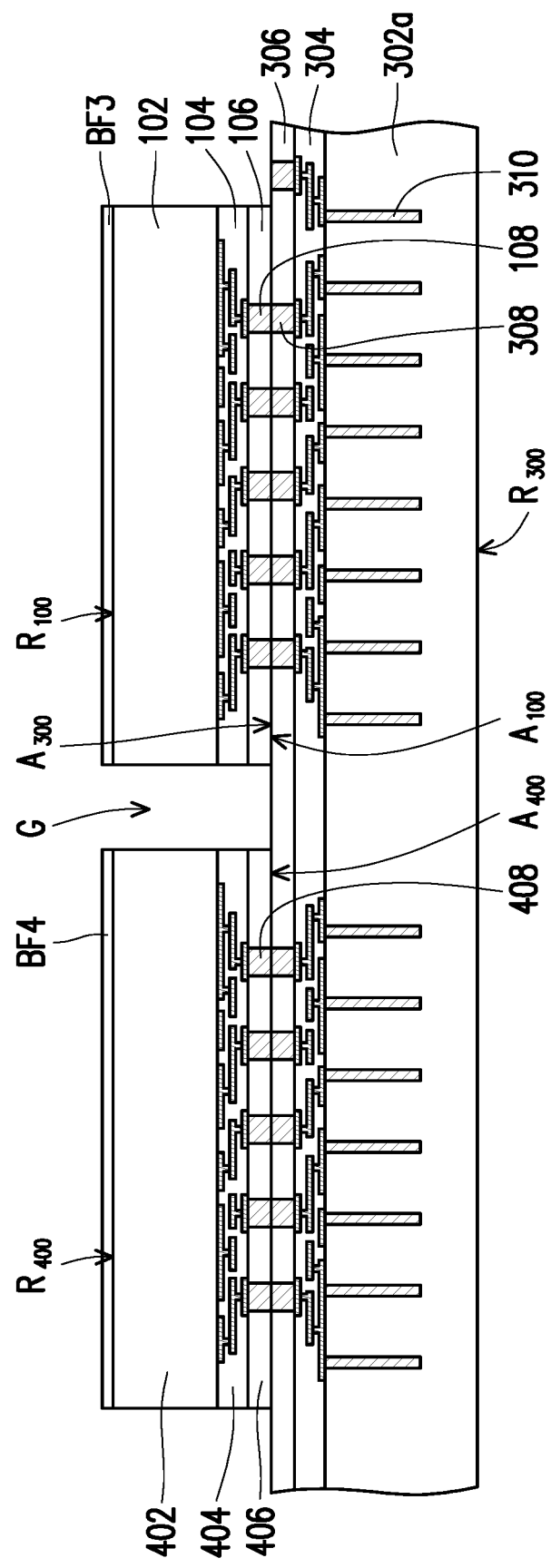

FIG. 2A to FIG. 2L are schematic cross-sectional views illustrating a manufacturing process of a package 20 in accordance with some alternative embodiments of the disclosure. Referring to FIG. 2A, a semiconductor wafer W3 is provided. The semiconductor wafer W3 in FIG. 2A is similar to the semiconductor wafer W3 in FIG. 1F, so similar components thereof are denoted by the same reference numeral and the detailed descriptions thereof are omitted herein. In some embodiments, the semiconductor wafer W3 has an active surface $A_{300}$ and a rear surface $R_{300}$ opposite to the active surface $A_{300}$.

As illustrated in FIG. 2A, a chip 100 and a chip 400 are picked-and-placed on the semiconductor wafer W3. The chip 100 and the chip 400 in FIG. 2A are respectively similar to the chip 100 and the chip 400 in FIG. 1F, so similar components thereof are denoted by the same reference numeral and the detailed descriptions thereof are omitted herein. In some embodiments, the chip 100 and the chip 400 are placed to have a gap G between the two. In some embodiments, from a top view, the sidewalls of the chip 400 are not aligned with the sidewalls of the chip 100. In some embodiments, the chip 100 has an active surface $A_{100}$ and a rear surface $R_{100}$ opposite to the active surface $A_{100}$. Similarly, the chip 400 has an active surface $A_{400}$ and a rear surface $R_{400}$ opposite to the active surface $A_{400}$. As illustrated in FIG. 2A, the chip 100 and the chip 400 are disposed on the semiconductor wafer W3 in a face-down manner. In some embodiments, the chip 100 and the chip 400 are hybrid bonded to the semiconductor wafer W3. For example, the chip 100 and the chip 400 are placed such that the active surface $A_{100}$ of the chip 100 and the active surface $A_{400}$ of the chip 400 are in direct contact with the active surfaces $A_{300}$ of the semiconductor wafer W3. The hybrid bonding process in FIG. 2A may be similar to the hybrid bonding process shown in FIG. 1F, so the detailed description thereof is omitted herein. In some embodiments, the dielectric layer 106 of the chip 100 and the dielectric layer 406 of the chip 400 are directly in contact with the dielectric layer 306 of the semiconductor wafer W3. Meanwhile, the conductors 108 of the chip 100 and the conductors 408 of the chip 400 are substantially aligned and in direct contact with the conductors 308 of the semiconductor wafer W3.

As illustrated in FIG. 2A, a bonding film BF3 is formed on the rear surface $R_{100}$ of the chip 100 and a bonding film BF4 is formed on the rear surface $R_{400}$ of the chip 400. The bonding film BF3 and the bonding film BF4 are similar to the bonding film BF2 in FIG. 1C, so the detailed descriptions thereof are omitted herein.

Figure 2B:
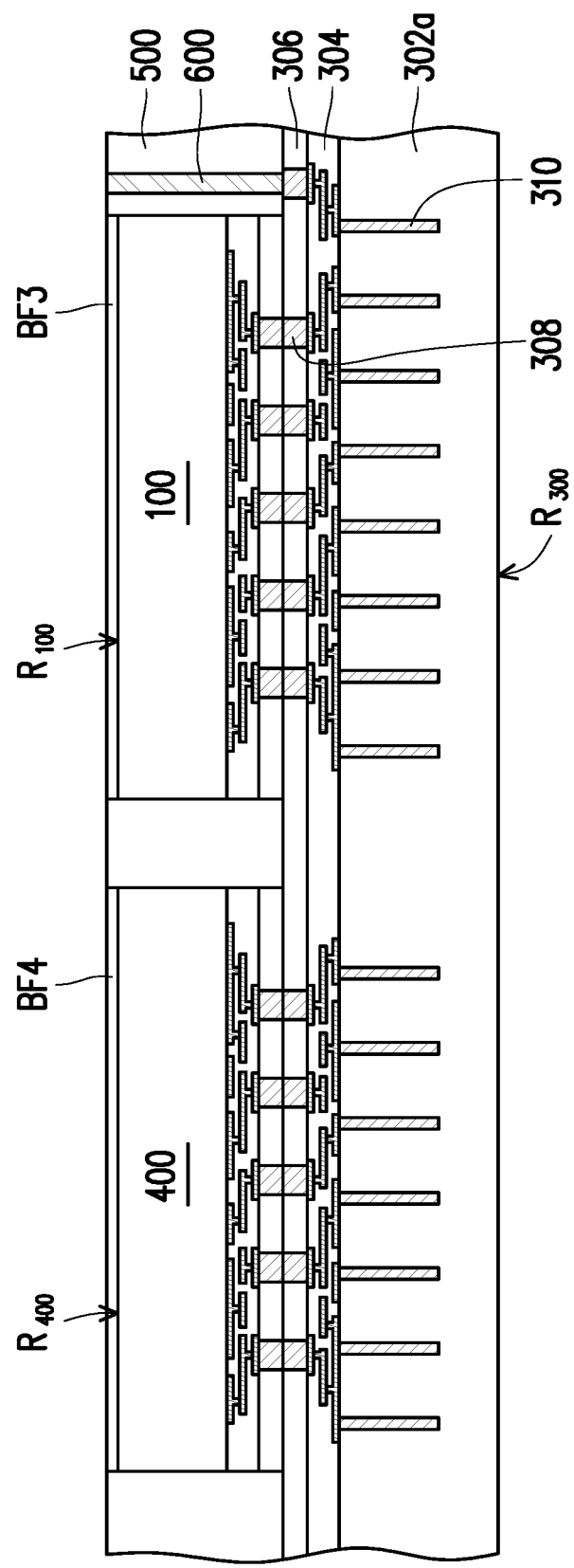

Referring to FIG. 2B, an insulating encapsulant 500 is formed to fill the gap G between the chip 100 and the chip 400. In some embodiments, a TIV 600 is optionally formed to penetrate through the insulating encapsulant 500. The insulating encapsulant 500 and the TIV 600 in FIG. 2B are respectively similar to the insulating encapsulant 500 and the TIV 600 in FIG. 1G, so the detailed descriptions thereof are omitted herein. In some embodiments, the insulating encapsulant 500 laterally encapsulates the chips 100, 400 and the bonding films BF3, BF4.

Figure 2C:
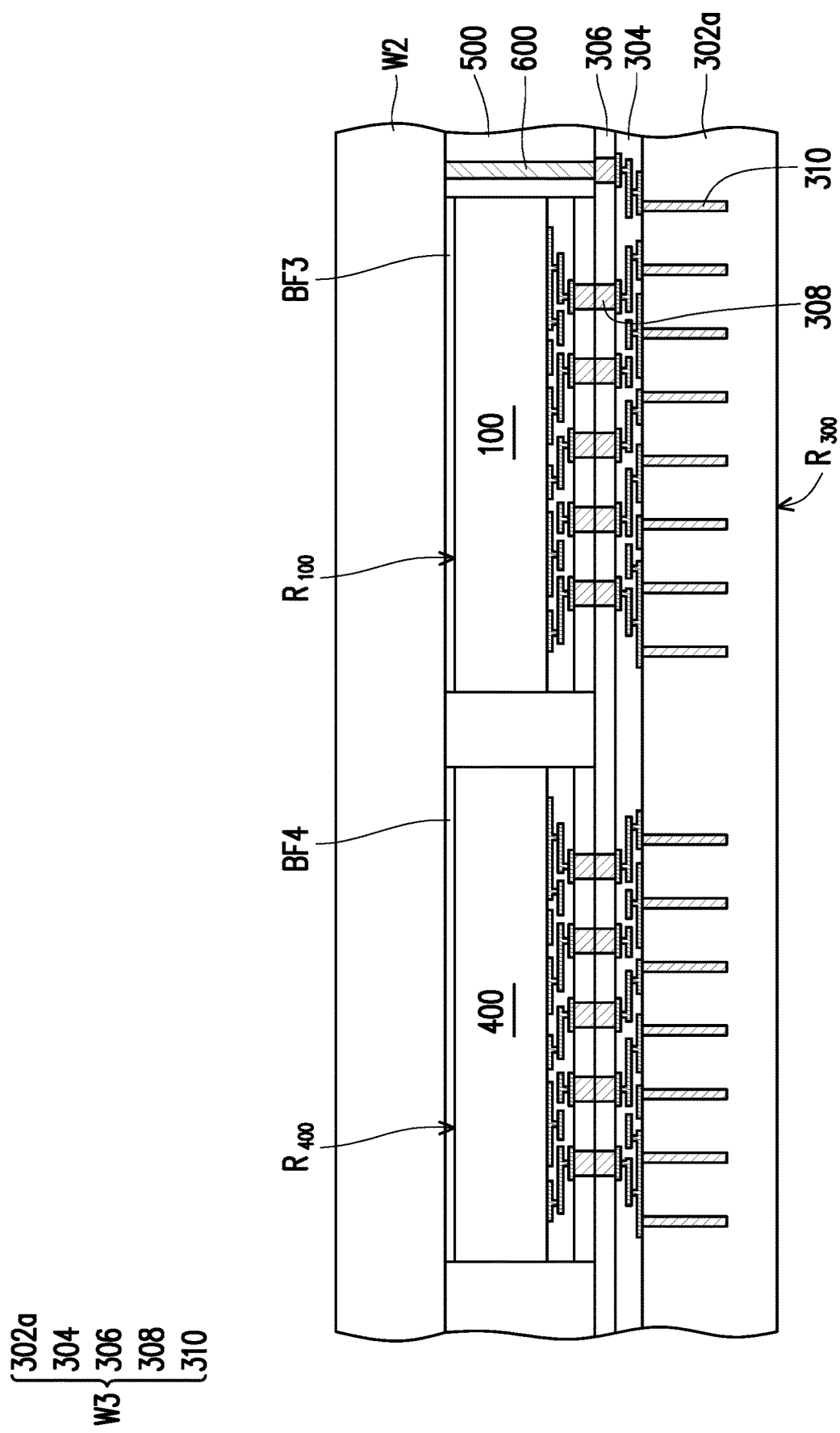

Referring to FIG. 2C, a semiconductor wafer W2 is formed over the chip 100, the chip 400, and the insulating encapsulant 500. In some embodiments, the semiconductor W2 in FIG. 2C is similar to the semiconductor wafer W2 in FIG. 1C, so the detailed description thereof is omitted herein. In some embodiments, the semiconductor wafer W2 may optionally include a plurality of TSVs (not shown) embedded therein. In some embodiments, the semiconductor wafer W2 is bonded to both of the chip 100 and the chip 400. For example, the semiconductor wafer W2 is bonded to the chip 100 through the bonding film BF3 and is bonded to the chip 400 through the bonding film BF4. In some embodiments, the bonding between the semiconductor wafer W2 and the chips 100, 400 may be realized through fusion bonding and are taken place simultaneously. The fusion bonding process in FIG. 2C may be similar to the fusion bonding process shown in FIG. 1D, so the detailed description thereof is omitted herein. In some embodiments, after the semiconductor wafer W2 is bonded to the chip 100 and the chip 400, the semiconductor wafer W2 may be thinned.

Figure 2D:
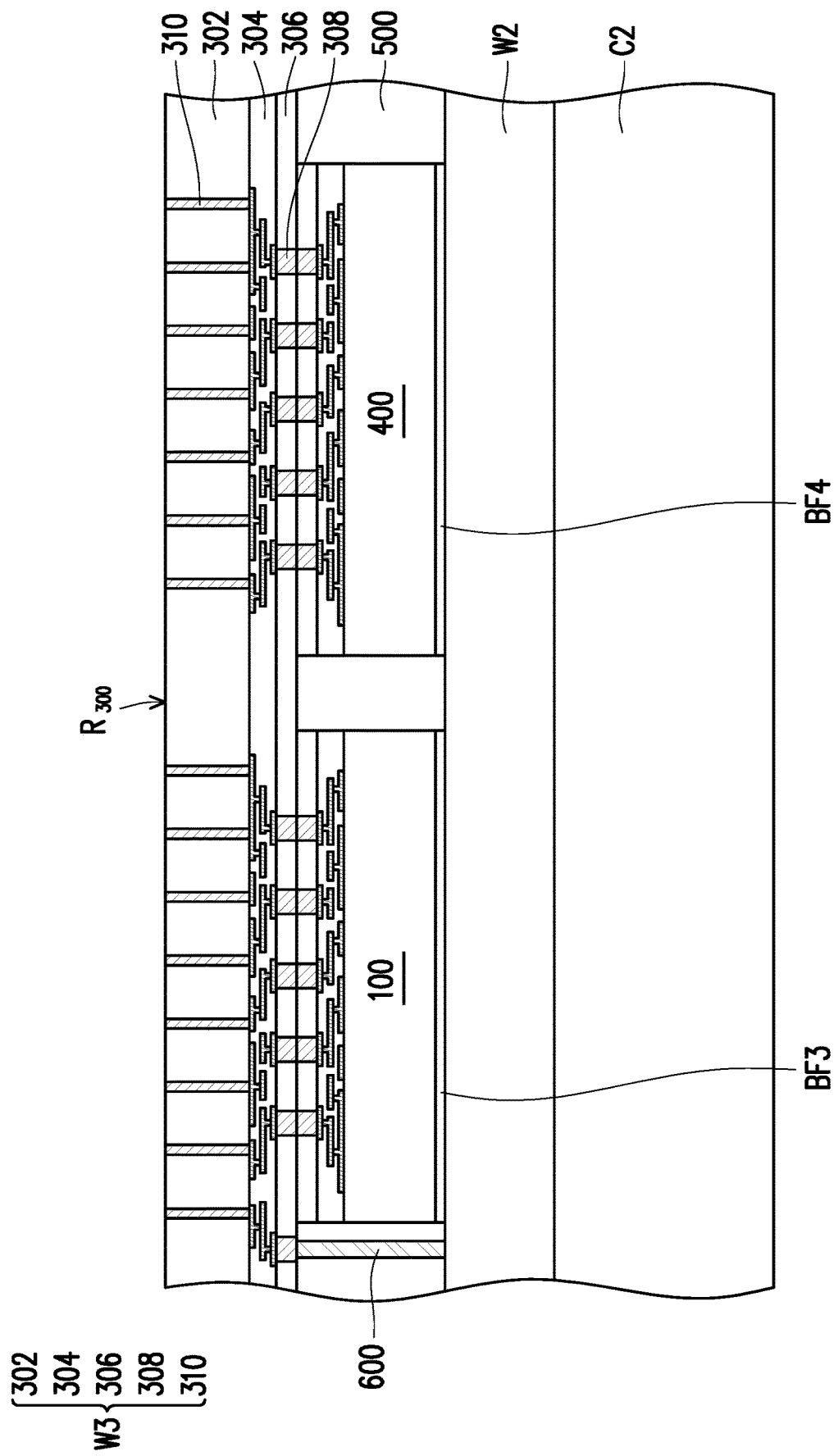

Referring to FIG. 2D, the structure illustrated in FIG. 2C is flipped upside down and is attached to a carrier C2. The carrier C2 in FIG. 2D is similar to the carrier C2 in FIG. 1H, so the detailed descriptions thereof is omitted herein. Thereafter, a planarization process is performed on the rear surface $R_{300}$ of the semiconductor wafer W3. In some embodiments, the planarization process includes a mechanical grinding process and/or a CMP process. In some embodiments, the semiconductor substrate 302a of the semiconductor wafer W3 is grinded until the TSVs 310 are revealed, so as to form a semiconductor substrate 302. For example, after the planarization process, the TSVs 310 penetrate through the semiconductor substrate 302. The TSVs 310 allow electrical communication between the front side and the back side of the semiconductor wafer W3. In some embodiments, after the TSVs 310 are revealed, the semiconductor wafer W3 may be further grinded to reduce the overall thickness of the semiconductor wafer W3.

Figure 2E:
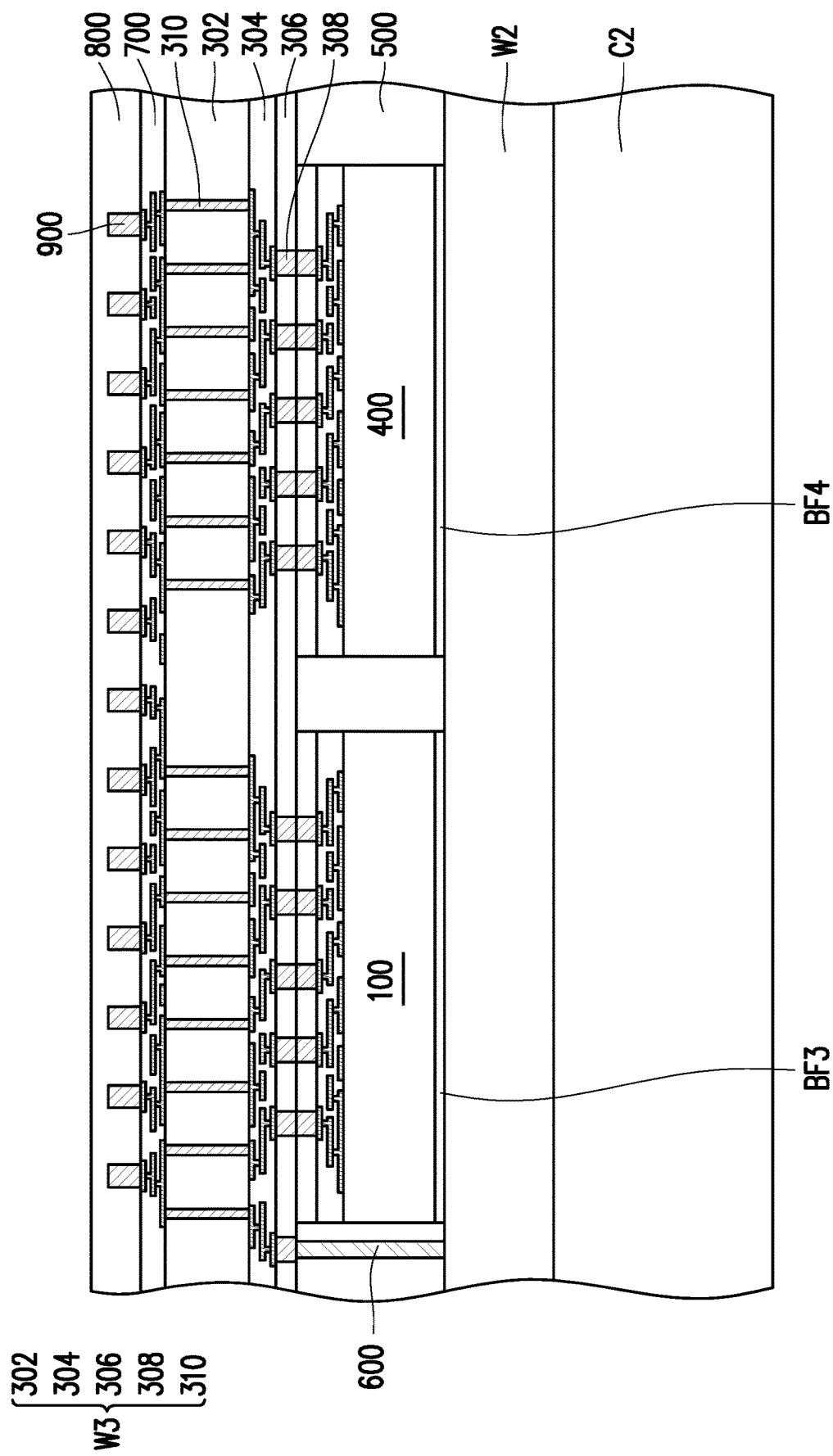
Figure 2G:
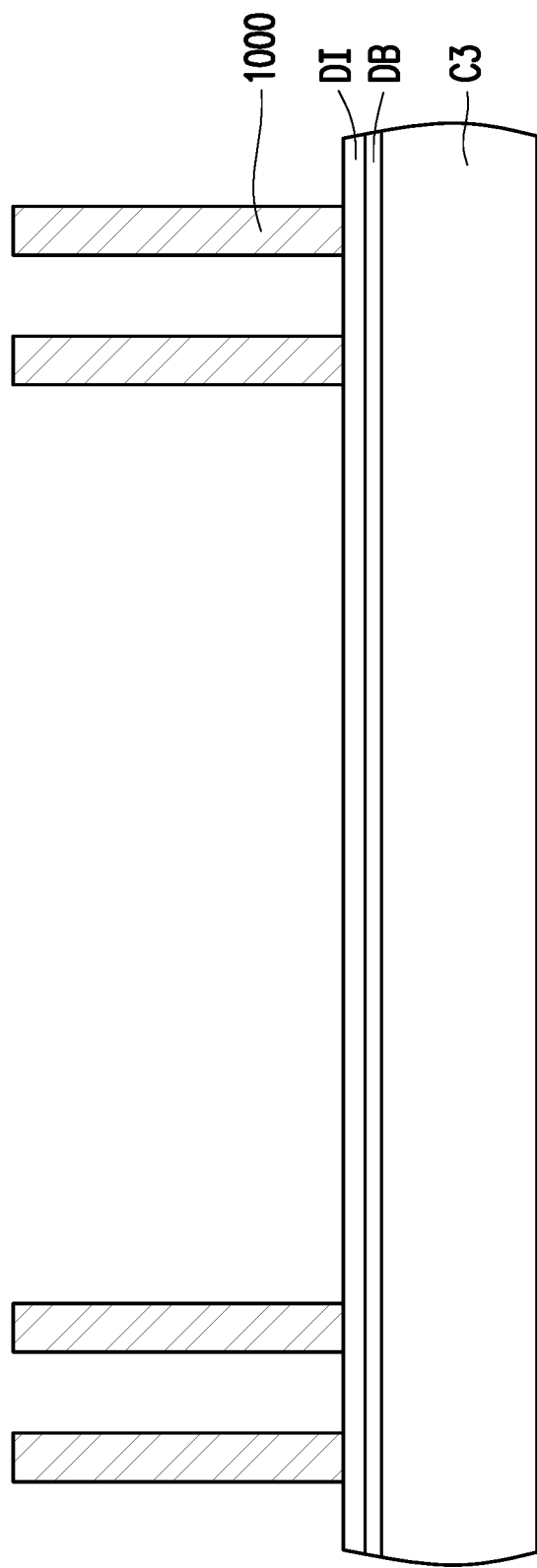
Figure 2H:
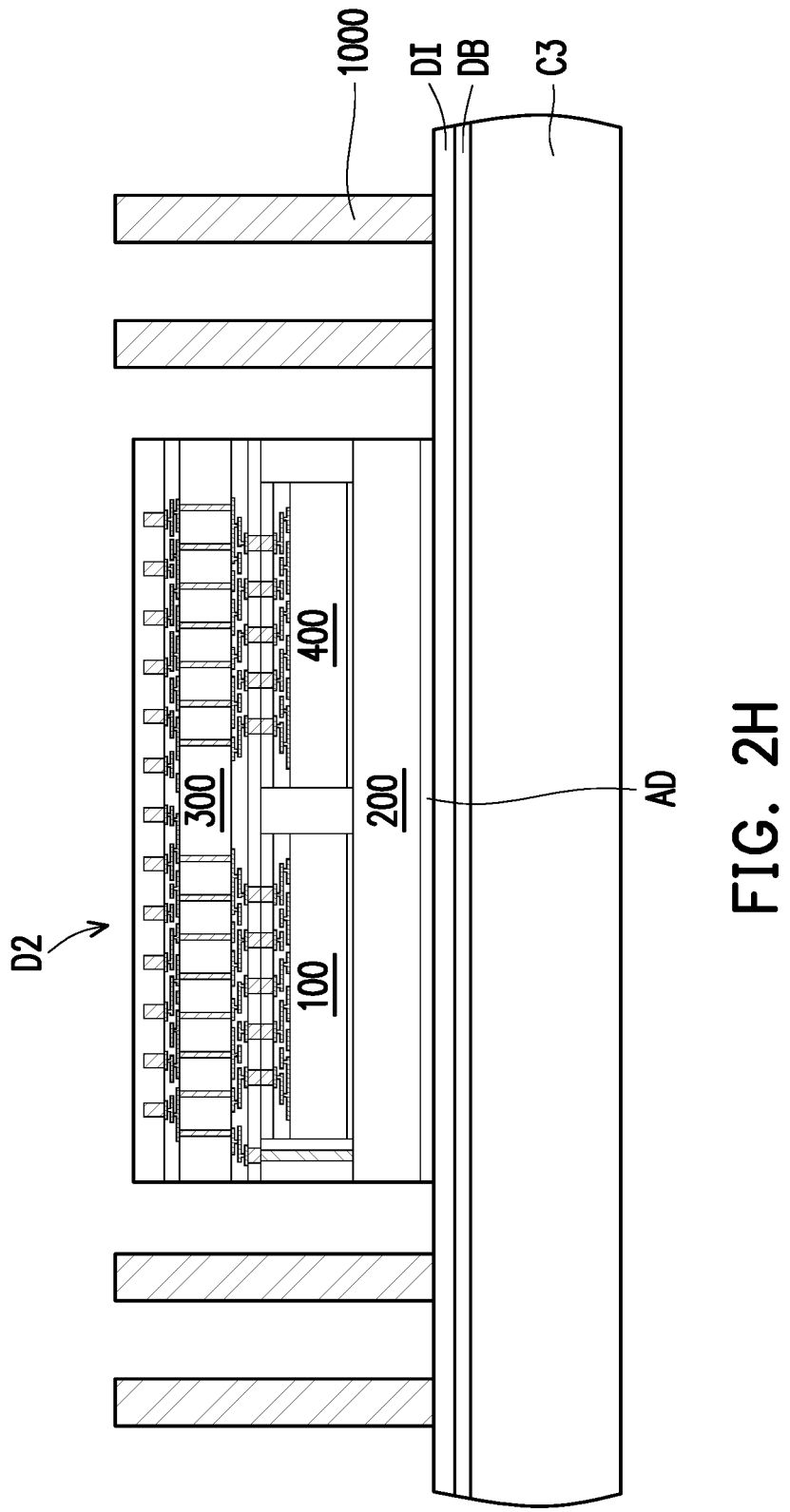
Figure 21:
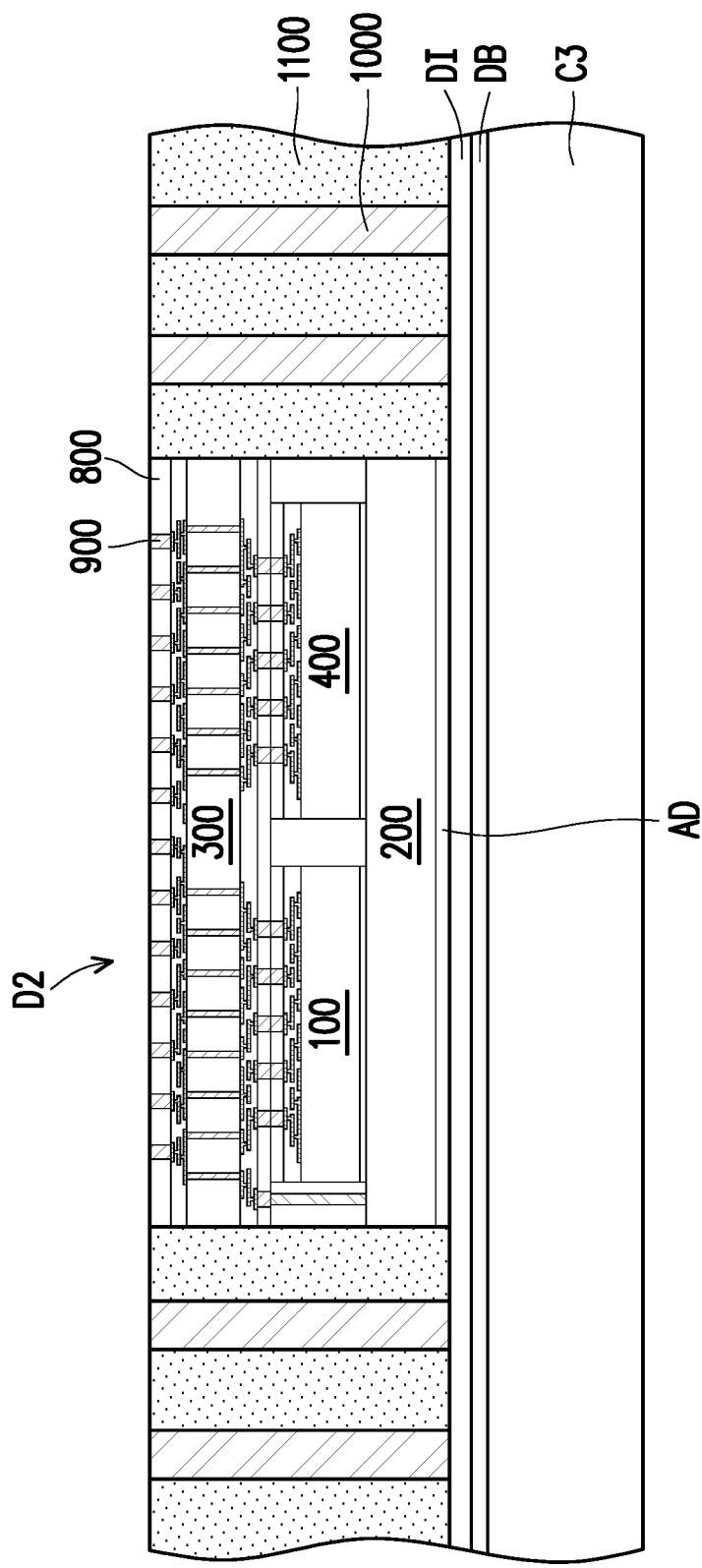
Figure 2J:
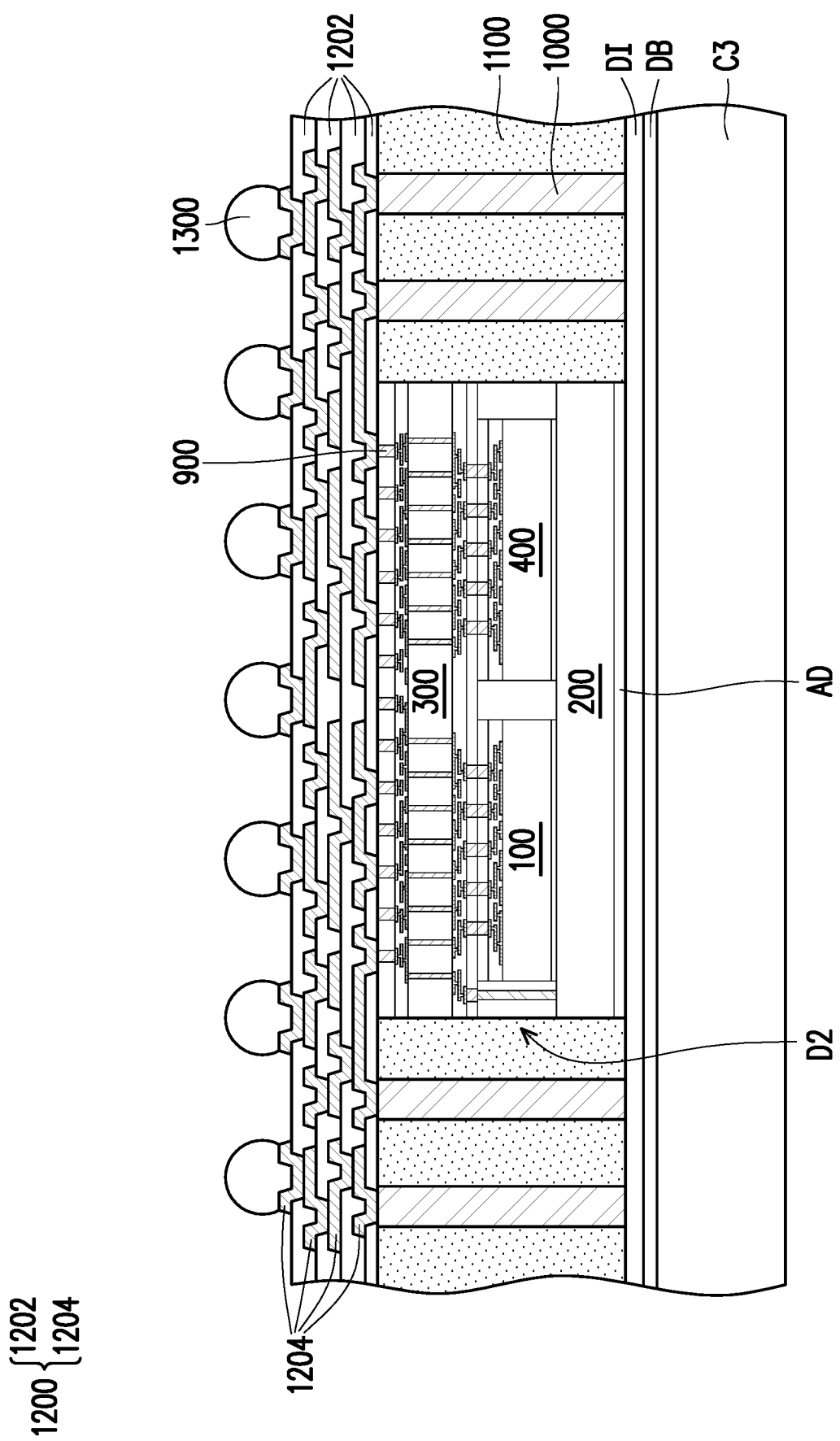

Referring to FIG. 2E, an interconnection structure 700, a passivation layer 800, and a plurality of conductive vias 900 are formed on the rear surface $R_{300}$ of the semiconductor wafer W3. The interconnection structure 700, the passivation layer 800, and the conductive vias 900 in FIG. 2E are respectively similar to the interconnection structure 700, the passivation layer 800, and the conductive vias 900 in FIG. 1I, so the detailed descriptions thereof are omitted herein.

Referring to FIG. 2E and FIG. 2F, the carrier C2 is removed and a singulation process is performed on the structure illustrated in FIG. 2E to obtain a plurality of integrated circuits D2. The singulation process in FIG. 2F is similar to the singulation process in FIG. 1J, so the detailed description thereof is omitted herein. In some embodiments, the singulation process divides the semiconductor wafer W2 into a plurality of chips 200 and divides the semiconductor wafer W3 into a plurality of chips 300. The chip 200 and the chip 300 in FIG. 2F are respectively similar to the chip 200 and the chip 300 in FIG. 1J, so similar components thereof are denoted by the same reference numeral and the detailed descriptions thereof are omitted herein. In some embodiments, the chip 200 is stacked on and fusion bonded to both of the chip 100 and the chip 400. As illustrated in FIG. 2F, a thickness $H_{100}$ of the chip 100 is substantially equal to a thickness $H_{400}$ of the chip 400. For example, the thickness $H_{100}$ of the chip 100 and the thickness $H_{400}$ of the chip 400 may range from about 20 μm to about 60 μm. On the other hand, a thickness $H_{200}$ of the chip 200 ranges between about 50 μm and about 90 μm while a thickness $H_{300}$ of the chip 300 ranges between about 10 μm and about 60 μm. Since the chip 200 has a substantially uniform thickness $H_{200}$ and the thicknesses $H_{100}$, $H_{400}$ of the chips 100, 400 are substantially equal, a sum of the thickness $H_{100}$ of the chip 100 and the thickness $H_{200}$ of the chip 200 is substantially equal to a sum of the thickness $H_{400}$ of the chip 400 and the thickness $H_{200}$ of the chip 200.

In some embodiments, since multiple chips (chips 100, 200, 300, and 400) are integrated into a single integrated circuit D2, the integrated circuit D2 may be referred to as a "SOIC." As illustrated in FIG. 2F, the chip 100 and the chip 400 are disposed side by side on the chip 300. Meanwhile, the chip 100 and the chip 400 are also disposed side by side on the chip 200. For example, the chip 100 and the chip 400 are sandwiched between the chip 200 and the chip 300. The chip 100 and the chip 400 are hybrid bonded to the chip 300. On the other hand, the chip 100 and the chip 400 are fusion bonded to the chip 200. In some embodiments, the chip 200 may be made of the same material as the chips 100, 300, and 400. As such, mismatch of the CTE between different components of the integrated circuit D2 or the subsequently formed package may be reduced. As a result, the warpage derived from the manufacturing process of the integrated circuit D2 or the subsequently formed package may be minimized, thereby increasing the yield rate. Moreover, in some embodiments, the chip 200 may also serve as a heat dissipation mechanism to increase the heat dissipation rate during operation of the subsequently formed package. In some embodiments, the integrated circuit D2 further includes the insulating encapsulant 500, the TSV 600, the interconnection structure 700, the passivation layer 800, and the conductive vias 900. The insulating encapsulant 500 laterally encapsulates the chips 100 and 400. The TSV 600 penetrates through the encapsulant 500 and is electrically connected to the chip 300. The interconnection structure 700, the passivation layer 800, and the conductive vias 900 are disposed on the chip 300 opposite to the chips 100 and 400. In some embodiments, the integrated circuit D2 may be utilized in various applications. For example, the integrated circuit D2 may be used as a die in an InFO package. The manufacturing process of the InFO package will be described below.

Figure 2K:
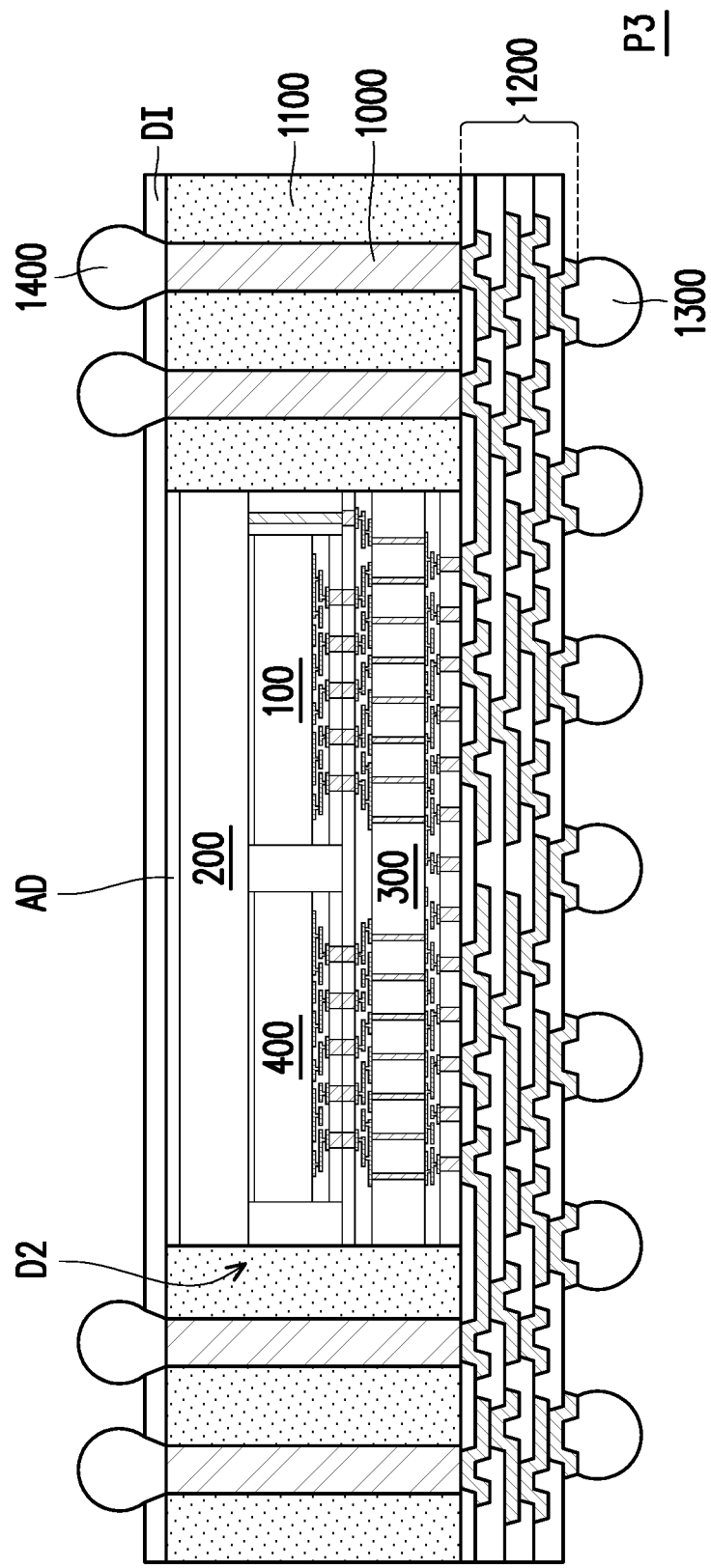
Figure 2L:
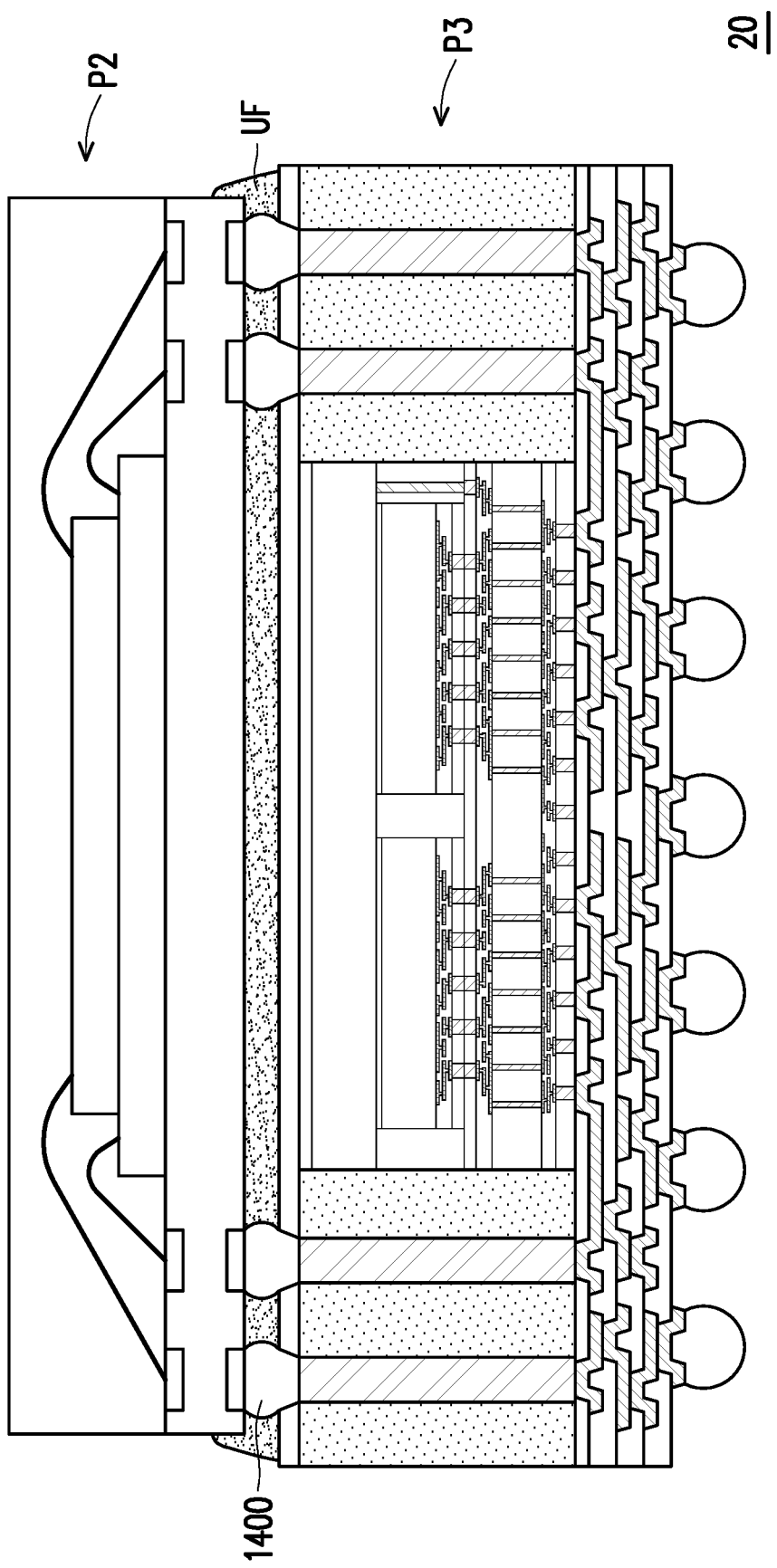

Referring to FIG. 2G to FIG. 2K, the steps in FIG. 2G to FIG. 2K are similar to the steps shown in FIG. 1K to FIG. 1O except the integrated circuit D1 in FIG. 1K to FIG. 1O has been replaced with the integrated circuit D2 in FIG. 2F, so the detailed descriptions thereof are omitted herein. Referring to FIG. 2K, a plurality of package structures P3 is obtained. As mentioned above, the package structure P3 may be referred to as an "InFO package." As illustrated in FIG. 2K, the encapsulant 1100 is in direct contact with sidewalls of the chip 200 and the chip 300 to laterally encapsulate the chip 200 and the chip 300. In some embodiments, by introducing the chip 200 in the integrated circuit D2 and by utilizing the integrated circuit D2 in the package structure P3, the warpage and the RDL stress in the package structure P3 may be effectively reduced. Meanwhile, the electrical performance and the heat dissipation of the package structure P3 may be sufficiently enhanced.

In some embodiments, the package structure P3 may be further assembled with other package structures to form a package. For example, referring to FIG. 2L, a package structure P2 is stacked on the package structure P3 to form a package 20. In some embodiments, the package structure P3 is electrically connected to the package structure P2 through the conductive terminals 1400. In some embodiments, the package 20 may further include an underfill UF located between the package structure P3 and the package structure P2. In some embodiments, the underfill UF is able to protect the conductive terminals 1400 electrically connecting the package structures P3 and P2. In some embodiments, the package 20 may be referred to as a "PoP."

Figure 3A:
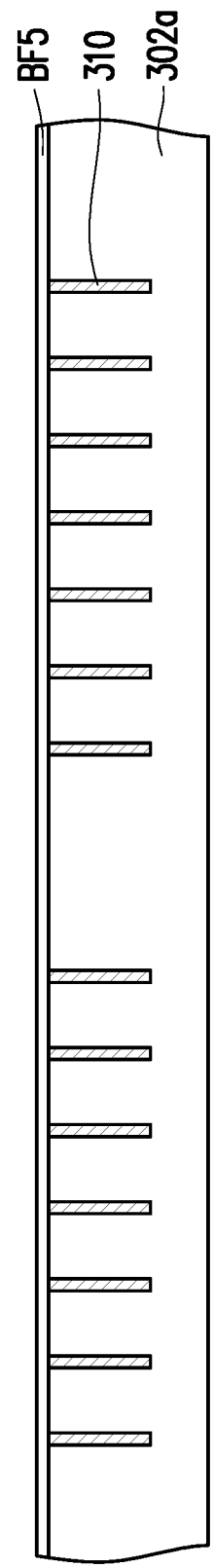
FIG. 3A to FIG. 3Q are schematic cross-sectional views illustrating a manufacturing process of a package in accordance with some alternative embodiments of the disclosure.
Figure 3B:
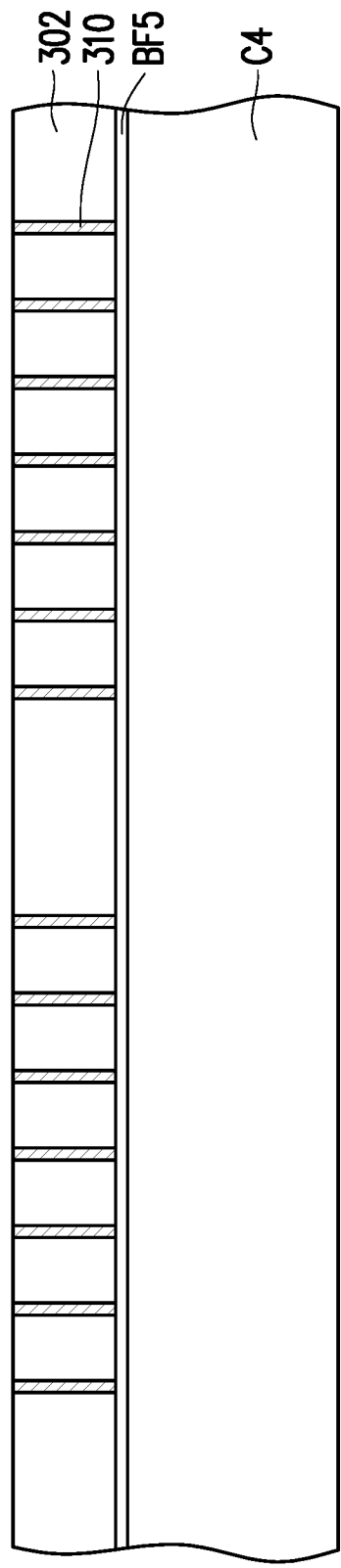
Figure 3C:
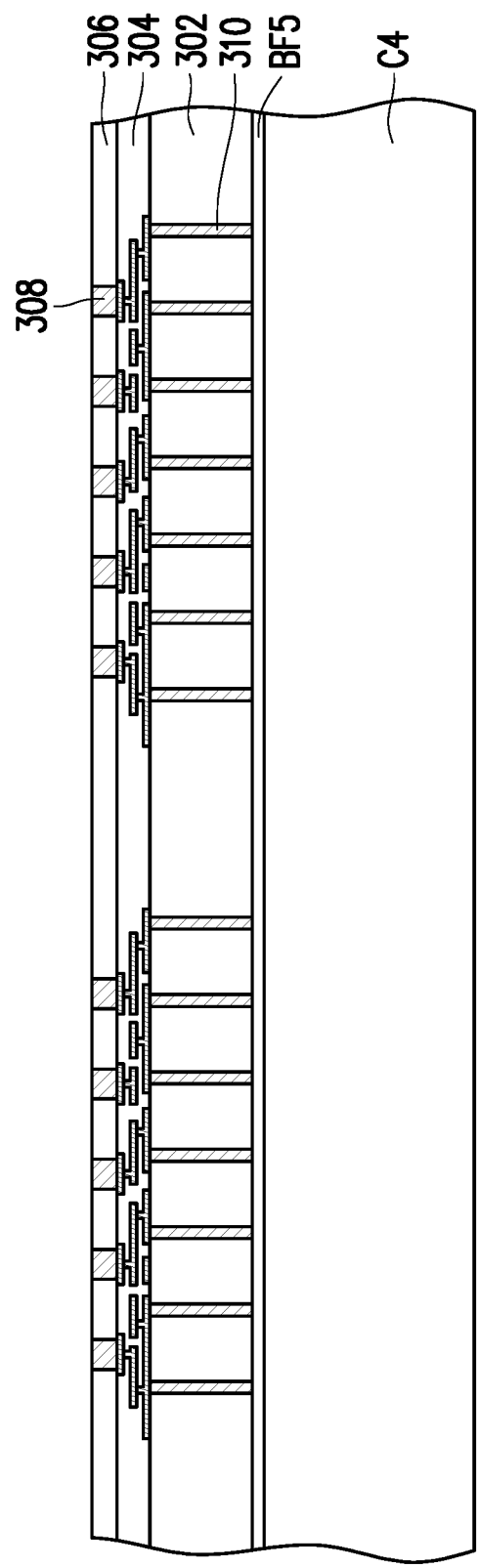
Figure 3D:
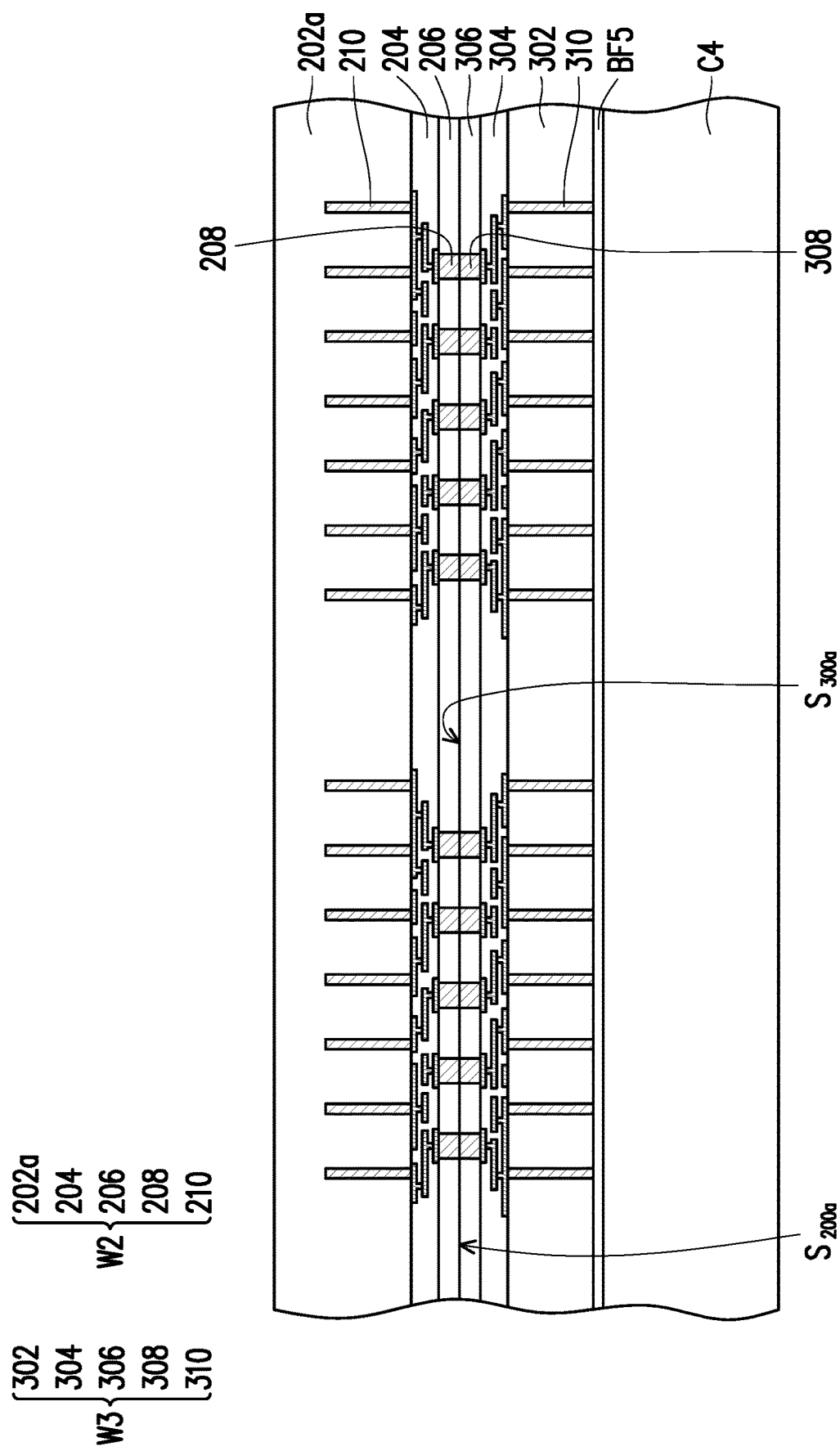
Figure 3E:
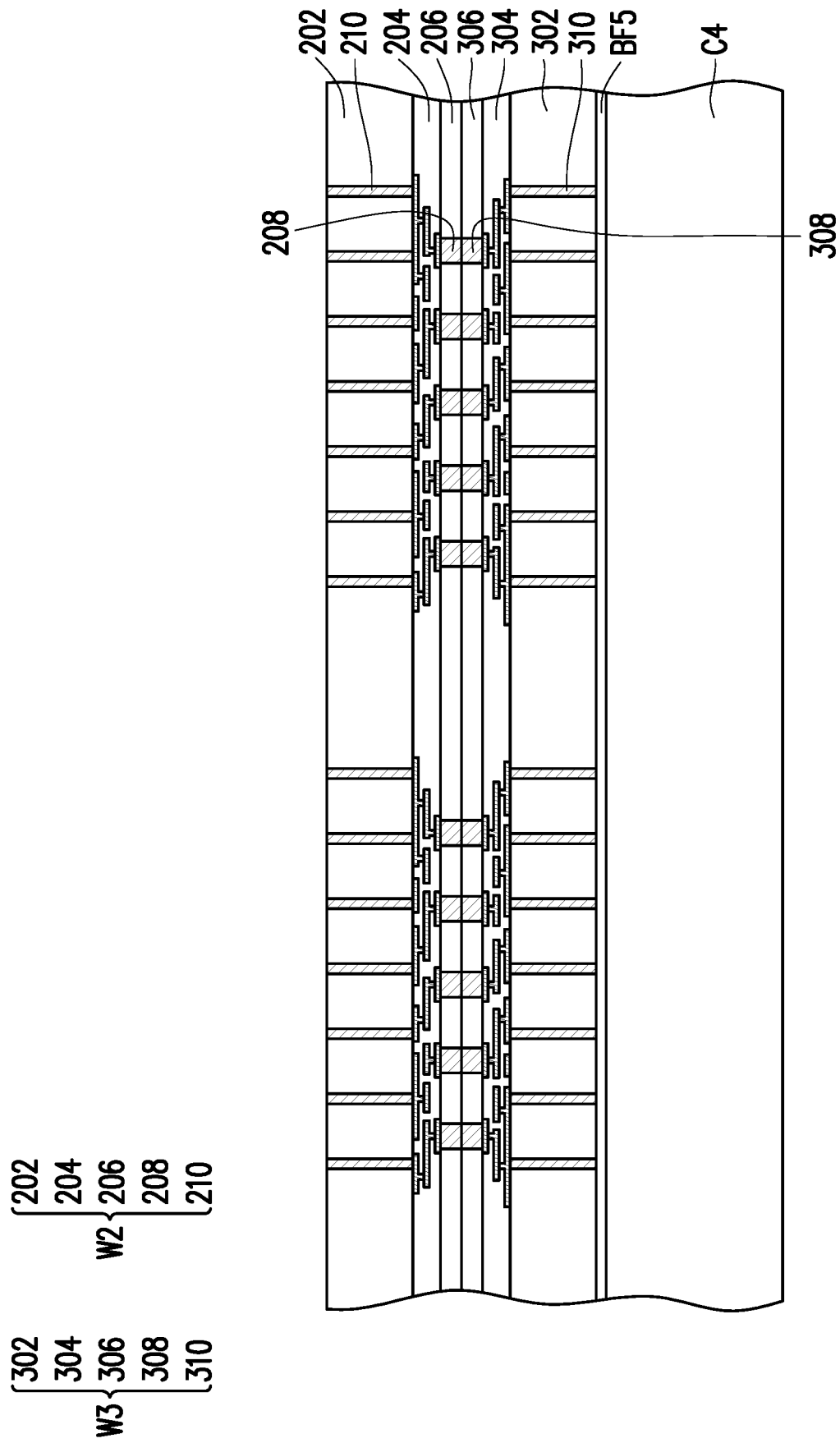
Figure 3F:
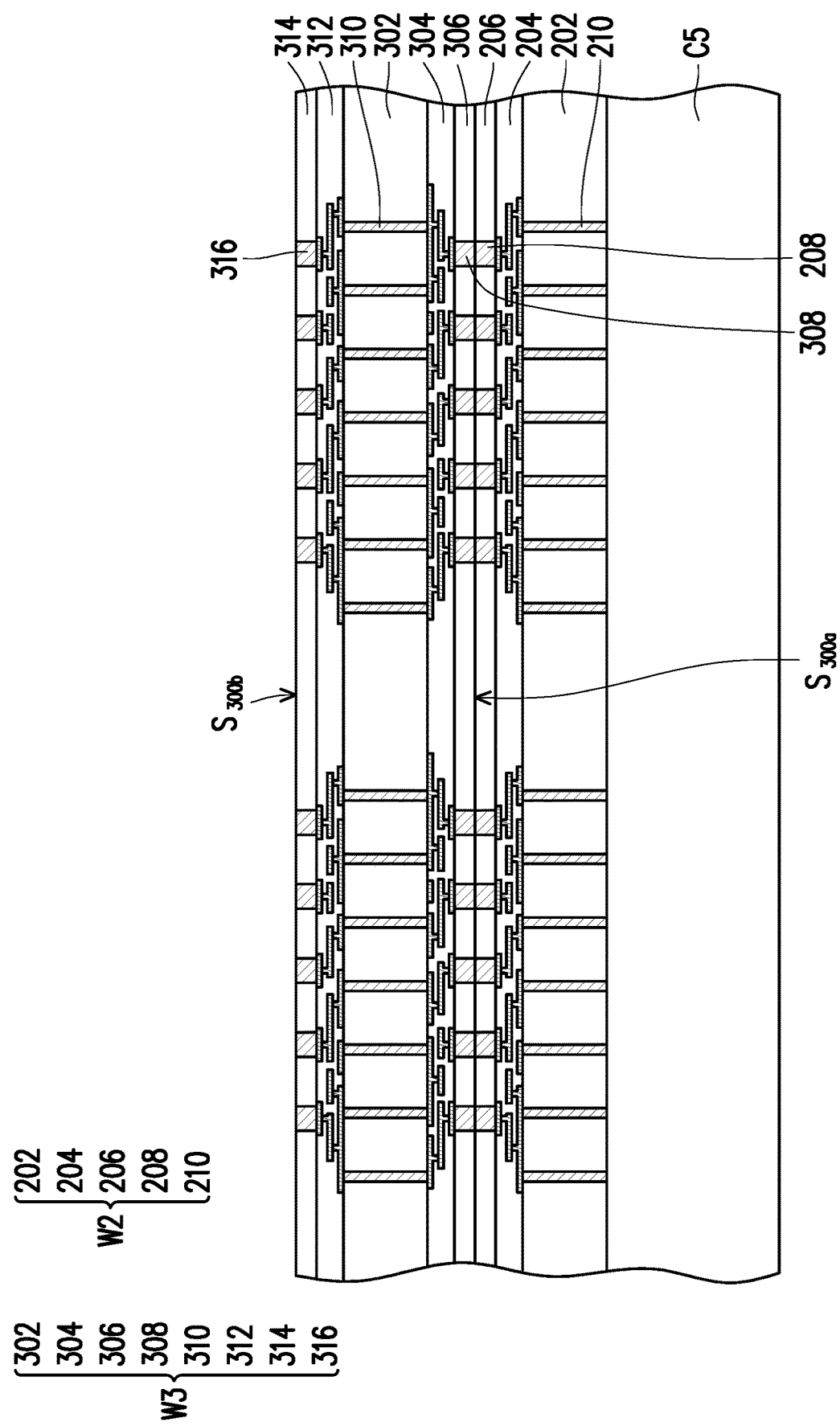
Figure 3G:
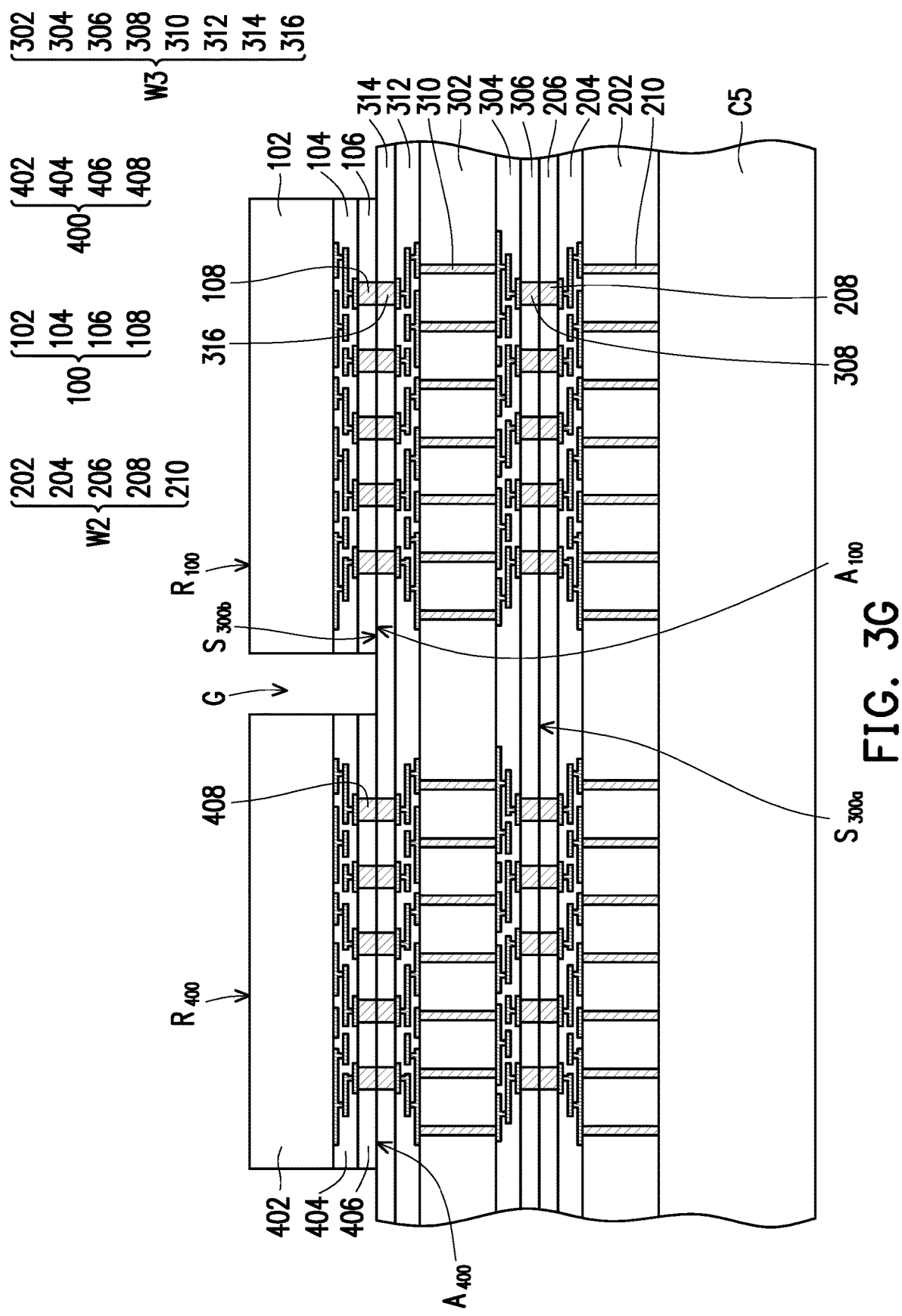
Figure 3H:
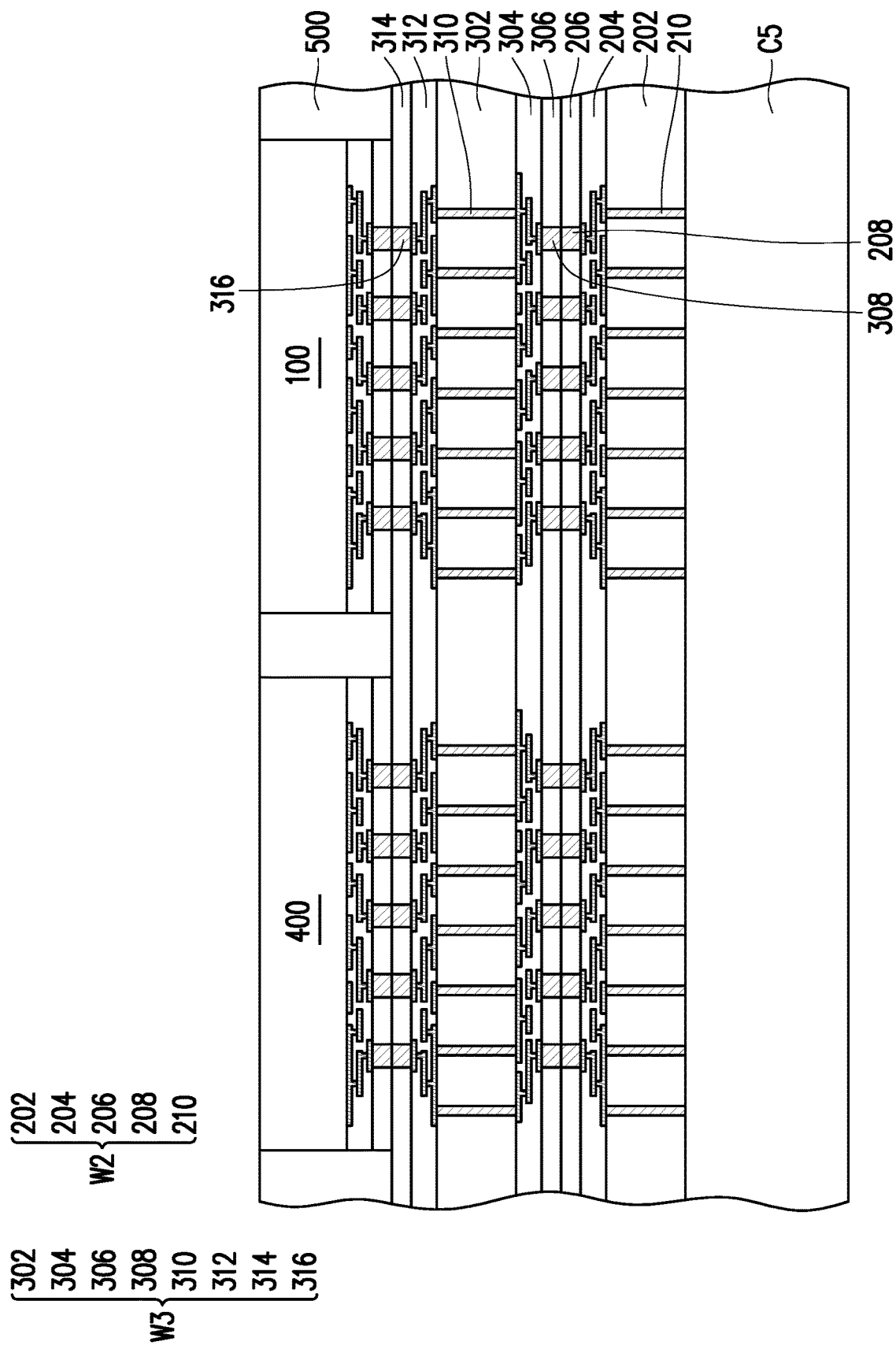
Figure 3I:
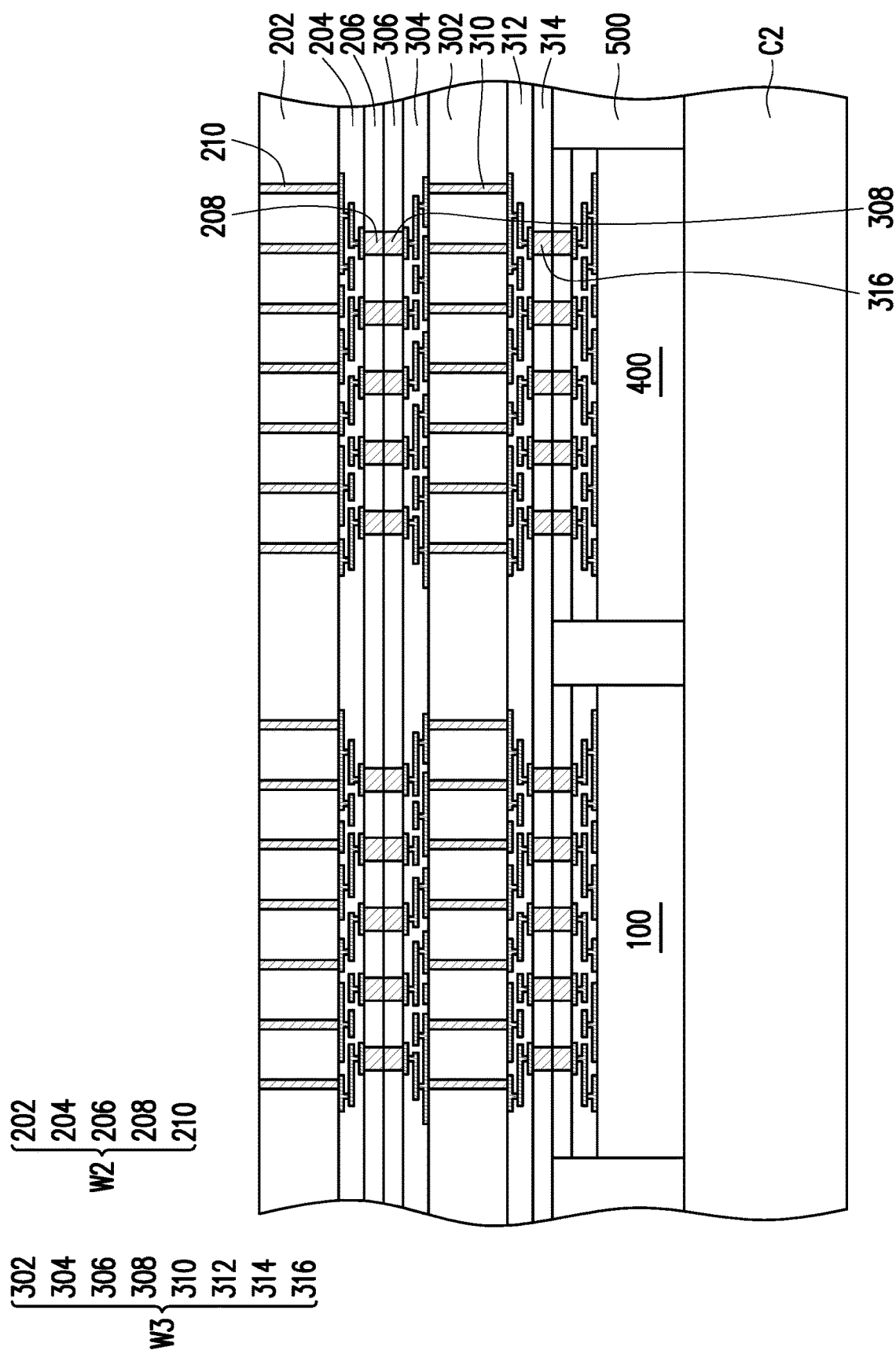
Figure 3J:
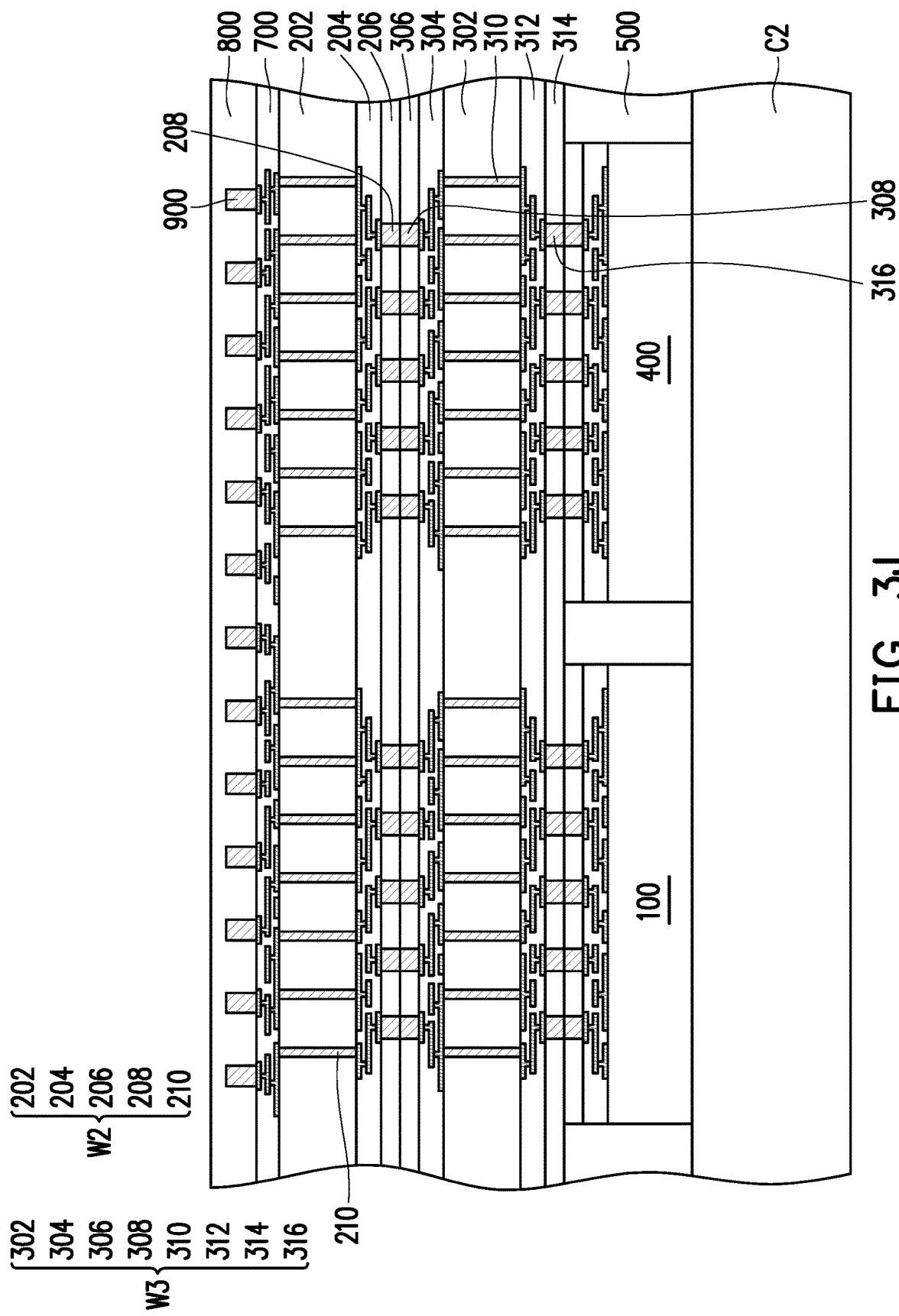
Figure 3K:
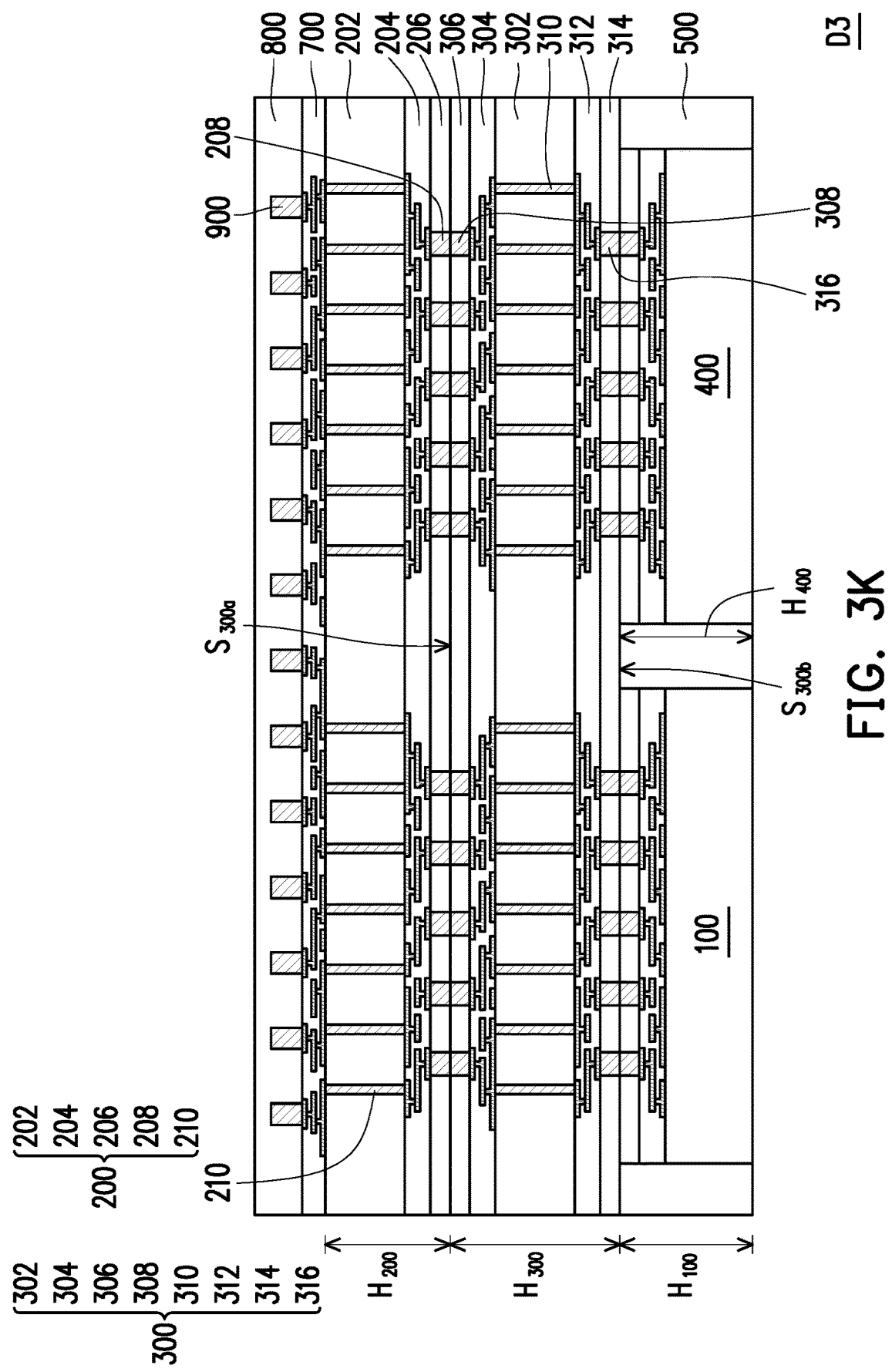
Figure 3L:
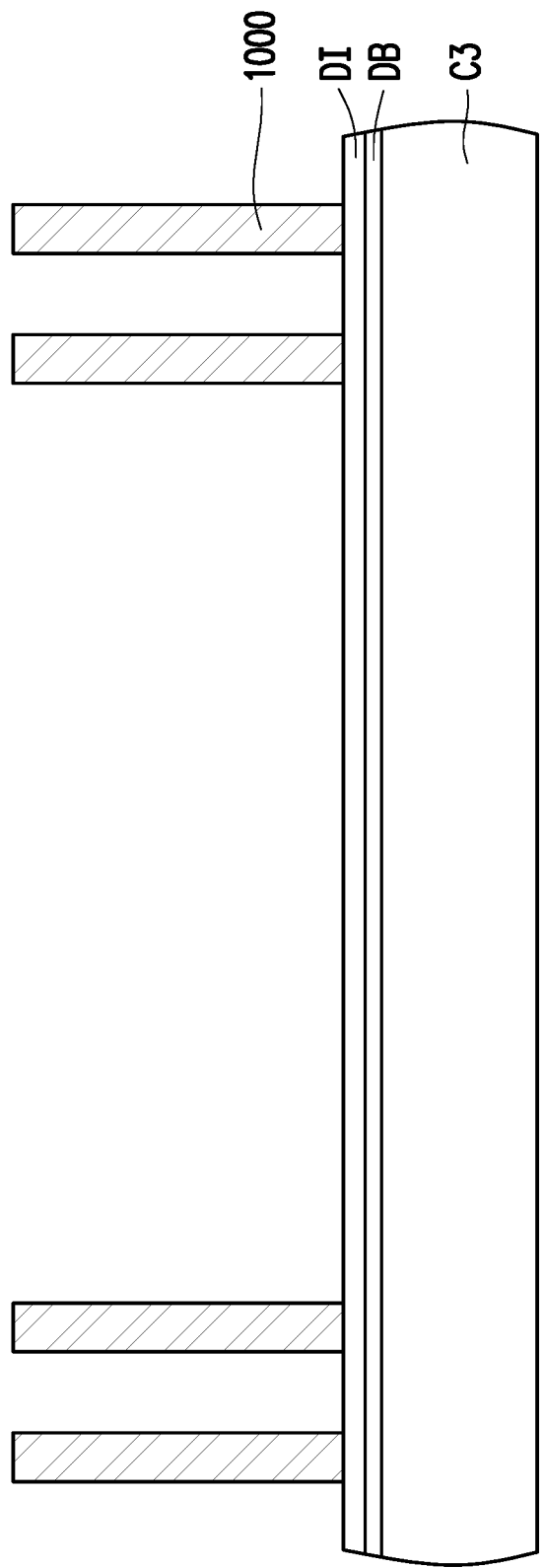
Figure 3M:
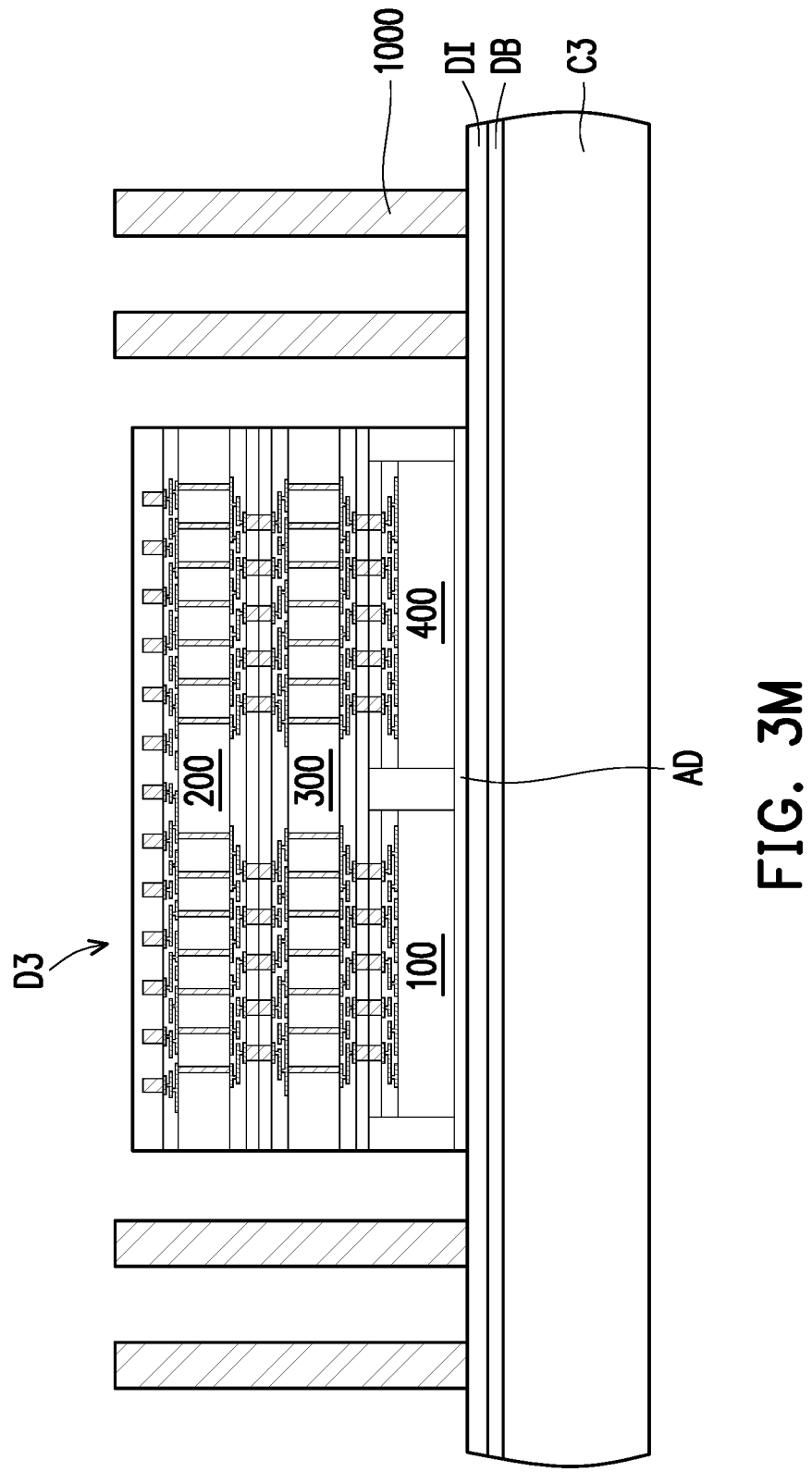
Figure 3N:
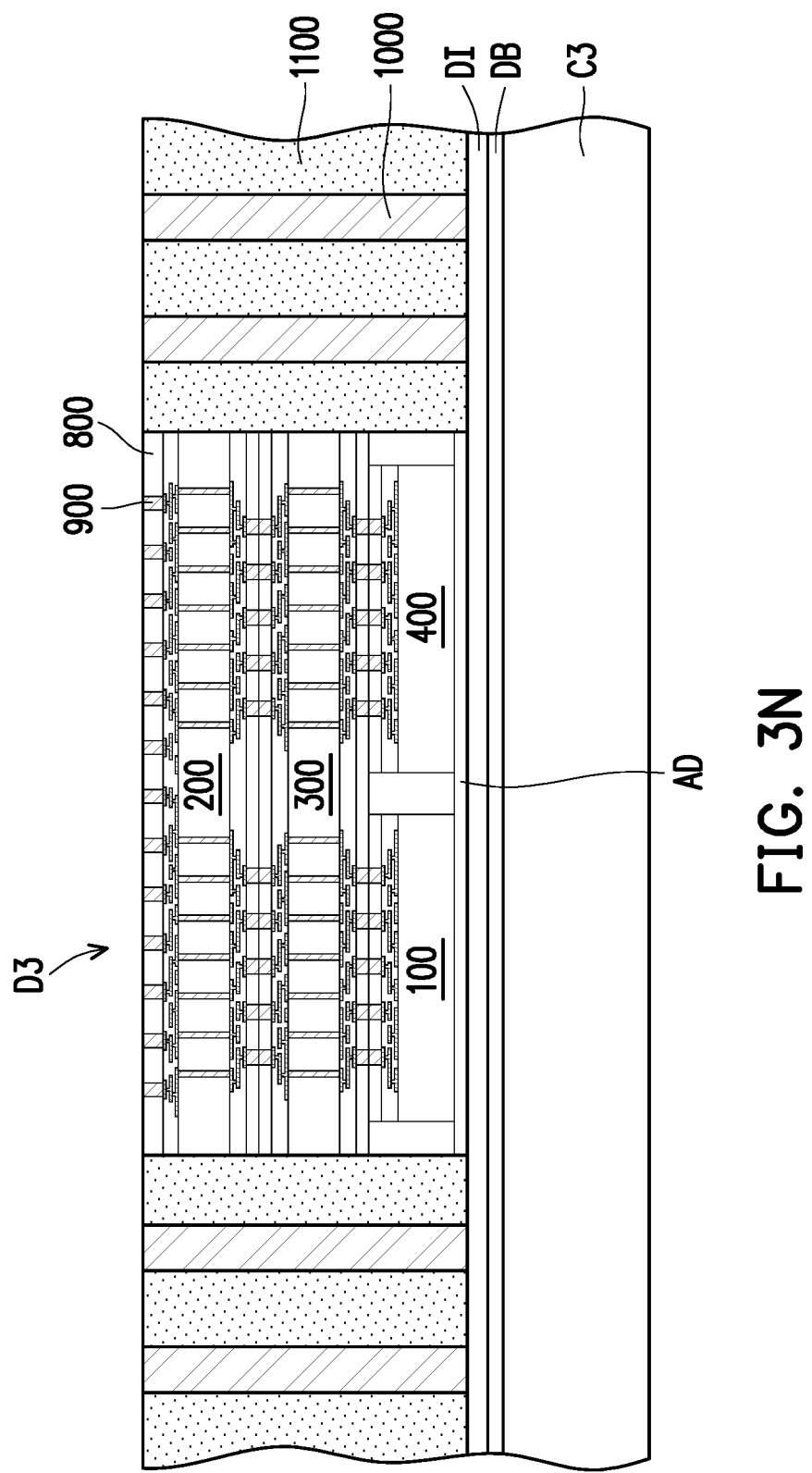
Figure 30:
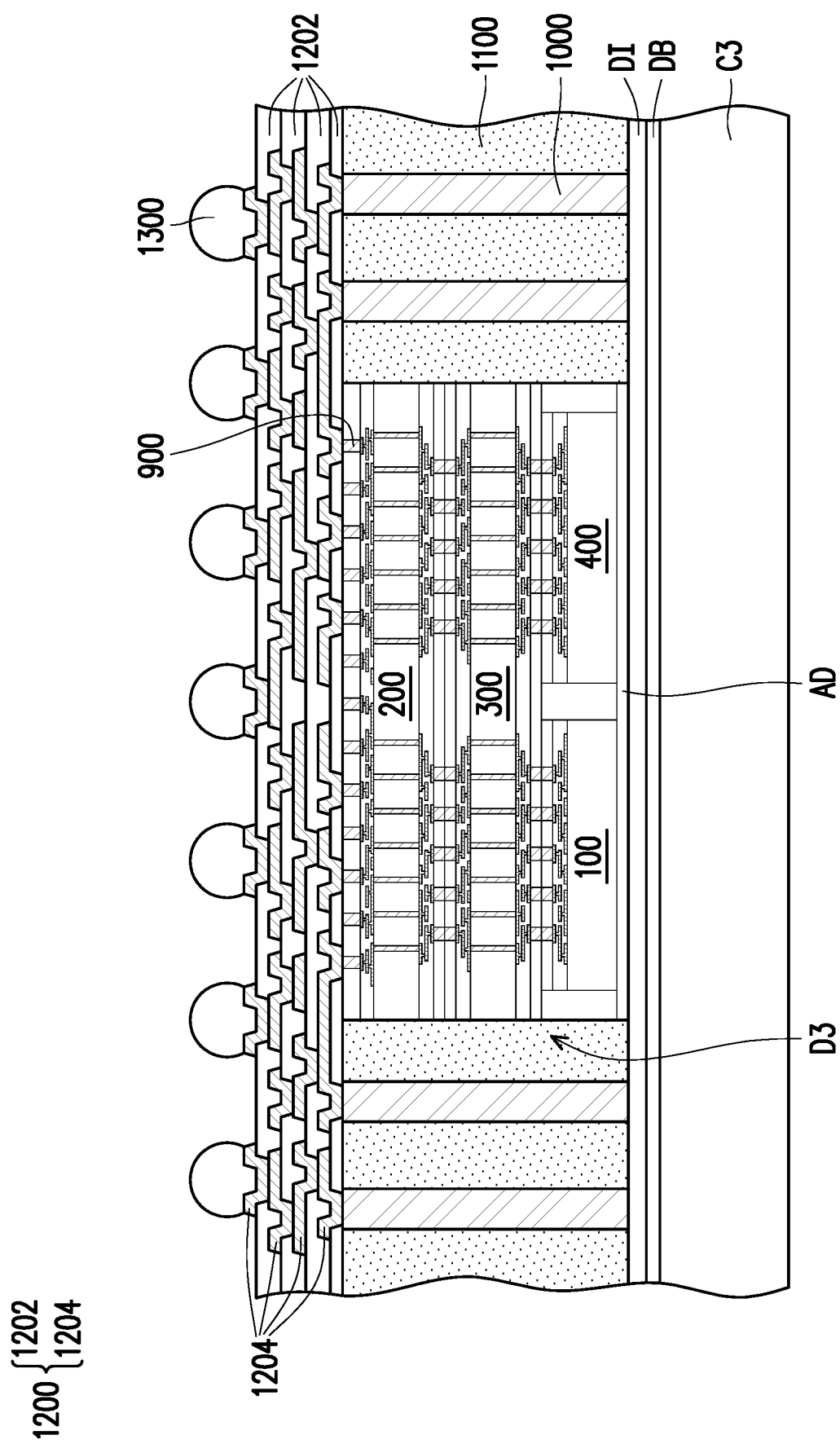
Figure 3P:
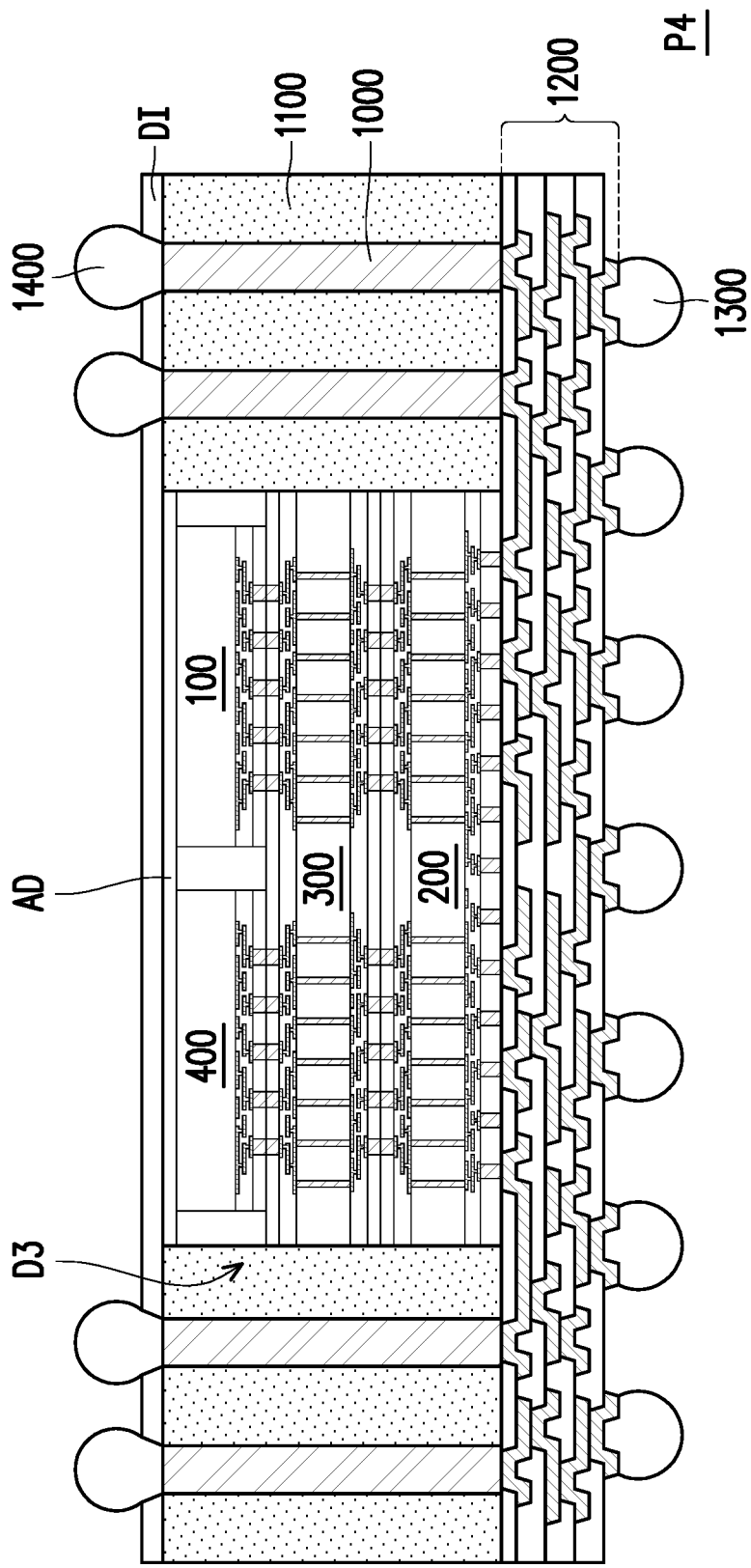
Figure 3Q:
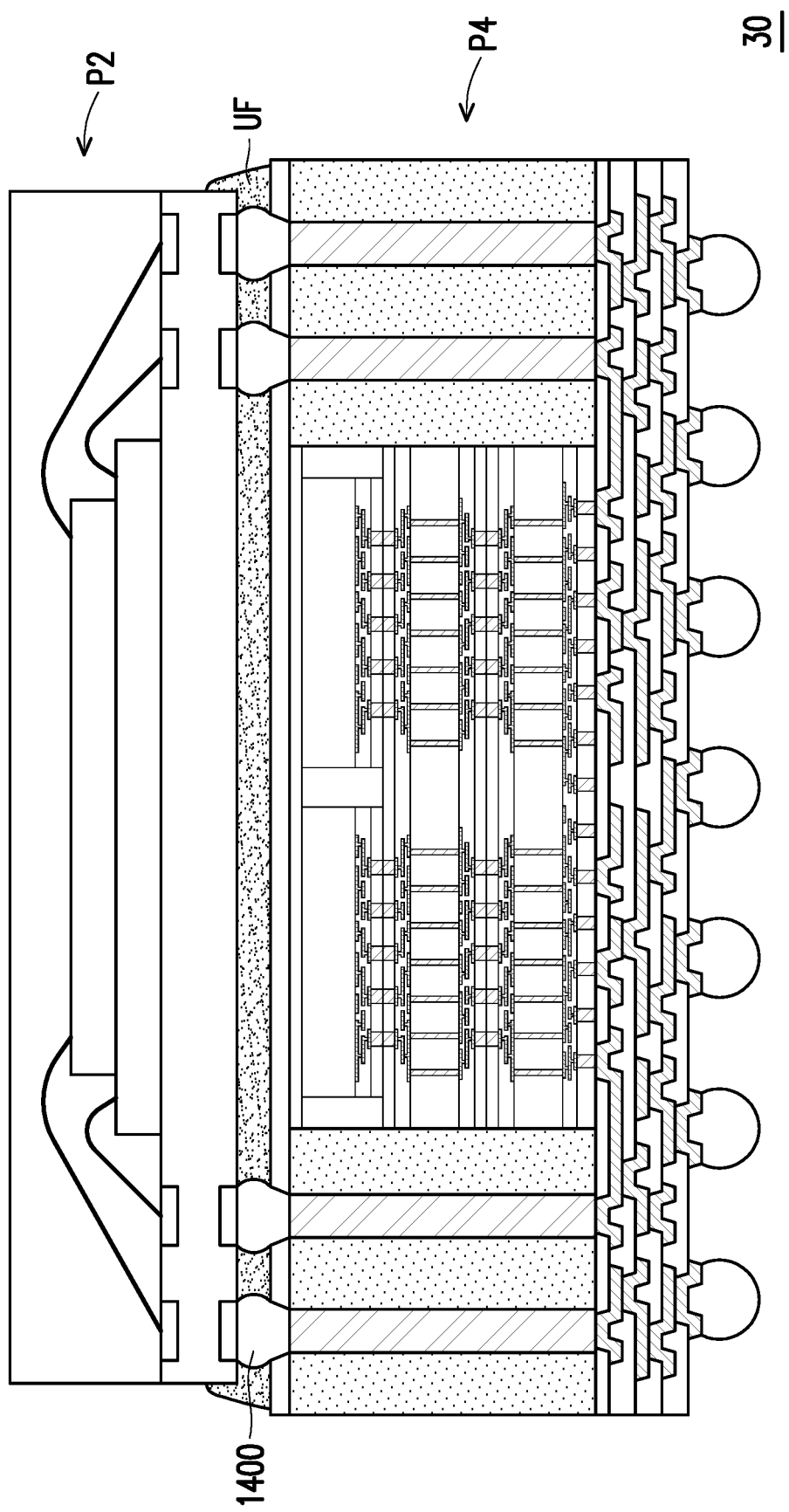

FIG. 3A to FIG. 3Q are schematic cross-sectional views illustrating a manufacturing process of a package 30 in accordance with some alternative embodiments of the disclosure. Referring to FIG. 3A, a semiconductor substrate 302a is provided. In some embodiments, the semiconductor substrate 302a has a plurality of TSVs 310 embedded therein. The semiconductor substrate 302a and the TSVs 310 in FIG. 3A are respectively similar to the semiconductor substrate 302a and the TSVs 310 in FIG. 1F, so the detailed descriptions thereof are omitted herein. As illustrated in FIG. 3A, a bonding film BF5 is formed on the semiconductor substrate 302a. For example, the bonding film BF5 is formed to cover the semiconductor substrate 302a and the TSVs 310. In some embodiments, the bonding film BF5 is similar to the bonding film BF1 in FIG. 1A, so detailed description thereof is omitted herein.

Referring to FIG. 3B, the structured illustrated in FIG. 3A is flipped upside down and is attached to a carrier C4. For example, the semiconductor substrate 302a is bonded to the carrier C4 through the bonding film BF5. In some embodiments, the carrier C4 is similar to the carrier C1 in FIG. 1B, so the detailed description thereof is omitted herein. After the semiconductor substrate 302a is bonded to the carrier C4, a planarization process is performed on the semiconductor substrate 302a. In some embodiments, the planarization process includes a mechanical grinding process and/or a CMP process. In some embodiments, the semiconductor substrate 302a of the semiconductor wafer W3 is grinded until the TSVs 310 are revealed, so as to form a semiconductor substrate 302. For example, after the planarization process, the TSVs 310 penetrate through the semiconductor substrate 302. In some embodiments, after the TSVs 310 are revealed, the semiconductor substrate 302 may be further grinded.

Referring to FIG. 3C, an interconnection structure 304, a dielectric layer 306, and a plurality of conductors 308 are formed on the semiconductor substrate 302. In some embodiments, the interconnection structure 304, the dielectric layer 306, and the conductors 308 in FIG. 3C are respectively similar to the interconnection structure 304, the dielectric layer 306, and the conductors 308 in FIG. 1F, so the detailed descriptions thereof are omitted herein. As illustrated in FIG. 3C, the conductors 308 are formed to be electrically connected to the TSVs 310 through the conductive patterns of the interconnection structure 304. In some embodiments, the semiconductor substrate 302, the interconnection structure 304, the dielectric layer 306, the conductors 308, and the TSVs 310 may be collectively referred to as a semiconductor wafer W3.

Referring to FIG. 3D, a semiconductor wafer W2 is provided and is hybrid bonded to the semiconductor wafer W3. The semiconductor wafer W2 includes a semiconductor substrate 202a, an interconnection structure 204, a dielectric layer 206, a plurality of conductors 208, and a plurality of TSVs 210. In some embodiments, the semiconductor substrate 202a may be a bulk semiconductor substrate free of active component and passive component. For example, the semiconductor substrate 202a may be an intrinsic silicon substrate without any active or passive component formed therein. However, the disclosure is not limited thereto. In some alternative embodiments, the semiconductor substrate 202a may include active component and/or passive component formed therein. On the other hand, the interconnection structure 204, the dielectric layer 206, the conductors 208, and the TSVs 210 in FIG. 3D are respectively similar to the interconnection structure 304, the dielectric layer 306, the conductors 308, and the TSVs 310 in FIG. 1F, so the detailed descriptions thereof are omitted herein. As illustrated in FIG. 3D, the interconnection structure 204 is disposed over the semiconductor substrate 202a and the dielectric layer 206 covers the interconnection structure 204. In some embodiments, the conductors 208 are embedded in the dielectric layer 206. In some embodiments, the TSVs 210 are embedded in the semiconductor substrate 202a.

As illustrated in FIG. 3D, the semiconductor wafer W3 has a surface $S_{300a}$ formed by top surfaces of the conductors 308 and a top surface of the dielectric layer 306. The top surfaces of the conductors 308 and the top surface of the dielectric layer 306 are substantially located at the same level height to provide an appropriate surface $S_{300a}$ for hybrid bonding. On the other hand, the semiconductor wafer W2 has a surface $S_{200a}$ formed by bottom surfaces of the conductors 208 and a bottom surface of the dielectric layer 206. The bottom surfaces of the conductors 208 and the bottom surface of the dielectric layer 206 are substantially located at the same level height to provide an appropriate surface $S_{200a}$ for hybrid bonding. In some embodiments, the surface $S_{200a}$ of the semiconductor wafer W2 is in direct contact with the surface $S_{300a}$ of the semiconductor wafer W3. The hybrid bonding process in FIG. 3D may be similar to the hybrid bonding process shown in FIG. 1F, so the detailed description thereof is omitted herein. In some embodiments, the dielectric layer 206 of the semiconductor wafer W2 is directly in contact with the dielectric layer 306 of the semiconductor wafer W3. Meanwhile, the conductors 208 of the semiconductor wafer W2 are substantially aligned and in direct contact with the conductors 308 of the semiconductor wafer W3. In some embodiments, since the semiconductor wafer W2 and the semiconductor wafer W3 are both in wafer form, the bonding of the semiconductor wafer W2 to the semiconductor wafer W3 is referred to as "wafer-to-wafer bonding."

Referring to FIG. 3E, a planarization process is performed on the semiconductor wafer W2. In some embodiments, the planarization process includes a mechanical grinding process and/or a CMP process. In some embodiments, the semiconductor substrate 202a of the semiconductor wafer W2 is grinded until the TSVs 210 are revealed, so as to form a semiconductor substrate 202. For example, after the planarization process, the TSVs 210 penetrate through the semiconductor substrate 202. The TSVs 210 allow electrical communication between the front side and the back side of the semiconductor wafer W2. In some embodiments, after the TSVs 210 are revealed, the semiconductor wafer W2 may be further grinded to reduce the overall thickness of the semiconductor wafer W2.

Referring to FIG. 3E and FIG. 3F, the carrier C4 and the bonding film BF5 are removed to expose the TIVs 310 of the semiconductor wafer W3. Subsequently, the structure illustrated in FIG. 3E is flipped upside down and is attached to a carrier C5. The carrier C5 may be similar to the carrier C2 in FIG. 1H, so the detailed description thereof is omitted herein. Thereafter, an interconnection structure 312, a dielectric layer 314, and a plurality of conductors 316 are formed on the semiconductor substrate 302 and the exposed TSVs 310. In some embodiments, the interconnection structure 312, the dielectric layer 314, and the conductors 316 are respectively similar to the interconnection structure 304, the dielectric layer 306, and the conductors 308, so the detailed descriptions thereof are omitted herein. As illustrated in FIG. 3F, the interconnection structure 312 is disposed over the semiconductor substrate 302 and the TSVs 310. On the other hand, the dielectric layer 314 covers the interconnection structure 312. In some embodiments, the conductors 316 are embedded in the dielectric layer 314. In some embodiments, the interconnection structure 312, the dielectric layer 314, and the conductors 316 are also considered as part of the semiconductor wafer W3.

As illustrated in FIG. 3F, the semiconductor wafer W3 has a surface $S_{300b}$ formed by top surfaces of the conductors 316 and a top surface of the dielectric layer 314. That is, the surface$_{300b}$ is opposite to the surface $S_{300a}$. The top surfaces of the conductors 316 and the top surface of the dielectric layer 314 are substantially located at the same level height to provide an appropriate surface $S_{300b}$ for hybrid bonding.

Referring to FIG. 3G, a chip 100 and a chip 400 are picked-and-placed on the semiconductor wafer W3. The chip 100 and the chip 400 in FIG. 3G are respectively similar to the chip 100 and the chip 400 in FIG. 1F, so similar components thereof are denoted by the same reference numeral and the detailed descriptions thereof are omitted herein. In some embodiments, the chip 100 and the chip 400 are placed to have a gap G between the two. In some embodiments, from a top view, the sidewalls of the chip 400 are not aligned with the sidewalls of the chip 100. In some embodiments, the chip 100 has an active surface $A_{100}$ and a rear surface $R_{100}$ opposite to the active surface $A_{100}$. Similarly, the chip 400 has an active surface $A_{400}$ and a rear surface $R_{400}$ opposite to the active surface $A_{400}$. As illustrated in FIG. 3G, the chip 100 and the chip 400 are disposed on the semiconductor wafer W3 in a face-down manner. In some embodiments, the chip 100 and the chip 400 are hybrid bonded to the semiconductor wafer W3. For example, the chip 100 and the chip 400 are placed such that the active surface $A_{100}$ of the chip 100 and the active surface $A_{400}$ of the chip 400 are in direct contact with the surface $S_{300b}$ of the semiconductor wafer W3. The hybrid bonding process in FIG. 3G may be similar to the hybrid bonding process shown in FIG. 1F, so the detailed description thereof is omitted herein. In some embodiments, the dielectric layer 106 of the chip 100 and the dielectric layer 406 of the chip 400 are directly in contact with the dielectric layer 314 of the semiconductor wafer W3. Meanwhile, the conductors 108 of the chip 100 and the conductors 408 of the chip 400 are substantially aligned and in direct contact with the conductors 316 of the semiconductor wafer W3.

Referring to FIG. 3H, an insulating encapsulant 500 is formed to fill the gap G between the chip 100 and the chip 400. The insulating encapsulant 500 is similar to the insulating encapsulant 500 in FIG. 1G, so the detailed descriptions thereof are omitted herein. In some embodiments, the insulating encapsulant 500 laterally encapsulates the chip 100 and the chip 400.

Referring to FIG. 3H and FIG. 3I, the carrier C5 is removed to expose the TSVs 210 of the semiconductor wafer W2. Subsequently, the structure illustrated in FIG. 3H is flipped upside down and is attached to a carrier C2. The carrier C2 in FIG. 3I is similar to the carrier C2 in FIG. 1H, so the detailed description thereof is omitted herein. As illustrated in FIG. 3I, the chip 100, the chip 400, and the insulating encapsulant 500 are attached to the carrier C2.

Referring to FIG. 3J, an interconnection structure 700, a passivation layer 800, and a plurality of conductive vias 900 are formed on the semiconductor substrate 210 and the TSVs 210 of the semiconductor wafer 200. The interconnection structure 700, the passivation layer 800, and the conductive vias 900 in FIG. 3J are respectively similar to the interconnection structure 700, the passivation layer 800, and the conductive vias 900 in FIG. 1I, so the detailed descriptions thereof are omitted herein. In some embodiments, the interconnection structure 700 is electrically connected to the TSVs 210 of the semiconductor wafer W2. For example, the conductive patterns of the interconnection structure 700 may be in direct contact with the TSVs 210 of the semiconductor wafer W2. In some embodiments, the conductive vias 900 are formed on and directly in contact with the conductive patterns of the interconnection structure 700. That is, the conductive vias 900 are electrically connected with the chips 100 and 400 sequentially through the interconnection structure 700, the TSVs 210, the interconnection structure 204, the conductors 208, the conductors 308, the interconnection structure 304, the TSVs 310, the interconnection structure 312, and the conductors 316.

Referring to FIG. 3J and FIG. 3K, the carrier C2 is removed and a singulation process performed on the structure illustrated in FIG. 3J to obtain a plurality of integrated circuit D3. The singulation process in FIG. 3K is similar to the singulation process in FIG. 1J, so the detailed description thereof is omitted herein. In some embodiments, the singulation process divides the semiconductor wafer W2 into a plurality of chips 200 and divides the semiconductor wafer W3 into a plurality of chips 300. In some embodiments, each chip 200 includes the semiconductor substrate 202, the interconnection structure 204, the dielectric layer 206, the conductors 208, and the TSVs 210. In some embodiments, the chips 200 are dummy chips free of active component and passive component. That is, the chips 200 are disabled/not contributive during the operation of the subsequently formed electronic device. However, the disclosure is not limited thereto. In some alternative embodiments, the chips 200 may include active component and/or passive component formed therein. That is, depending on the design requirements, the chips 200 may contribute to the operation of the subsequently formed electronic device. In some embodiments, the chip 200 may be referred to as "Mechanical-Electrical-Thermal (MET) chip." In some embodiments, each chip 300 includes the semiconductor substrate 302, the interconnection structures 304, 312, the dielectric layers 306, 314, the conductors 308, 316, and the TSVs 310. In some embodiments, the chip 300 may be capable of performing logic functions. For example, the chip 300 may be Central Process Unit (CPU) chip, Graphic Process Unit (GPU) chip, Field-Programmable Gate Array (FPGA), or the like.

As illustrated in FIG. 3K, a thickness $H_{100}$ of the chip 100 is substantially equal to a thickness $H_{400}$ of the chip 400. For example, the thickness $H_{100}$ of the chip 100 and the thickness $H_{400}$ of the chip 400 may range from about 10 μm to about 60 μm. On the other hand, a thickness $H_{300}$ of the chip 300 ranges between about 20 μm and about 60 μm while a thickness $H_{200}$ of the chip 200 ranges between about 10 μm and about 50 μm.

In some embodiments, since multiple chips (chips 100, 200, 300, and 400) are integrated into a single integrated circuit D3, the integrated circuit D3 may be referred to as a "SOIC." As illustrated in FIG. 3K, the chip 300 is stacked on and hybrid bonded to both of the chip 100 and the chip 400. That is, the chip 100 and the chip 400 are disposed side by side on the surface $S_{300b}$ of the chip 300. On the other hand, the chip 200 is stacked on the surface $S_{300a}$ of the chip 300 opposite to the surface $S_{300b}$. For example, the chip 300 is sandwiched between the chip 100 and the chip 200 and is sandwiched between the chip 400 and the chip 200. In some embodiments, the chip 200 is hybrid bonded to the chip 300. In some embodiments, sidewalls of the chip 200 are aligned with sidewalls of the chip 300. In some embodiments, the chip 300 is electrically connected to both of the chip 100 and the chip 400. On the other hand, the chip 200 is electrically connected to the chip 300. For example, the TSVs 210 of the chip 200 are electrically connected to the TSVs 310 of the chip 300. As illustrated in FIG. 3K, the TSVs 210 are aligned with the TSVs 310. However, the disclosure is not limited thereto. In some alternative embodiments, the TSVs 210 and the TSVs 310 may have an offset. In some embodiments, the chip 200 may be made of the same material as the chips 100, 300, and 400. As such, mismatch of the CTE between different components of the integrated circuit D3 or the subsequently formed package may be reduced. As a result, the warpage derived from the manufacturing process of the integrated circuit D3 or the subsequently formed package may be minimized, thereby increasing the yield rate. Moreover, in some embodiments, the chip 200 may also serve as a heat dissipation mechanism to increase the heat dissipation rate during operation of the subsequently formed package. In some embodiments, the integrated circuit D3 further includes the insulating encapsulant 500, the interconnection structure 700, the passivation layer 800, and the conductive vias 900. The insulating encapsulant 500 laterally encapsulates the chips 100 and 400. The interconnection structure 700, the passivation layer 800, and the conductive vias 900 are disposed on the chip 200 opposite to the chip 300. In some embodiments, the integrated circuit D3 may be utilized in various applications. For example, the integrated circuit D3 may be used as a die in an InFO package. The manufacturing process of the InFO package will be described below.

Referring to FIG. 3L to FIG. 3P, the steps in FIG. 3L to FIG. 3P are similar to the steps shown in FIG. 1K to FIG. 1O except the integrated circuit D1 in FIG. 1K to FIG. 1O has been replaced with the integrated circuit D3 in FIG. 3K, so the detailed descriptions thereof are omitted herein. Referring to FIG. 3P, a plurality of package structures P4 is obtained. As mentioned above, the package structure P4 may be referred to as an "InFO package." As illustrated in FIG. 3P, the encapsulant 1100 is in direct contact with sidewalls of the chip 200 and the chip 300 to laterally encapsulate the chip 200 and the chip 300. On the other hand, the redistribution structure 1200 is electrically connected to the chips 100, 200, 300, and 400. In some embodiments, by introducing the chip 200 in the integrated circuit D3 and by utilizing the integrated circuit D3 in the package structure P4, the warpage and the RDL stress in the package structure P4 may be effectively reduced. Meanwhile, the electrical performance and the heat dissipation of the package structure P4 may be sufficiently enhanced.

In some embodiments, the package structure P4 may be further assembled with other package structures to form a package. For example, referring to FIG. 3Q, a package structure P2 is stacked on the package structure P4 to form a package 30. In some embodiments, the package structure P4 is electrically connected to the package structure P2 through the conductive terminals 1400. In some embodiments, the package 30 may further include an underfill UF located between the package structure P4 and the package structure P2. In some embodiments, the underfill UF is able to protect the conductive terminals 1400 electrically connecting the package structures P4 and P2. In some embodiments, the package 30 may be referred to as a "PoP."

Figure 4A:
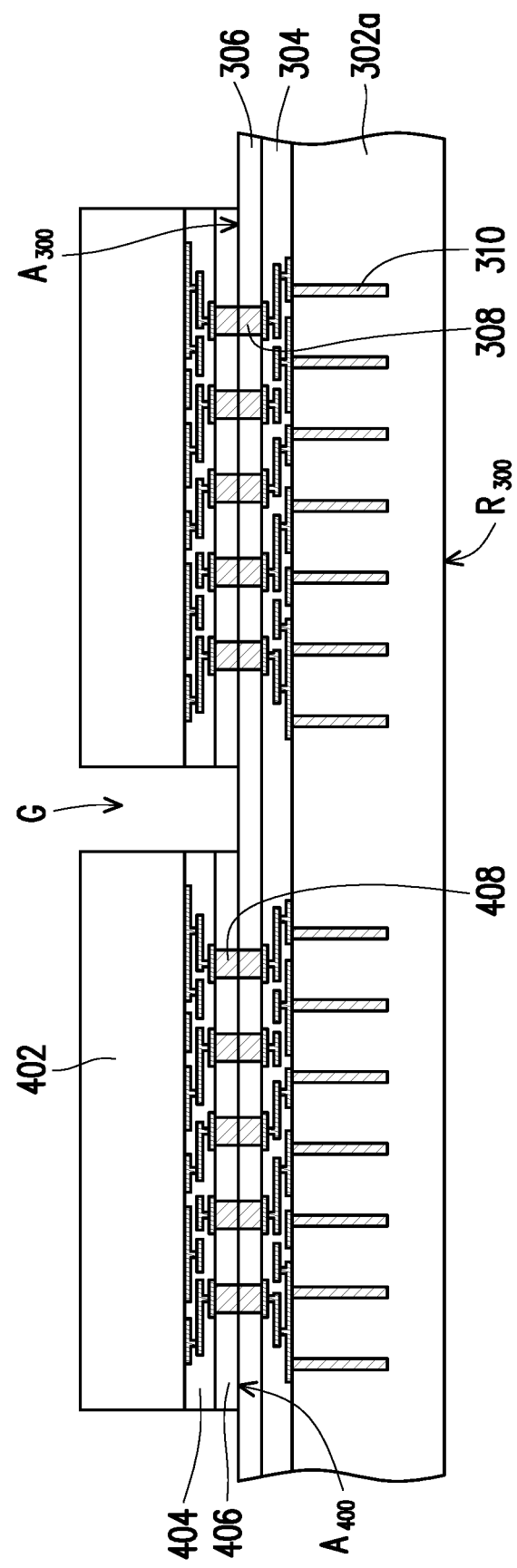
FIG. 4A to FIG. 4Q are schematic cross-sectional views illustrating a manufacturing process of a package in accordance with some alternative embodiments of the disclosure.
Figure 4B:
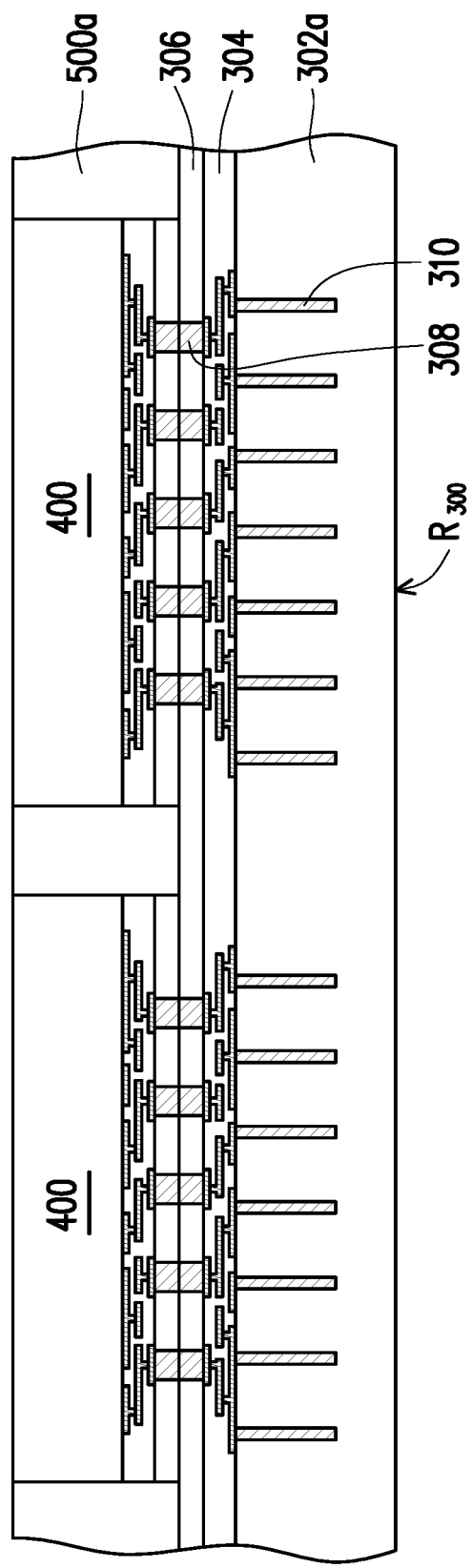
Figure 4C:
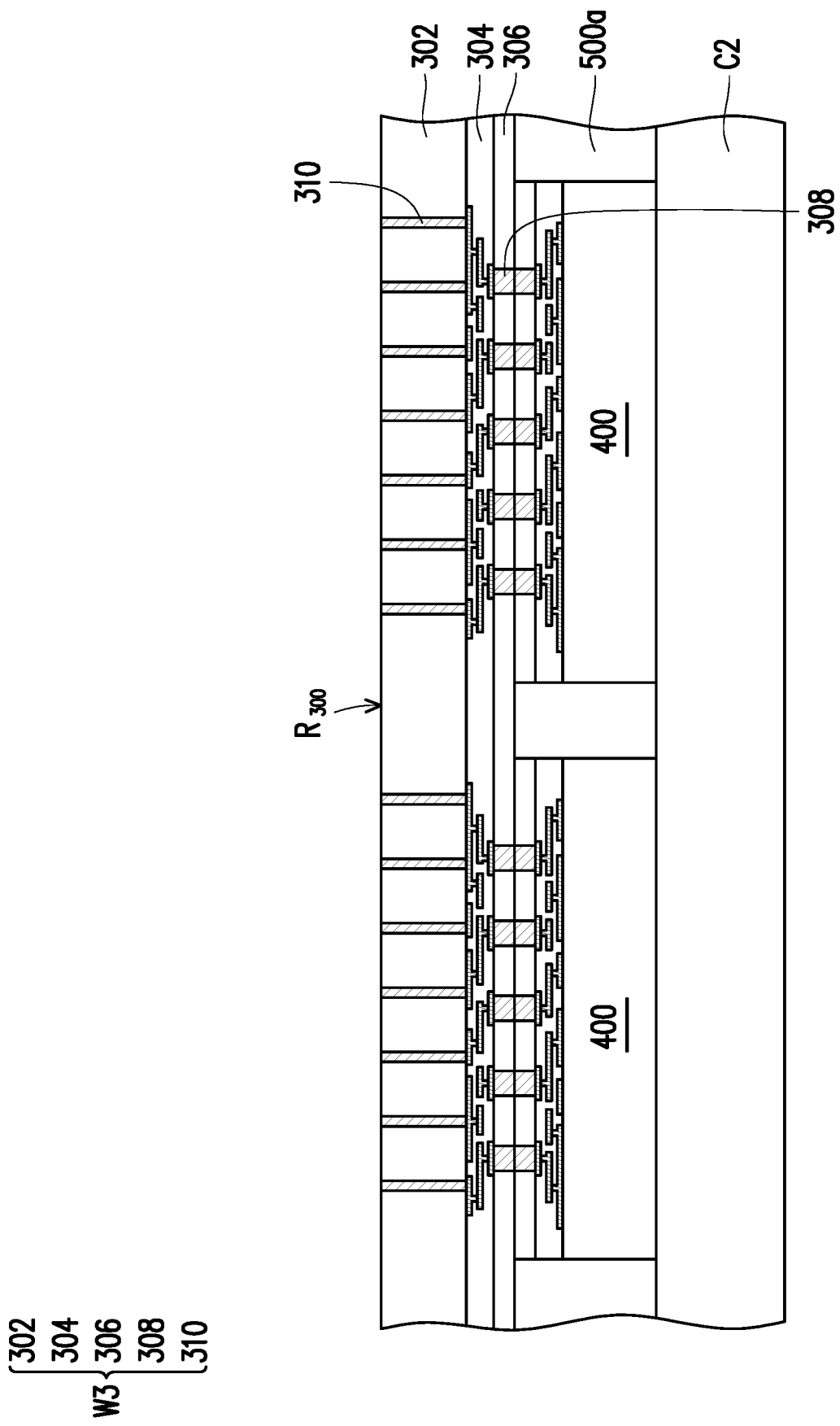
Figure 4D:
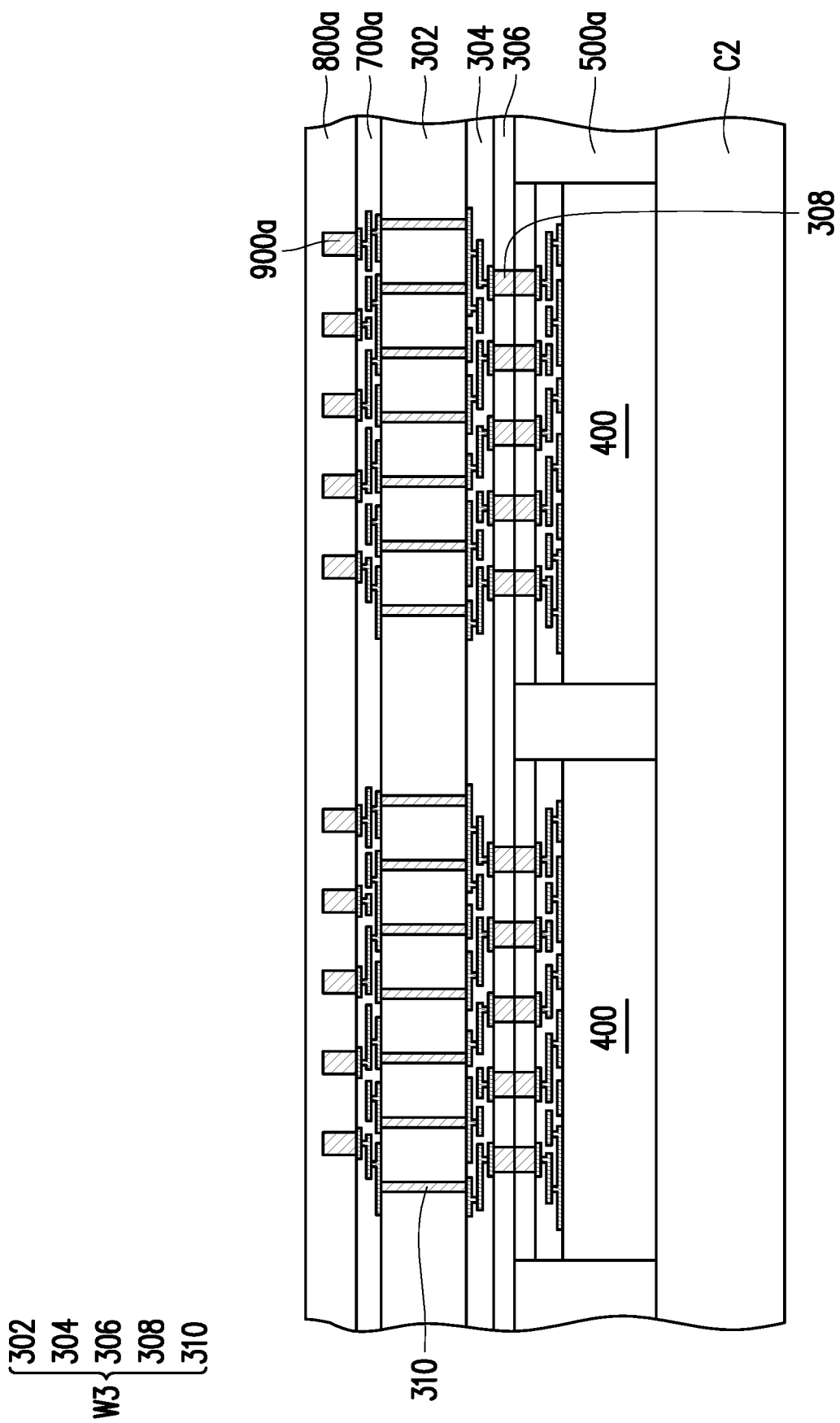
Figure 4E:
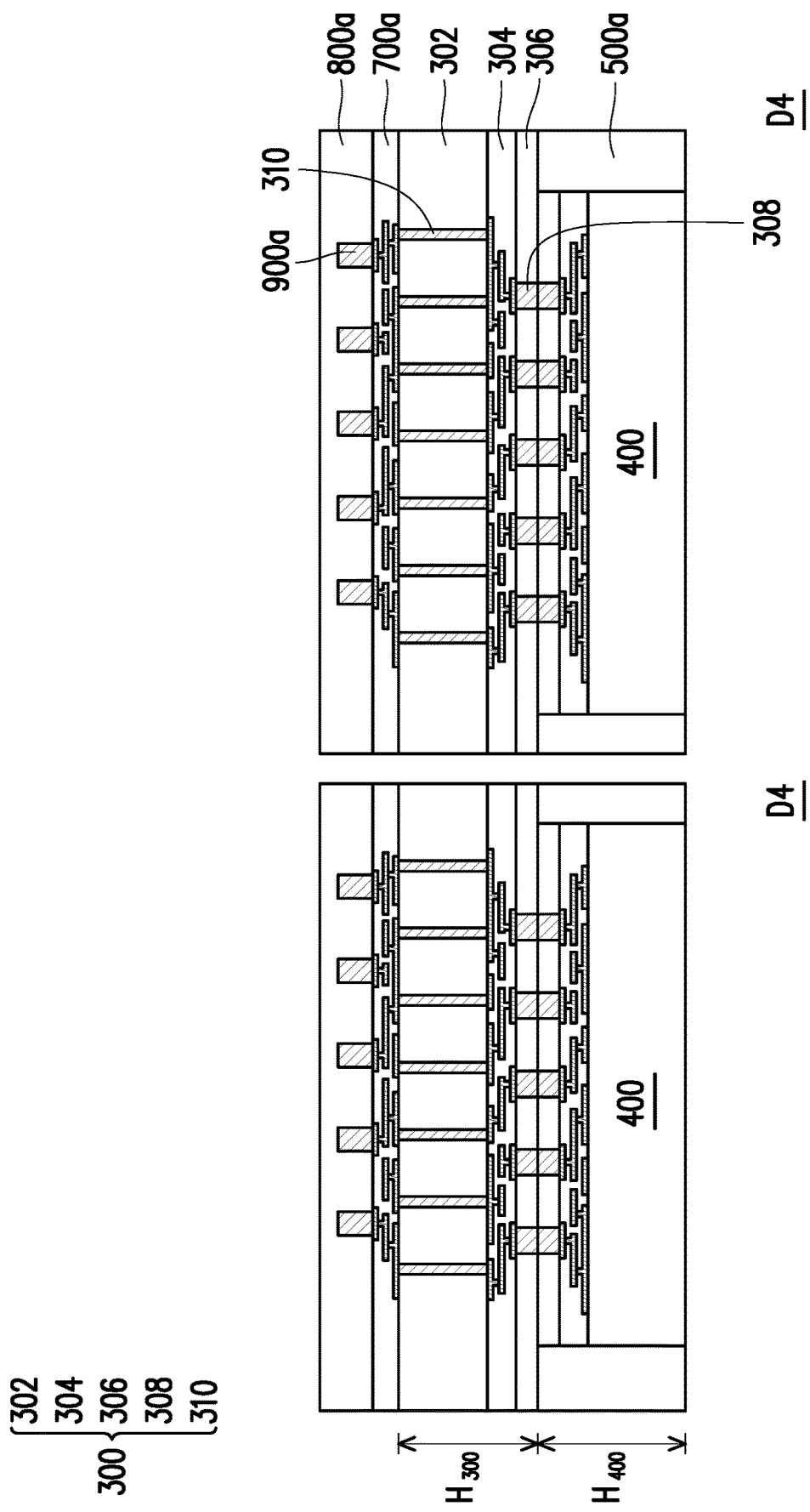
Figure 4F:
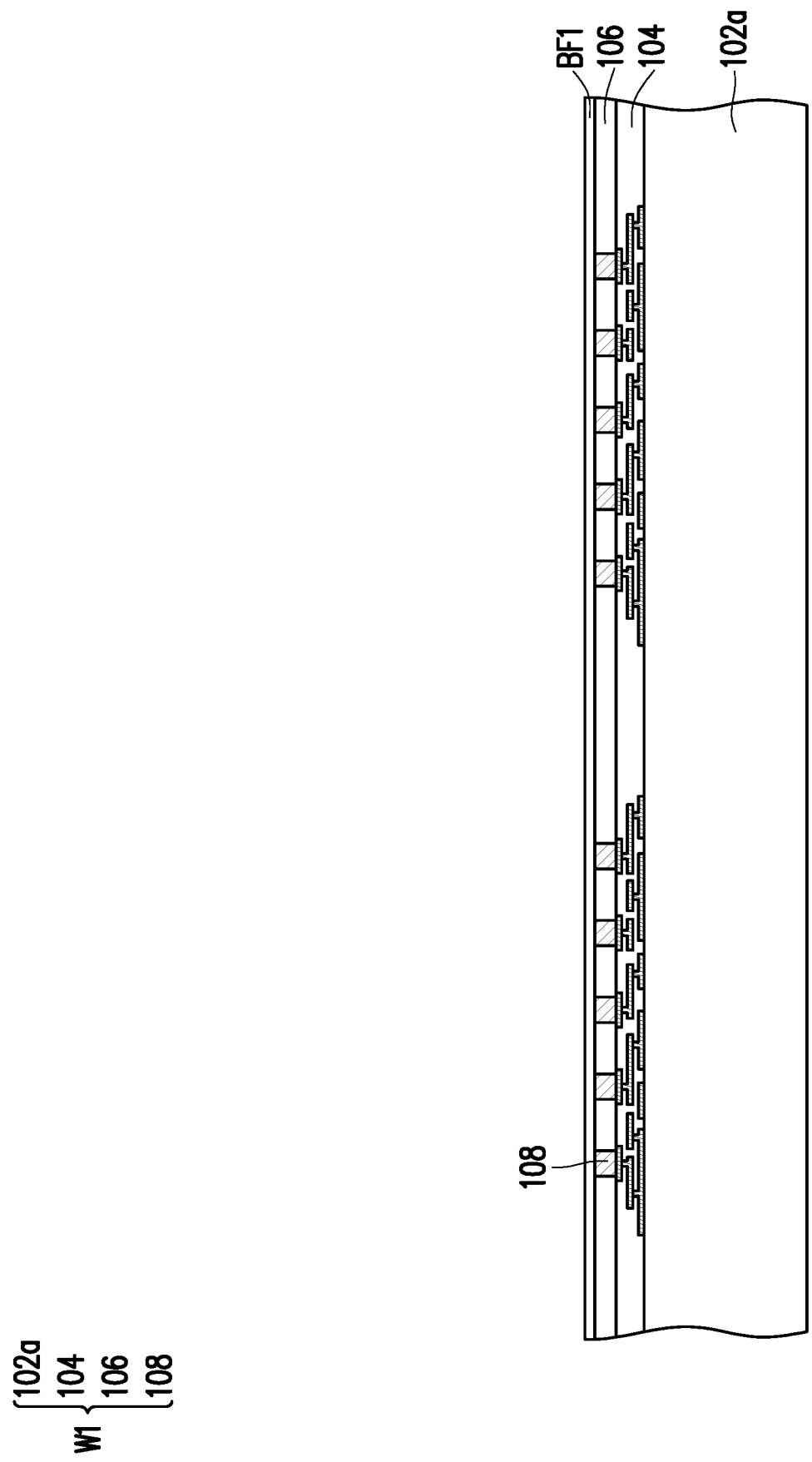
Figure 4G:
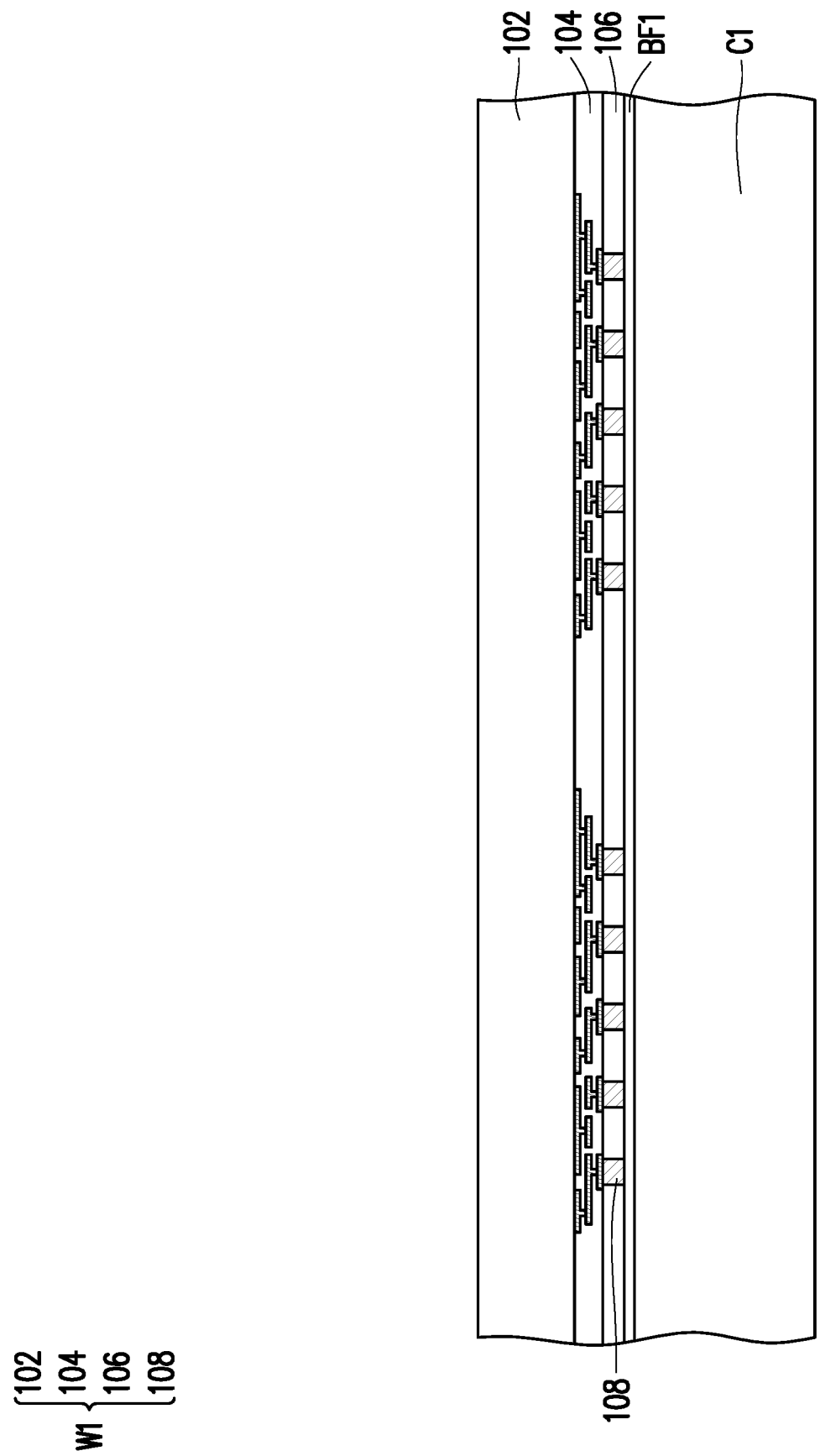
Figure 4H:
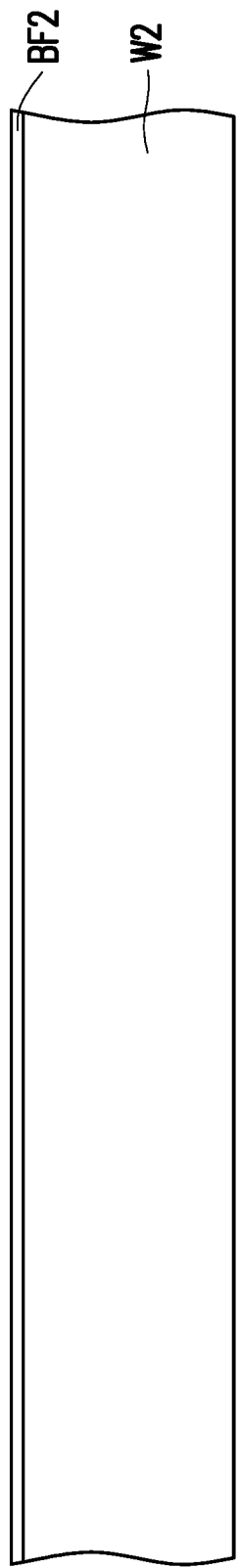
Figure 4I:
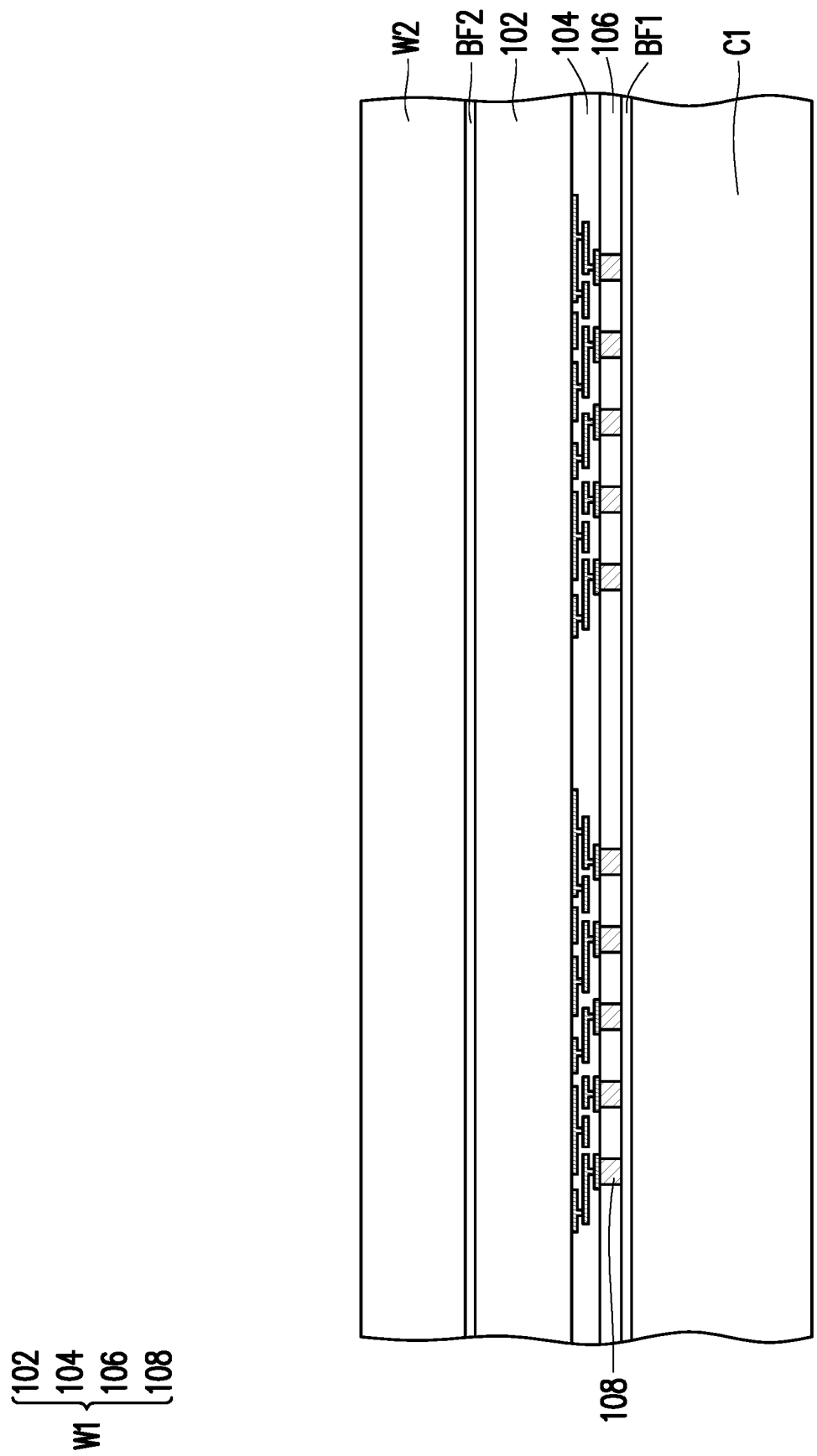
Figure 4J:
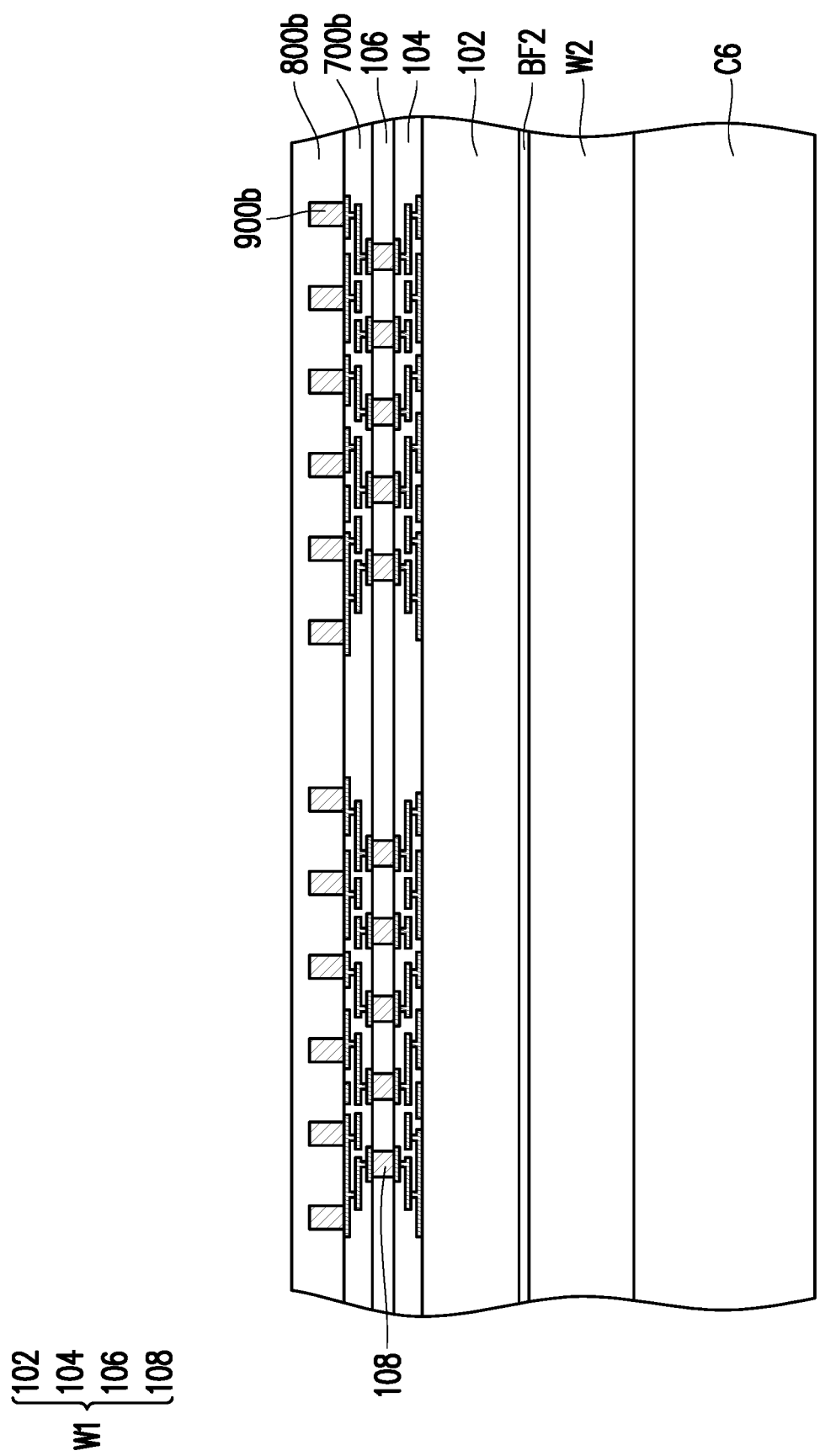
Figure 4K:
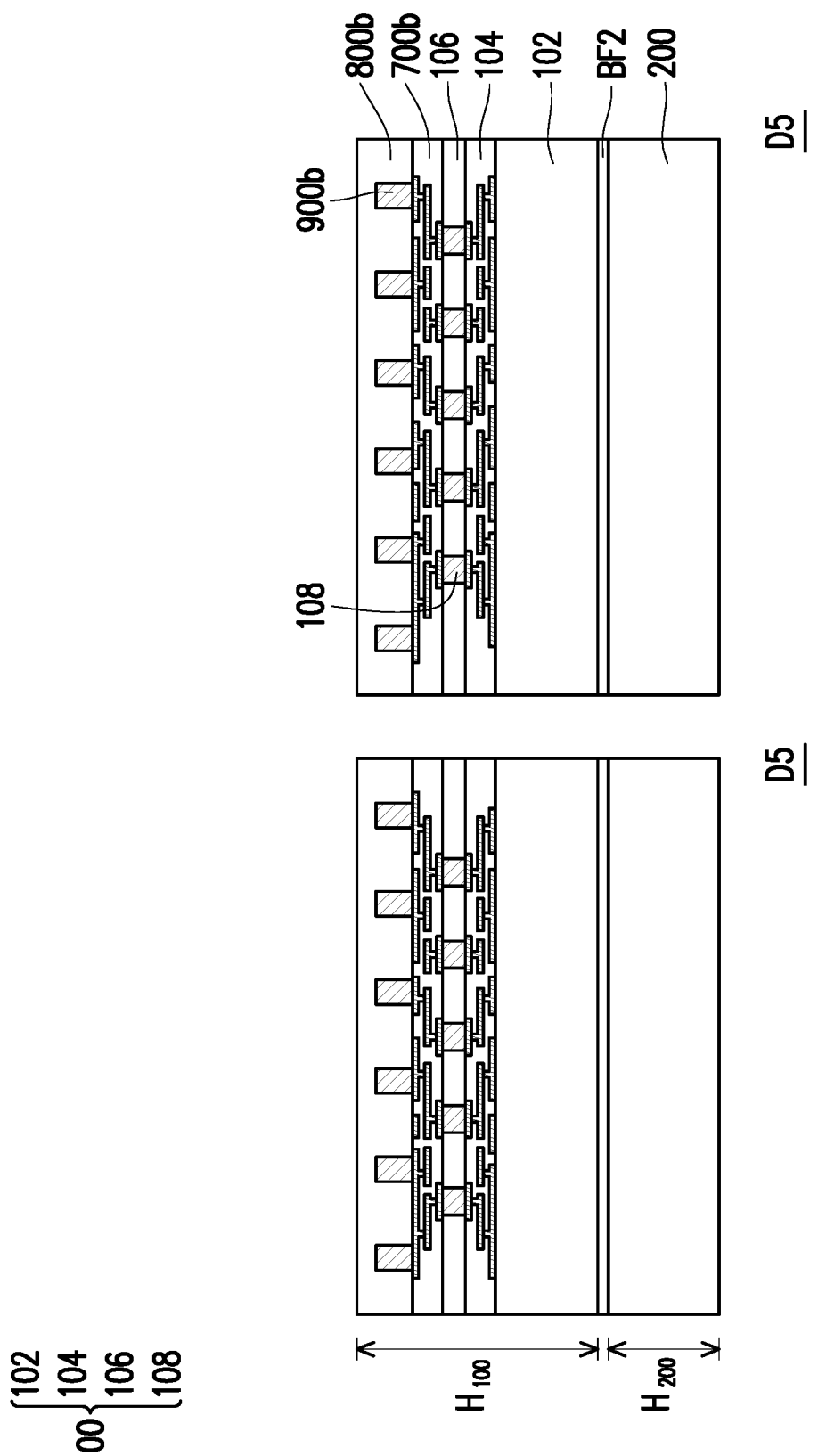
Figure 4L:
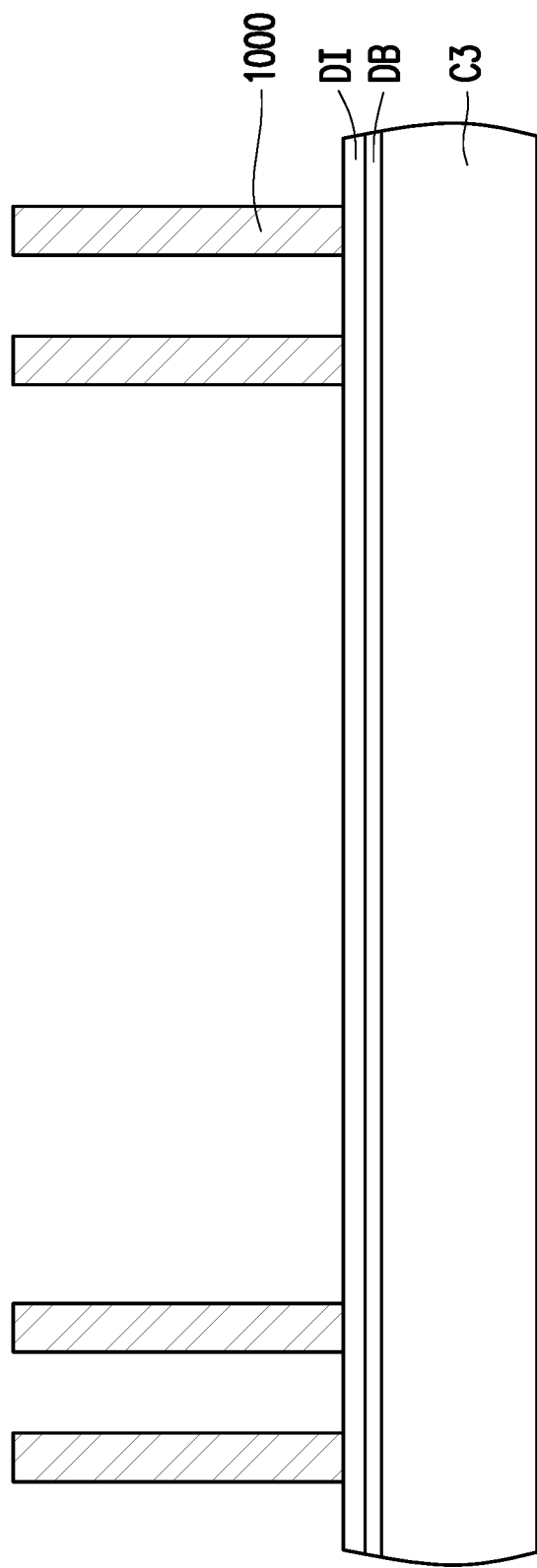
Figure 4M:
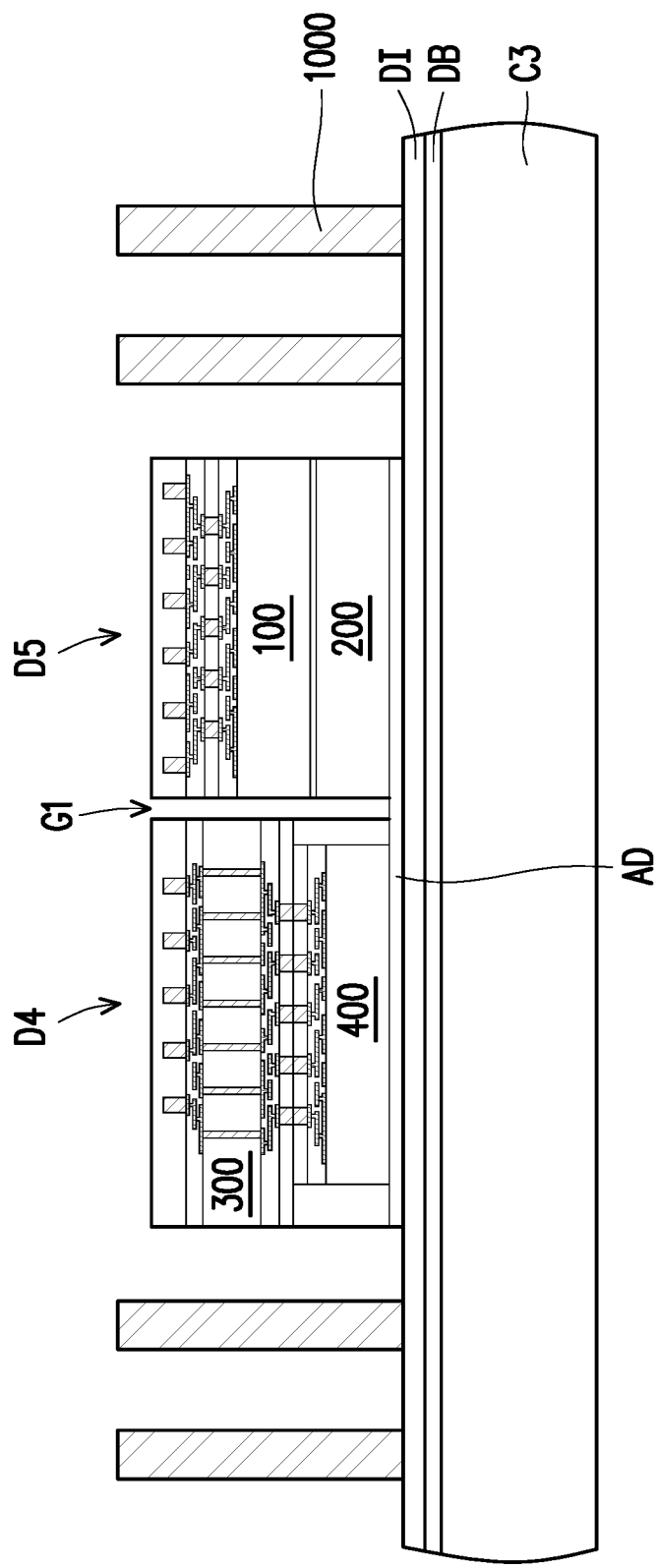
Figure 4N:
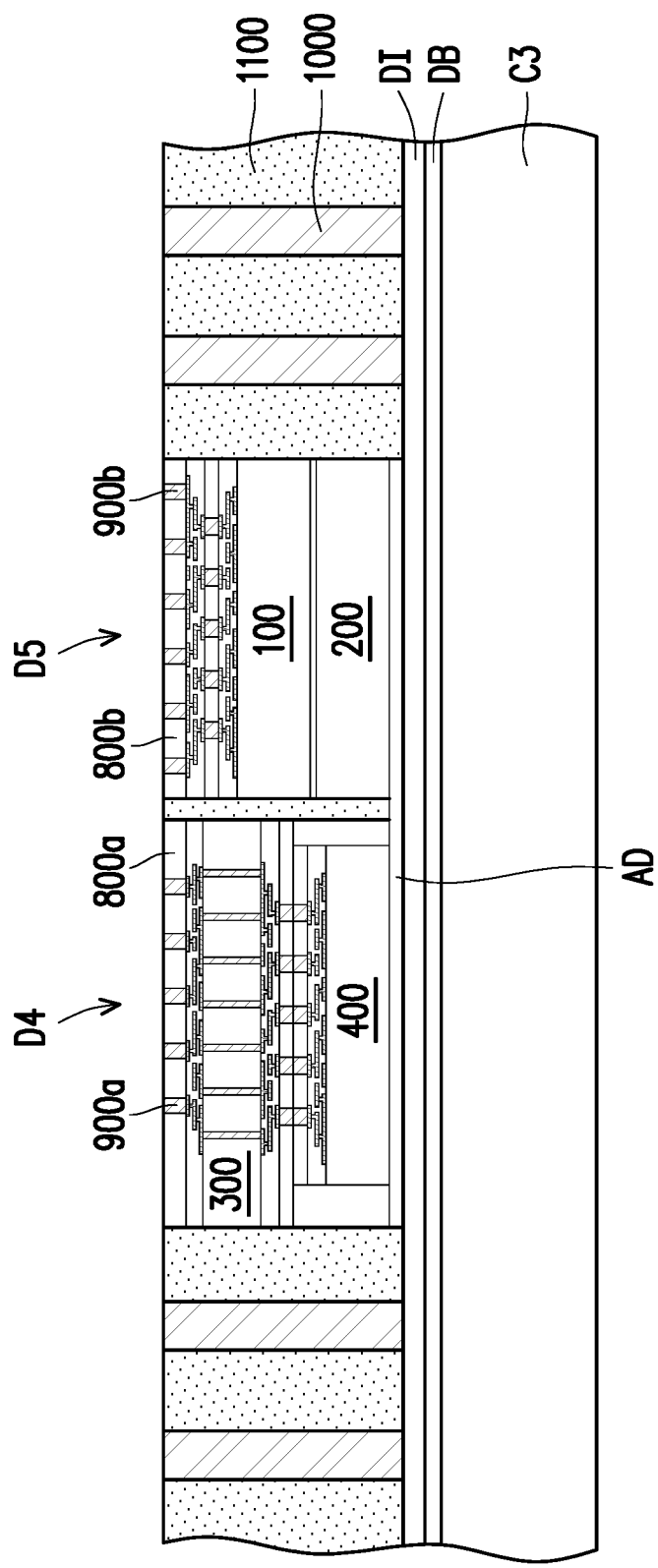
Figure 40:
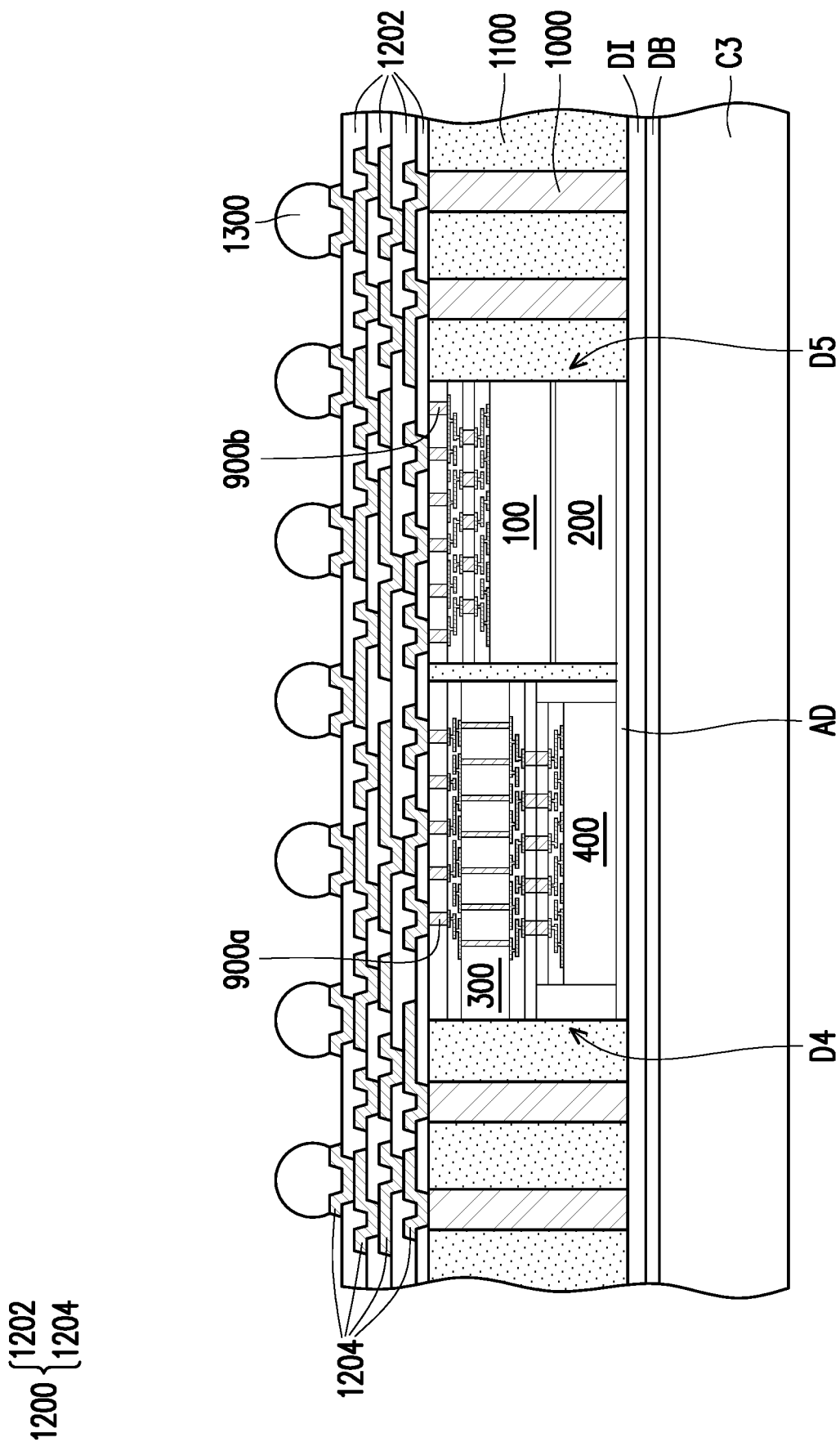
Figure 4P:
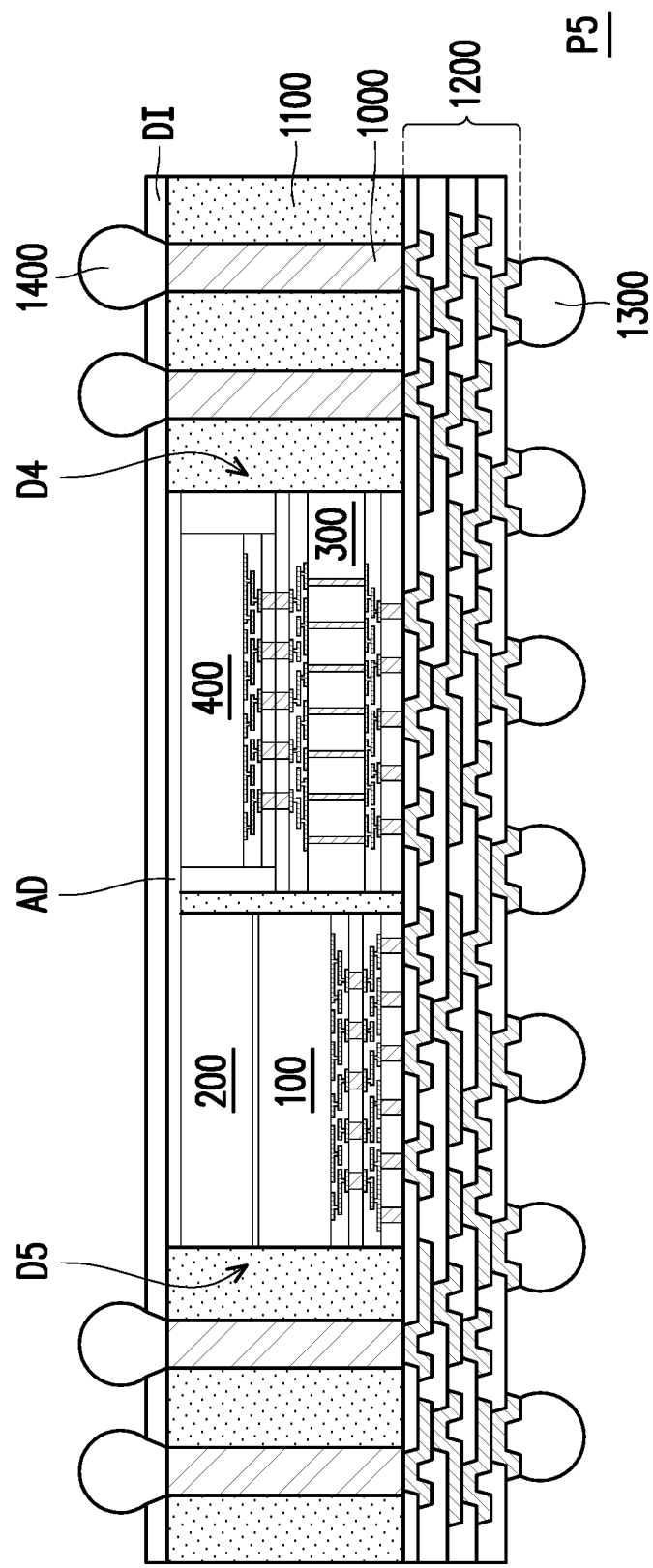
Figure 4Q:
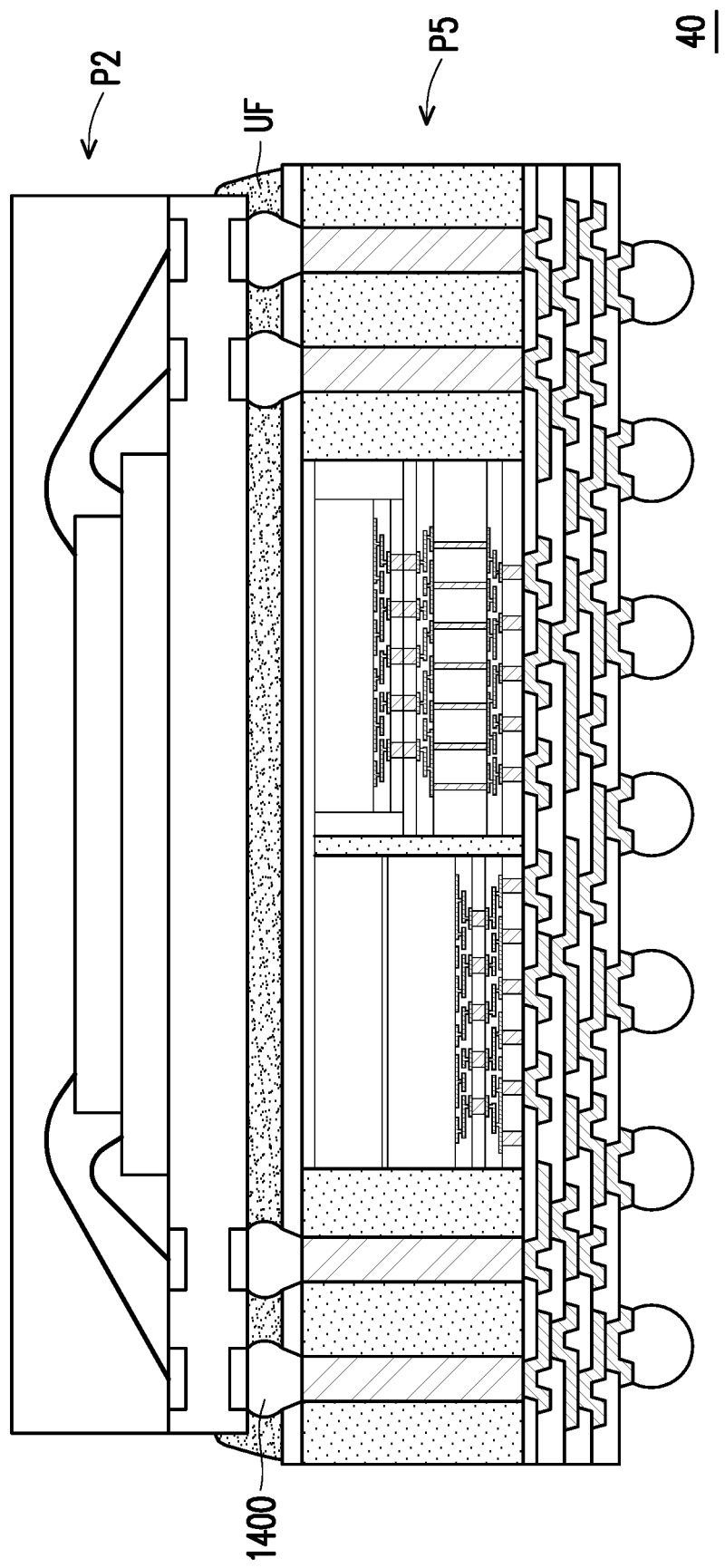

FIG. 4A to FIG. 4Q are schematic cross-sectional views illustrating a manufacturing process of a package 40 in accordance with some alternative embodiments of the disclosure. Referring to FIG. 4A, a semiconductor wafer W3 is provided. The semiconductor wafer W3 in FIG. 4A is similar to the semiconductor wafer W3 in FIG. 1F, so similar components thereof are denoted by the same reference numeral and the detailed descriptions thereof are omitted herein. In some embodiments, the semiconductor wafer W3 has an active surface $A_{300}$ and a rear surface $R_{300}$ opposite to the active surface $A_{300}$.

As illustrated in FIG. 4A, a plurality of chips 400 are picked-and-place on the semiconductor wafer W3. The chips 400 in FIG. 4A are similar to the chip 400 in FIG. 1F, so similar components thereof are denoted by the same reference numeral and the detailed descriptions thereof are omitted herein. In some embodiments, the chips 400 are placed in an array to have a gap G between two adjacent chips 400. In some embodiments, each chip 400 has an active surface $A_{400}$ and a rear surface $R_{400}$ opposite to the active surface $A_{400}$. As illustrated in FIG. 4A, the chips 400 are disposed on the semiconductor wafer W3 in a face-down manner. In some embodiments, the chips 400 are hybrid bonded to the semiconductor wafer W3. For example, the chips 400 are placed such that the active surfaces $A_{400}$ of the chips 400 are in direct contact with the active surfaces $A_{300}$ of the semiconductor wafer W3. The hybrid bonding process in FIG. 4A may be similar to the hybrid bonding process shown in FIG. 1F, so the detailed description thereof is omitted herein. In some embodiments, the dielectric layers 406 of the chips 400 are directly in contact with the dielectric layer 306 of the semiconductor wafer W3. Meanwhile, the conductors 408 of the chip 400 are substantially aligned and in direct contact with the conductors 308 of the semiconductor wafer W3.

Referring to FIG. 4B, an insulating encapsulant 500a is formed to fill the gap G between two adjacent chips 400. The insulating encapsulant 500a in FIG. 4B is similar to the insulating encapsulant 500 in FIG. 1G, so the detailed descriptions thereof are omitted herein. In some embodiments, the insulating encapsulant 500a laterally encapsulates the chips 400.

Referring to FIG. 4B and FIG. 4C, the structure illustrated in FIG. 4B is flipped upside down and is attached to a carrier C2. The carrier C2 in FIG. 4B may be similar to the carrier C2 in FIG. 1H, so the detailed description thereof is omitted herein. Thereafter, a planarization process is performed on the rear surface $R_{300}$ of the semiconductor wafer W3. In some embodiments, the planarization process includes a mechanical grinding process and/or a CMP process. In some embodiments, the semiconductor substrate 302a of the semiconductor wafer W3 is grinded until the TSVs 310 are revealed, so as to form a semiconductor substrate 302. For example, after the planarization process, the TSVs 310 penetrate through the semiconductor substrate 302. The TSVs 310 allow electrical communication between the front side and the back side of the semiconductor wafer W3. In some embodiments, after the TSVs 310 are revealed, the semiconductor wafer W3 may be further grinded to reduce the overall thickness of the semiconductor wafer W3.

Referring to FIG. 4D, an interconnection structure 700a, a passivation layer 800a, and a plurality of conductive vias 900a are formed on the rear surface $R_{300}$ of the semiconductor wafer W3. In some embodiments, the interconnection structure 700a, the passivation layer 800a, and the conductive vias 900a in FIG. 4D are respectively similar to the interconnection structure 700, the passivation layer 800, and the conductive vias 900 in FIG. 1I, so the detailed descriptions thereof are omitted herein. In some embodiments, the interconnection structure 700a is electrically connected to the TSVs 310 of the semiconductor wafer W3. For example, the conductive patterns of the interconnection structure 700a may be in direct contact with the TSVs 310 of the semiconductor wafer W3. In some embodiments, the conductive vias 900a are formed on and directly in contact with the conductive patterns of the interconnection structure 700a. That is, the conductive vias 900a are electrically connected with the chips 400 sequentially through the interconnection structure 700a, the TSVs 310, the interconnection structure 304, and the conductors 308.

Referring to FIG. 4D and FIG. 4E, the carrier C2 is removed and a singulation process is performed on the structure illustrated in FIG. 4D to obtain a plurality of integrated circuits D4. The singulation process in FIG. 4E is similar to the singulation process in FIG. 1J, so the detailed description thereof is omitted herein. In some embodiments, the singulation process divides the semiconductor wafer W3 into a plurality of chips 300. The chip 300 in FIG. 4E is similar to the chip 300 in FIG. 1J, so similar components thereof are denoted by the same reference numeral and the detailed descriptions thereof are omitted herein. In some embodiments, the chip 300 is stacked on and hybrid bonded to the chip 400. In some embodiments, a thickness $H_{300}$ of the chip 300 ranges between about 10 μm and about 50 μm while thickness $H_{400}$ of the chip 400 ranges between about 10 μm and about 120 μm. In some embodiments, since multiple chips (chips 300 and 400) are integrated into a single integrated circuit D4, the integrated circuit D4 may be referred to as a "SOIC."

Referring to FIG. 4F to FIG. 4I, the steps in FIG. 4F to FIG. 4I are similar to the steps shown in FIG. 1A to FIG. 1D, so the detailed descriptions thereof are omitted herein.

Referring to FIG. 4I and FIG. 4J, the carrier C1 is removed. Subsequently, the structure illustrated in FIG. 4I is flipped upside down and is attached to a carrier C6. In other words, the semiconductor wafer W2 is attached to the carrier C6. The carrier C6 is similar to the carrier C2 in FIG. 1H, so the detailed description thereof is omitted herein. Thereafter, an interconnection structure 700b, a passivation layer 800b, and a plurality of conductive vias 900b are formed on the semiconductor wafer W1. The interconnection structure 700b, the passivation layer 800b, and the conductive vias 900b in FIG. 4J are respectively similar to the interconnection structure 700, the passivation layer 800, and the conductive vias 900 in FIG. 1I, so the detailed descriptions thereof are omitted herein. In some embodiments, the interconnection structure 700b is electrically connected to the conductors 108 of the semiconductor wafer W1. For example, the conductive patterns of the interconnection structure 700b may be in direct contact with the conductors 108 of the semiconductor wafer W1. In some embodiments, the conductive vias 900b are formed on and directly in contact with the conductive patterns of the interconnection structure 700b.

Referring to FIG. 4J and FIG. 4K, the carrier C6 is removed and a singulation process performed on the structure illustrated in FIG. 4J to obtain a plurality of integrated circuit D5. The singulation process in FIG. 4K is similar to the singulation process in FIG. 1J, so the detailed description thereof is omitted herein. In some embodiments, the singulation process divides the semiconductor wafer W1 into a plurality of chips 100 and divides the semiconductor wafer W2 into a plurality of chips 200. The chip 100 and the chip 200 in FIG. 4K are respectively similar to the chip 100 and the chip 200 in FIG. 1J, so similar components thereof are denoted by the same reference numeral and the detailed descriptions thereof are omitted herein. In some embodiments, the chip 100 is fusion bonded to the chip 200 through the bonding film BF2. In some embodiments, sidewalls of the chip 100 are aligned with sidewalls of the chip 200. In some embodiments, a thickness $H_{100}$ of the chip 100 ranges between about 10 µm and about 50 µm while thickness $H_{400}$ of the chip 400 ranges between about 10 µm and about 120 µm. In some embodiments, since multiple chips (chips 100 and 200) are integrated into a single integrated circuit D5, the integrated circuit D5 may be referred to as a "SOIC."

Referring to FIG. 4E and FIG. 4K simultaneously, the integrated circuit D4 includes chips 300, 400 while the integrated circuit D5 includes chips 100, 200. In some embodiments, the chip 200 may be made of the same material as the chips 100, 300, and 400. As such, mismatch of the CTE between different components of the integrated circuit D5 or the subsequently formed package may be reduced. As a result, the warpage derived from the manufacturing process of the integrated circuit D5 or the subsequently formed package may be minimized, thereby increasing the yield rate. Moreover, in some embodiments, the chip 200 may also serve as a heat dissipation mechanism to increase the heat dissipation rate during operation of the subsequently formed package. In some embodiments, the integrated circuit D4 and the integrated circuit D5 may be utilized in various applications. For example, the integrated circuit D4 and the integrated circuit D5 may be used as a die in an InFO package. The manufacturing process of the InFO package will be described below.

Referring to FIG. 4L to FIG. 4P, the steps in FIG. 4L to FIG. 4P are similar to the steps shown in FIG. 1K to FIG. 1O except the integrated circuit D1 in FIG. 1K to FIG. 1O has been replaced with the integrated circuit D4 in FIG. 4E and the integrated circuit D5 in FIG. 4K, so the detailed descriptions thereof are omitted herein. Referring to FIG. 4M and FIG. 4N, the integrated circuit D4 and the integrated circuit D5 are placed to have a gap G1 between the two. For example, the integrated circuit D4 is spaced apart from the integrated circuit D5. That is, the chip 100 and the chip 200 are spaced apart from the chip 300 and the chip 400. As illustrated in FIG. 4N, the encapsulant 1100 is filled into the gap G1. For example, at least a portion of the encapsulant 1100 is located between the integrated circuit D4 and the integrated circuit D5. In other words, at least a portion of the encapsulant 1100 is located between the chip 100 and chip 300 and is located between the chip 200 and the chip 400. In some embodiments, from a top view, sidewalls of the chip 300 are not aligned with sidewalls of the chip 100 and sidewalls of the chip 200.

Referring to FIG. 4P, a plurality of package structures P5 is obtained. As mentioned above, the package structure P5 may be referred to as an "InFO package." As illustrated in FIG. 4P, the encapsulant 1100 is in direct contact with sidewalls of the chips 100, 200, and 300 to laterally encapsulate the chips 100, 200, and 300. On the other hand, the redistribution structure 1200 is electrically connected to the chips 100, 300, and 400. In some embodiments, by introducing the chip 200 in the integrated circuit D5 and by utilizing the integrated circuit D5 in the package structure P5, the warpage and the RDL stress in the package structure P5 may be effectively reduced. Meanwhile, the electrical performance and the heat dissipation of the package structure P5 may be sufficiently enhanced.

In some embodiments, the package structure P5 may be further assembled with other package structures to form a package. For example, referring to FIG. 4Q, a package structure P2 is stacked on the package structure P5 to form a package 40. In some embodiments, the package structure P5 is electrically connected to the package structure P2 through the conductive terminals 1400. In some embodiments, the package 40 may further include an underfill UF located between the package structure P5 and the package structure P2. In some embodiments, the underfill UF is able to protect the conductive terminals 1400 electrically connecting the package structures P5 and P2. In some embodiments, the package 40 may be referred to as a "PoP."

Figure 5A:
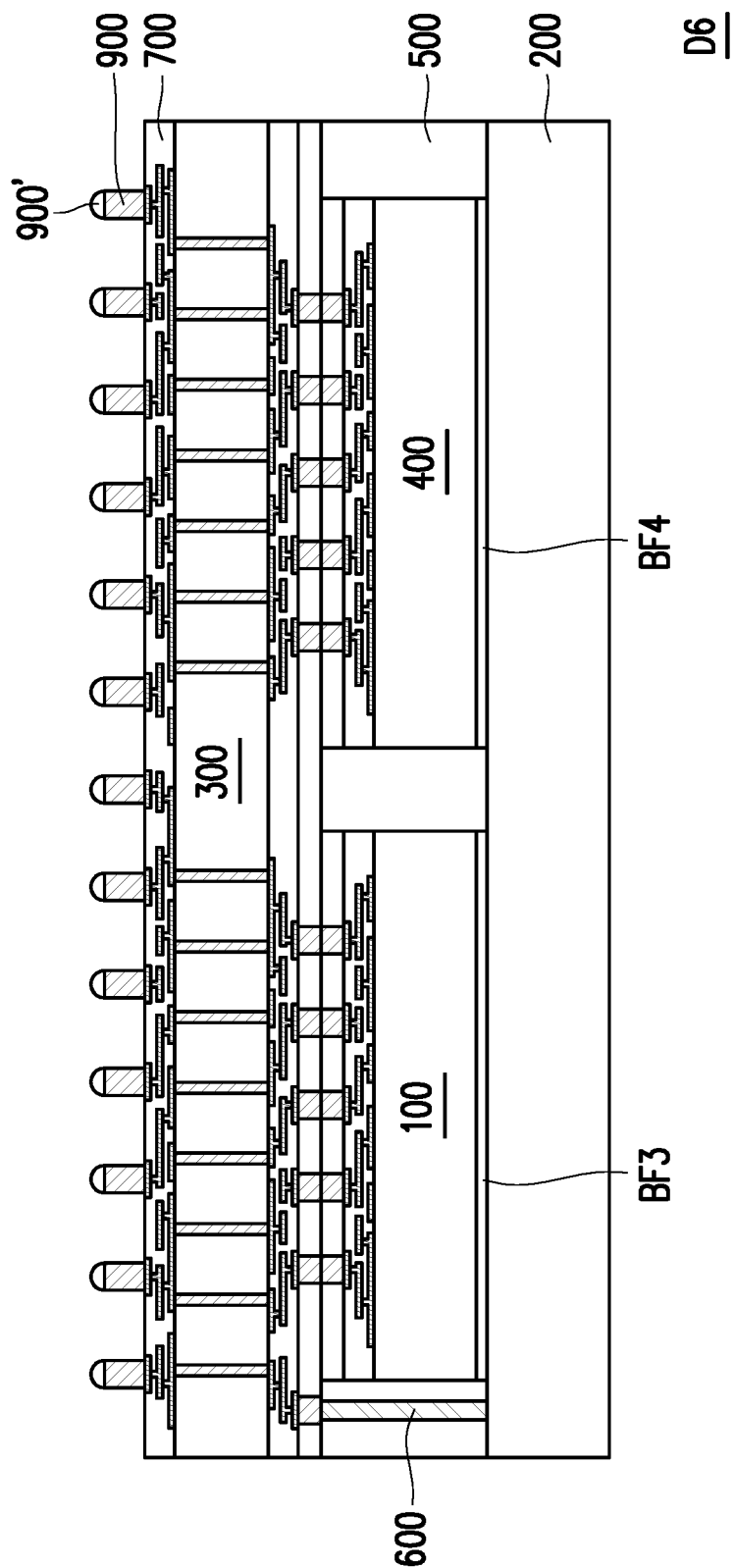
FIG. 5A to FIG. 5B are schematic cross-sectional views illustrating a manufacturing process of a package in accordance with some alternative embodiments of the disclosure.
Figure 5B:
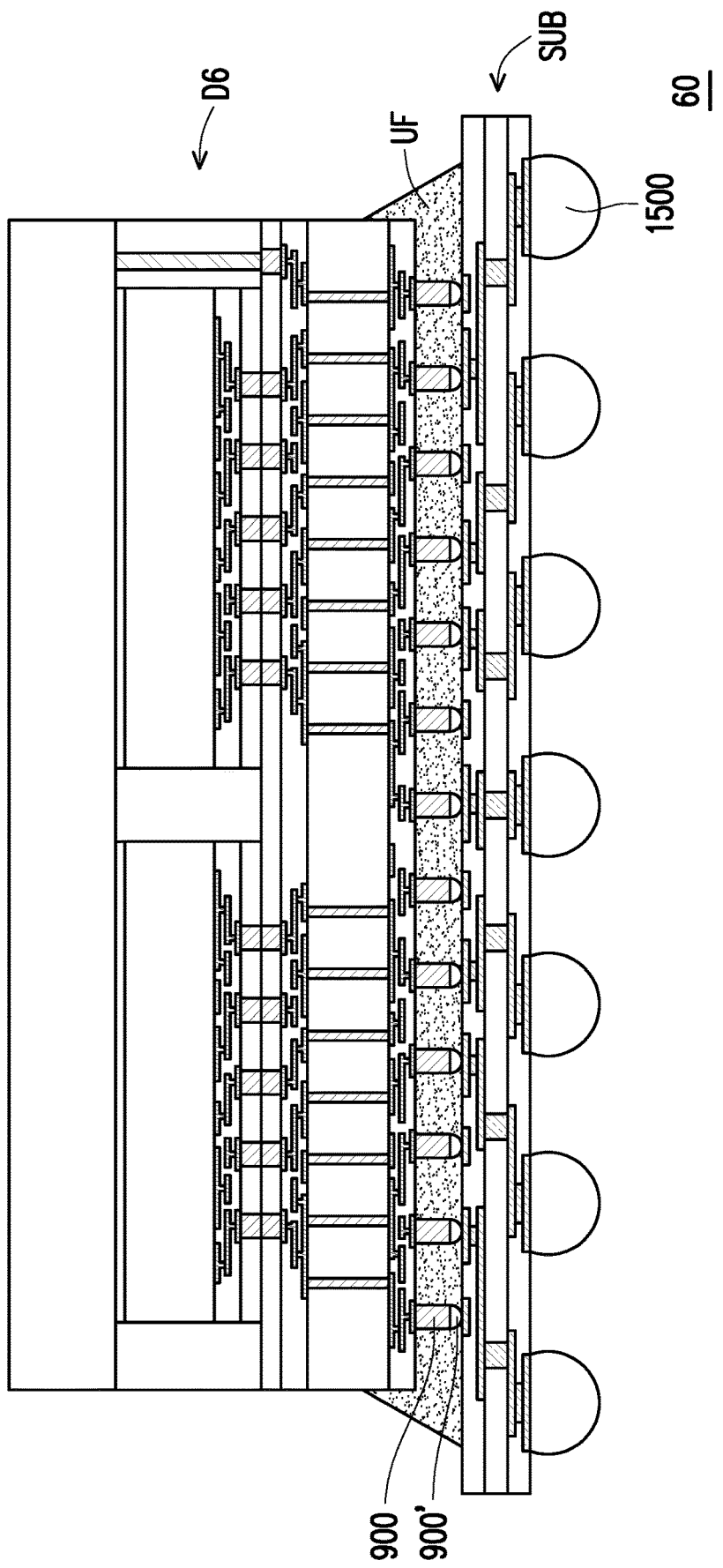

FIG. 5A to FIG. 5B are schematic cross-sectional views illustrating a manufacturing process of a package 60 in accordance with some alternative embodiments of the disclosure. Referring to FIG. 5A, an integrated circuit D6 is provided. In some embodiments, the integrated circuit D6 in FIG. 5A is similar to the integrated circuit D2 in FIG. 2F, so similar components thereof are denoted by the same reference numeral and the detailed descriptions thereof are omitted herein. However, the passivation layer 800 in FIG. 2F is omitted in the integrated circuit D6 of FIG. 5A. In addition, the integrated circuit D6 further includes a solder material 900' formed over the conductive vias 900.

In some embodiments, since multiple chips (chips 100, 200, 300, and 400) are integrated into a single integrated circuit D6, the integrated circuit D6 may be referred to as a "SOIC." As illustrated in FIG. 5A, the chip 100 and the chip 400 are disposed side by side on the chip 300. Meanwhile, the chip 100 and the chip 400 are also disposed side by side on the chip 200. For example, the chip 100 and the chip 400 are sandwiched between the chip 200 and the chip 300. The chip 100 and the chip 400 are hybrid bonded to the chip 300. On the other hand, the chip 100 and the chip 400 are fusion bonded to the chip 200. In some embodiments, the chip 200 may be made of the same material as the chips 100, 300, and 400. As such, mismatch of the CTE between different components of the integrated circuit D6 or the subsequently formed package may be reduced. As a result, the warpage derived from the manufacturing process of the integrated circuit D6 or the subsequently formed package may be minimized, thereby increasing the yield rate. Moreover, in some embodiments, the chip 200 may also serve as a heat dissipation mechanism to increase the heat dissipation rate during operation of the subsequently formed package. In some embodiments, the integrated circuit D6 may be utilized in various applications. For example, the integrated circuit D6 may be used as a die in a flip-chip package.

Referring to FIG. 5B, a circuit substrate SUB is provided. In some embodiments, the circuit substrate SUB has a plurality of conductive patterns embedded therein. The conductive patterns of the circuit substrate SUB are interconnected with each other. As illustrated in FIG. 5B, the integrated circuit D6 is stacked on one side of the circuit substrate SUB to form a package 60. In some embodiments, the integrated circuit D6 is electrically connected to the circuit substrate SUB. For example, the conductive vias 900 and the solder material 900' of the integrated circuit D6 are electrically connected to the conductive patterns of the circuit substrate SUB. In some embodiments, the package 60 may further include an underfill UF. In some embodiments, at least a portion of the underfill UF is located between the integrated circuit D6 and the circuit substrate SUB. In some embodiments, the underfill UF is able to protect the conductive vias 900 and the solder material 900' electrically connecting the integrated circuit D6 and the circuit substrate SUB. In some embodiments, the package 60 may further include a plurality of conductive terminals 1500 on the circuit substrate SUB opposite to the integrated circuit D6. In some embodiments, the conductive terminals 1500 are similar to the conductive terminals 1300 in FIG. 1N, so the detailed descriptions thereof are omitted herein. In some embodiments, the conductive terminals 1500 are direct in contact and electrically connected to the conductive patterns of the circuit substrate SUB. As mentioned above, in some embodiments, the package 60 may be referred to as a "flip-chip package."

In accordance with some embodiments of the disclosure, a package includes an integrated circuit. The integrated circuit includes a first chip, a second chip, a third chip, and a fourth chip. The second chip and the third chip are disposed side by side on the first chip. The second chip and the third chip are hybrid bonded to the first chip. The fourth chip is fusion bonded to at least one of the second chip and the third chip.

In accordance with some embodiments of the disclosure, a package includes a first chip, a second chip, a third chip, a fourth chip, a plurality of conductive structures, an encapsulant, and a redistribution structure. The first chip has a plurality of through semiconductor vias (TSV) embedded therein. The second chip is stacked on and hybrid bonded to the first chip. The third chip is electrically connected to the first chip. The fourth chip is a dummy chip. The conductive structures surround the first chip, the second chip, the third chip, and the fourth chip. The encapsulant laterally encapsulates the first chip and the fourth chip. The redistribution structure is disposed on the conductive structures and the encapsulant. The redistribution structure is electrically connected to the first chip.

In accordance with some embodiments of the disclosure, a manufacturing method of a package includes at least the following steps. A semiconductor wafer having a plurality of through semiconductor vias (TSV) formed therein is provided. The semiconductor wafer has a first surface and a second surface opposite to the first surface. A first chip and a second chip are hybrid bonded to the first surface of the semiconductor wafer. The first chip and the second chip are disposed side by side. The first chip and the second chip are laterally encapsulated by an insulating encapsulant. A dummy chip is attached to the second chip through fusion bonding. The second surface of the semiconductor wafer is thinned until the TSVs are exposed. An interconnection structure is formed on the second surface of the semiconductor wafer. The interconnection structure is electrically connected to the TSVs. The semiconductor wafer is singulated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
an integrated circuit, comprising:
a first chip comprising a semiconductor substrate, wherein the semiconductor substrate of the first chip extends continuously from an edge of the first chip to another edge of the first chip;
a second chip and a third chip disposed side by side on the first chip, wherein the second chip and the third chip are hybrid bonded to the first chip; and
a fourth chip fusion bonded to at least one of the second chip and the third chip, wherein the fourth chip comprises a semiconductor substrate, the semiconductor substrate of the fourth chip extends continuously from an edge of the fourth chip to another edge of the fourth chip, and sidewalls of the first chip are aligned with sidewalls of the fourth chip.

2. The package of claim 1, wherein the fourth chip is stacked on and fusion bonded to both of the second chip and the third chip, and a sum of a thickness of the second chip and a thickness of the fourth chip is substantially equal to a sum of a thickness of the third chip and the thickness of the fourth chip.

3. The package of claim 1, wherein the fourth chip is a dummy chip.

4. The package of claim 1, wherein the first chip further comprises a plurality of through semiconductor vias (TSV) embedded therein.

5. The package of claim 1, wherein the integrated circuit further comprises an insulating encapsulant laterally encapsulating the second chip and the third chip.

6. The package of claim 5, wherein the integrated circuit further comprises a plurality of through insulating vias (TIV) penetrating through the insulating encapsulant.

7. The package of claim 1, further comprising:
a plurality of conductive structures surrounding the integrated circuit;
an encapsulant laterally encapsulating the integrated circuit and the conductive structures;
a redistribution structure disposed on the integrated circuit, the encapsulant, and the conductive structures, wherein the redistribution structure is electrically connected to the integrated circuit and the conductive structures; and a plurality of conductive terminals disposed on the redistribution structure.

8. The package of claim 7, wherein the first chip comprises a first interconnection structure located between the semiconductor substrate and the redistribution structure, and the package further comprises a second interconnection structure located between the first chip and the third chip.

9. The package of claim 1, further comprising:
- a circuit substrate, wherein the integrated circuit is disposed on and electrically connected to the circuit substrate; and
- an underfill, wherein at least a portion of the underfill is located between the integrated circuit and the circuit substrate.

10. A package, comprising:
- a first chip having a plurality of through semiconductor vias (TSV) embedded therein;
- a second chip, stacked on and hybrid bonded to the first chip, wherein the second chip is located within a span of the first chip, and the first chip extends beyond edges of the second chip;
- a third chip electrically connected to the first chip;
- a fourth chip, wherein the fourth chip is a dummy chip;
- a plurality of conductive structures surrounding the first chip, the second chip, the third chip, and the fourth chip;
- an encapsulant laterally encapsulates the first chip and the fourth chip;
- an insulating encapsulant entirely covering each sidewall of the second chip such that the insulating encapsulant is located between the second chip and the encapsulant; and
- a redistribution structure disposed on the conductive structures and the encapsulant, wherein the redistribution structure is electrically connected to the first chip.

11. The package of claim 10, wherein the first chip comprises a semiconductor substrate, and the TSVs are embedded in the semiconductor substrate.

12. The package of claim 11, wherein the TSVs extend continuously from a top surface of the semiconductor substrate to a bottom surface of the semiconductor substrate.

13. The package of claim 10, wherein the first chip has a first surface and a second surface opposite to the first surface, the second chip and the third chip are disposed side by side on the first surface of the first chip, the fourth chip is disposed on the second surface of the first chip, and the second chip, the third chip, and the fourth chip are hybrid bonded to the first chip.

14. The package of claim 10, wherein the fourth chip comprises a plurality of TSVs embedded therein, and the TSVs of the first chip are connected to the TSVs of the fourth chip.

15. The package of claim 10, wherein the first chip and the second chip are spaced apart from the third chip and the fourth chip, and the fourth chip is fusion bonded to the third chip.

16. The package of claim 10, wherein at least a portion of the encapsulant is located between the first chip and the third chip.

17. The package of claim 10, wherein sidewalls of the fourth chip and sidewalls of the third chip are aligned.

18. A method of manufacturing a package, comprising:
- providing a semiconductor wafer having a plurality of through semiconductor vias (TSV) formed therein, wherein the semiconductor wafer has a first surface and a second surface opposite to the first surface;
- hybrid bonding a first chip and a second chip to the first surface of the semiconductor wafer, wherein the first chip and the second chip are disposed side by side;
- laterally encapsulating the first chip and the second chip by an insulating encapsulant;
- attaching a dummy chip to the second chip through fusion bonding, wherein the dummy chip comprises a semiconductor substrate, the semiconductor substrate of the dummy chip extends continuously from an edge of the dummy chip to another edge of the dummy chip;
- thinning the second surface of the semiconductor wafer until the TSVs are exposed;
- forming an interconnection structure on the second surface of the semiconductor wafer, wherein the interconnection structure is electrically connected to the TSVs; and
- singulating the semiconductor wafer to form a third chip comprising a semiconductor substrate, wherein sidewalls of the third chip are aligned with sidewalls of the dummy chip, and the semiconductor substrate of the third chip extends continuously from an edge of the third chip to another edge of the third chip.

19. The method of claim 18, further comprising attaching the dummy chip to the first chip through fusion bonding, wherein the dummy chip is attached to the first chip and the second chip after the first chip and the second chip are hybrid bonded to the semiconductor wafer.

20. The method of claim 19, wherein the step of attaching the dummy chip to the first chip through fusion bonding and the step of attaching the dummy chip to the second chip through fusion bonding are performed simultaneously.

\* \* \* \* \*